US008173471B2

(12) United States Patent
Hsieh et al.

(10) Patent No.: US 8,173,471 B2
(45) Date of Patent: May 8, 2012

(54) METHOD FOR FABRICATING MICRO-ELECTRO-MECHANICAL SYSTEM (MEMS) DEVICE

(75) Inventors: Tsung-Min Hsieh, Taipei County (TW); Chien-Hsing Lee, Hsinchu County (TW)

(73) Assignee: Solid State System Co., Ltd., Hsinchu (TW)

( * ) Notice: Subject to any disclaimer, the term of this patent is extended or adjusted under 35 U.S.C. 154(b) by 1023 days.

(21) Appl. No.: 12/111,208

(22) Filed: Apr. 29, 2008

(65) Prior Publication Data
US 2011/0104844 A1   May 5, 2011

(51) Int. Cl.
*H01L 21/00* (2006.01)
*H01L 29/84* (2006.01)
(52) U.S. Cl. ............... 438/53; 438/50; 438/51; 438/52; 257/415; 257/416; 257/417; 257/418; 257/419
(58) Field of Classification Search .............. 438/50–53; 257/415–420
See application file for complete search history.

(56) References Cited

U.S. PATENT DOCUMENTS

| 6,458,615 B1 | 10/2002 | Fedder et al. |
| 7,026,184 B2 | 4/2006 | Xie et al. |
| 7,049,051 B2 * | 5/2006 | Gabriel et al. ............... 430/322 |
| 2009/0026561 A1 * | 1/2009 | Reichenbach et al. ........ 257/416 |

FOREIGN PATENT DOCUMENTS

WO   WO2006082155   *   8/2006

* cited by examiner

*Primary Examiner* — Michael Lebentritt
*Assistant Examiner* — Karen Kusumakar
(74) *Attorney, Agent, or Firm* — Jianq Chyun IP Office

(57) ABSTRACT

A method for fabricating MEMS device includes providing a substrate having a first side and a second side. Then, a structural dielectric layer is formed over the substrate at the first side, wherein a structural conductive layer is embedded in the structural dielectric layer. A multi-stage patterning process is performed on the substrate from the second side, wherein a plurality of regions of the substrate with different levels is formed and a portion of the structural dielectric layer is exposed. An isotropic etching process is performed from the second side of the substrate or from the both side of the substrate to etch the structural dielectric layer, wherein a remaining portion of the structural dielectric layer comprises the structural conductive layer and a dielectric portion enclosed by the structural conductive layer.

23 Claims, 54 Drawing Sheets

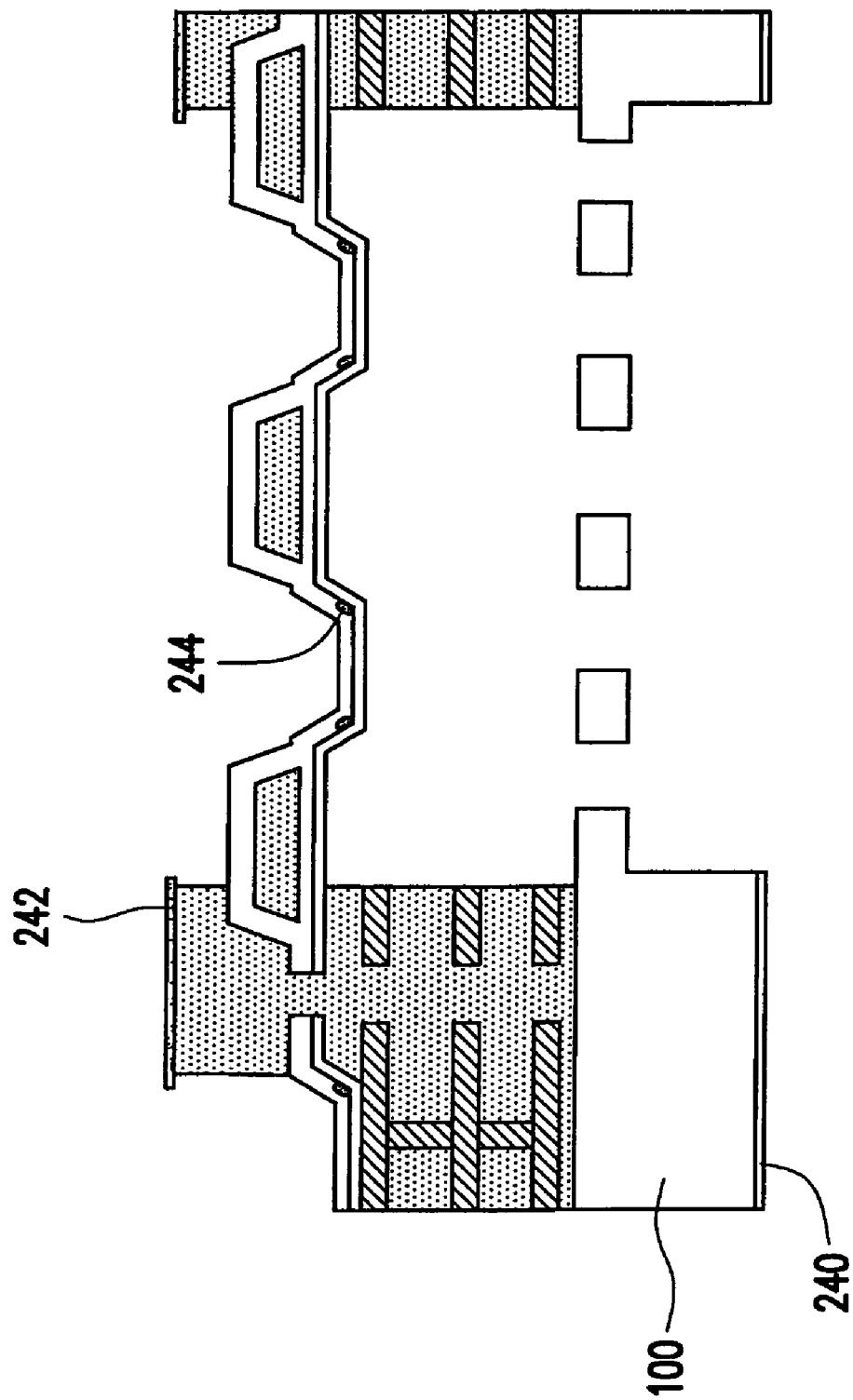

METHOD FOR FABRICATING MICRO-ELECTRO-MECHANICAL SYSTEM (MEMS) DEVICE

BACKGROUND OF THE INVENTION

1. Field of Invention

The present invention relates to a micro-electro-mechanical system (MEMS) technology with semiconductor fabrication technology. More particularly, the present invention relates to a method for fabricating a MEMS device.

2. Description of Related Art

MEMS devices have been widely fabricated using semiconductor fabricating process. However, it is still not easy to be integrated into the standard MOS (metal-oxide semiconductor) process, such as complementary MOS (CMOS) device. In general, a discrete MEMS device and a CMOS ASIC chip are packaged to a single die for application. However, the cost and performance for current technology cause not being popular. It is intended to develop a MEMS technology, so that the process for fabricating the MEMS can be compatible with the process for fabricating the CMOS device.

SUMMARY OF THE INVENTION

The invention provides a method for fabricating a MEMS structure, in which the fabrication process can be compatible between the CMOS and MEMS device. The MEMS device can thereby be compactly integrated with the CMOS device.

The present invention provides a method for fabricating MEMS device includes providing a substrate having a first side and a second side. Then, a structural dielectric layer is formed over the substrate at the first side, wherein a structural conductive layer is embedded in the structural dielectric layer. A multi-stage patterning process is performed on the substrate from the second side, wherein a plurality of regions of the substrate with different levels is formed and a portion of the structural dielectric layer is exposed. An isotropic etching process is performed from the second side of the substrate or from the both side of the substrate to etch the structural dielectric layer, wherein a remaining portion of the structural dielectric layer comprises the structural conductive layer and a dielectric portion enclosed by the structural conductive layer.

As an embodiment of the present invention, for example, the step of performing a multi-stage patterning process on the substrate comprises: forming a dielectric mask layer on the substrate at the second side; patterning the dielectric mask layer to expose the substrate at a first region and a second region; and patterning the substrate to expose the portion of the structural dielectric layer, wherein the substrate at the second side has multiple regions with different levels of height.

As an embodiment, for example, the step of performing the multi-stage patterning process on the substrate comprises: patterning the substrate at the second side to have a plurality indent regions with a depth; forming an etching mask layer on the substrate other than the indent regions; and performing an anisotropic etching process with the etching mask layer to expose the portion of the structural dielectric layer.

As an embodiment, for example, the step of performing the multi-stage patterning process on the substrate comprises: forming a hard mask layer on the substrate at the second side with multiple levels of height; patterning the hard mask layer to expose a portion of the substrate, wherein a remaining portion of the hard mask layer has multiple regions with different levels of height; forming an etching mask pattern on the substrate; etching the substrate at the second side to form a plurality of indent regions with a depth; removing the etching mask pattern; performing an anisotropic etching process on the substrate to expose the structural dielectric layer; removing a portion of the hard mask layer in thickness for exposing the substrate underneath; and etching the substrate to produce additional level of height.

As an embodiment, for example, the step of performing the multi-stage patterning process on the substrate comprises forming an etching mask pattern on the dielectric mask layer, wherein a portion of the substrate and a portion of the dielectric mask pattern are exposed. An isotropic etching process is performed on the exposed portion of the substrate with a depth, not masked by the dielectric mask layer and the etching mask pattern. An etching process is performed on the exposed dielectric mask layer with an etching mask pattern as a mask. An anisotropic etching process with the etching mask pattern as a mask to expose the structural dielectric layer.

As an embodiment, for example, the step of performing the multi-stage patterning process on the substrate comprises forming an etching mask pattern on the dielectric mask layer, wherein a portion of the substrate and a portion of the dielectric mask pattern are exposed. An anisotropic etching process is performed on the exposed portion of the substrate with a depth, not masked by the dielectric mask layer and etching mask pattern, wherein the exposed portion of the dielectric mask layer is also etched completely. An anisotropic etching process is performed with the etching mask pattern as a mask to expose the structural dielectric layer.

As an embodiment, for example, the present invention also provides a method for fabricating micro-electro-mechanical system (MEMS) device. The method includes providing a substrate, having a first side and a second side. A structural dielectric layer is formed over the substrate at the first side, wherein a structural conductive layer is embedded in the structural dielectric layer. The structural dielectric layer is patterned to form a plurality of indent regions, and each indent region has a tapered sidewall. A first metal layer is formed on the structural dielectric layer, wherein the indent regions remain. A dielectric layer is formed on the structural dielectric layer, wherein the indent regions remain. The dielectric layer is patterned wherein a remaining portion of the dielectric layer has a tapered sidewall and exposes the first metal layer at the indent regions. A second metal layer is formed on the first metal layer and the remaining portion of the dielectric layer. A top dielectric layer and an etching stop layer are formed on the second metal layer at a determined region. The substrate is patterned to from a cavity and a plurality of venting holes, wherein the venting holes expose the structural dielectric layer. An isotropic etching process is performed to remove a portion of the structural dielectric layer and the top dielectric layer with the etching stop layer as a mask to expose the first metal layer and the second metal layer.

As an embodiment, for example, the step of patterning the structural dielectric layer to form the indent regions comprises: forming an etching mask pattern on the structural dielectric layer, wherein a portion of the structural dielectric layer is exposed; and performing a taper etching process with the etching mask pattern on the structural dielectric layer to form the indent regions of the structural dielectric layer.

As an embodiment, for example, the step of patterning the substrate to from the cavity and the venting holes comprises: forming a mask layer on the substrate at the second side; patterning the mask layer to expose a portion of the substrate; forming a photoresist pattern layer over the substrate, the photoresist pattern layer has a plurality of holes to expose the substrate and a region of the substrate at a periphery of the mask layer is also covered by the photoresist pattern layer; performing an anisotropic etching process on the substrate with the photoresist pattern layer to form a plurality indent regions, wherein the region of the substrate at the periphery of the mask, layer is not etched; removing the photoresist pattern layer; and performing an anisotropic region on the substrate with the mask layer, until the structural dielectric layer is exposed.

As an embodiment, for example, the step of forming the top dielectric layer and the etching stop layer on the second metal layer comprising: forming a first dielectric layer over the first metal layer and the second metal layer, wherein the indent regions are fully filled; forming the etching stop layer with a pattern on the dielectric layer; forming a second dielectric layer over the first dielectric layer; and performing a planarization process on the second dielectric layer, wherein the first dielectric layer and the second dielectric layer form the top dielectric layer to enclose the etching stop layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 10-16 are cross-sectional or top views, schematically illustrating various applications of the MEMS device, according to a preferred embodiment of the invention.

DESCRIPTION OF THE PREFERRED EMBODIMENTS

In the invention, the method for fabricating a MEMS device is proposed. Several embodiments are provided for descriptions but not for limiting the present invention. Also noted, the disclosure in different embodiments may be properly combined as another embodiment.

Figure 1:
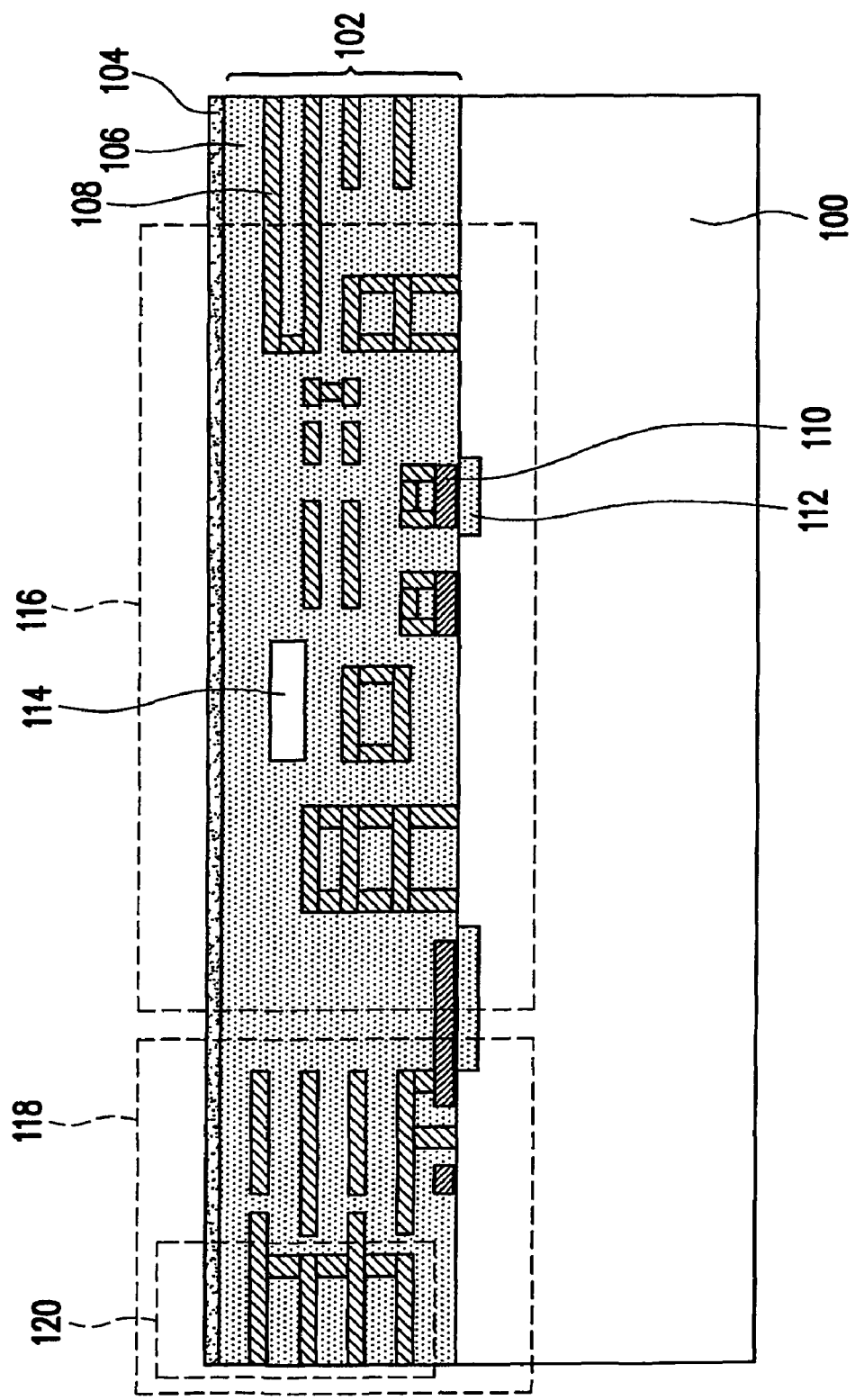
FIGS. 1-4 are cross-sectional views, schematically illustrating a part of the process flow for fabricating a MEMS device, according to a preferred embodiment of the invention.

FIGS. 1-4 are cross-sectional views, schematically illustrating a part of the process flow for fabricating a MEMS device, according to a preferred embodiment of the invention. In FIG. 1, the method for fabricating MEMS device includes first providing a substrate 100 having a first side and a second side. Then, a structural dielectric layer 102 is formed over the substrate 100 at the first side. A structural conductive layer 108 is embedded in the structural dielectric layer 102. A etching stop layer 104, a polysilicon layer 110 and/or a composite layer 114 may also be formed with the structural dielectric layer 102. The composite layer 114 represents a MOS-like structure, which usually has several sub-structure layers, such as patterned polysilicon or metal layers for the MOS-like device. A shallow isolation trench 112 may also formed in the substrate 100. The etching stop layer can be made of various choices of materials, such as metal, Al, TiN, amorphous Si, poly Si or SIN et al. The materials can be chosen based on the etching properties for stop etching the structural dielectric layer 102. And, such etching stop layer can also be electrically connected to the substrate to form a Faraday cage which is served as EMC (Electromagnetic Compatibility) shielding layer.

As can be understood in semiconductor fabrication, in order to adapt the structural conductive layer 108, such as including the structural metal layer, the structural dielectric layer includes multiple dielectric layers, such as silicon oxide layers, during fabrications. Here, the detail for fabricating the structural conductive layer 108 is not described, but understood by those in ordinary skill in the art. The MEMS device basically includes a MEMS structure 116 and a CMOS circuit 118, fabricated in the same substrate 100, in which a bonding pad structure 120 of the CMOS circuit is for example shown. The present invention proposes the semiconductor fabricating method to form the MEMS structure in compatible with CMOS circuit.

Figure 2:
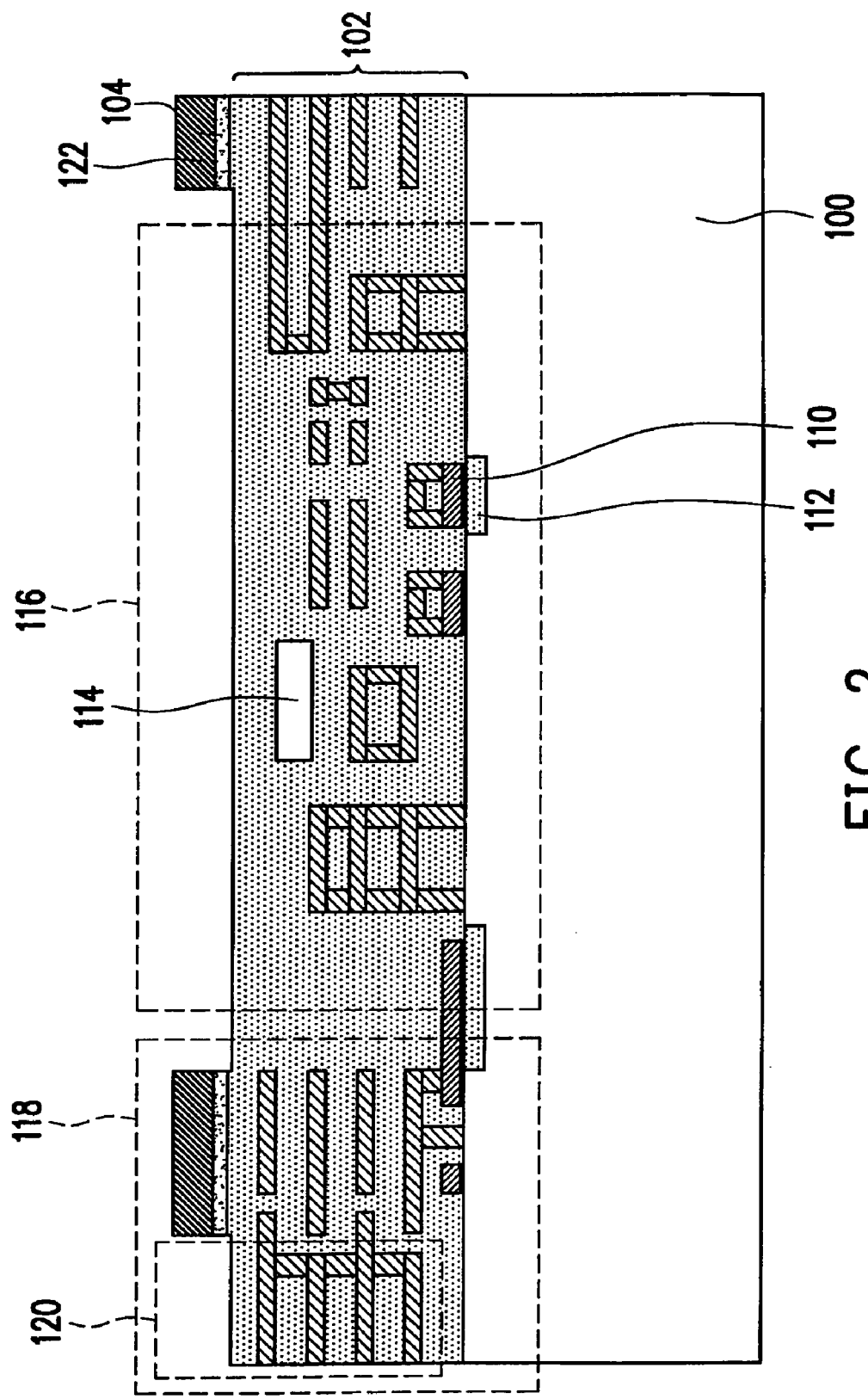

In FIG. 2, an etching mask layer, such as the photoresist layer 122, is formed on the etching stop layer 104. Then etching stop layer 104 is patterned to expose a portion of the structural dielectric layer 102, in which a small portion of dielectric material in the structural dielectric layer 102 may also be etched.

Figure 3:
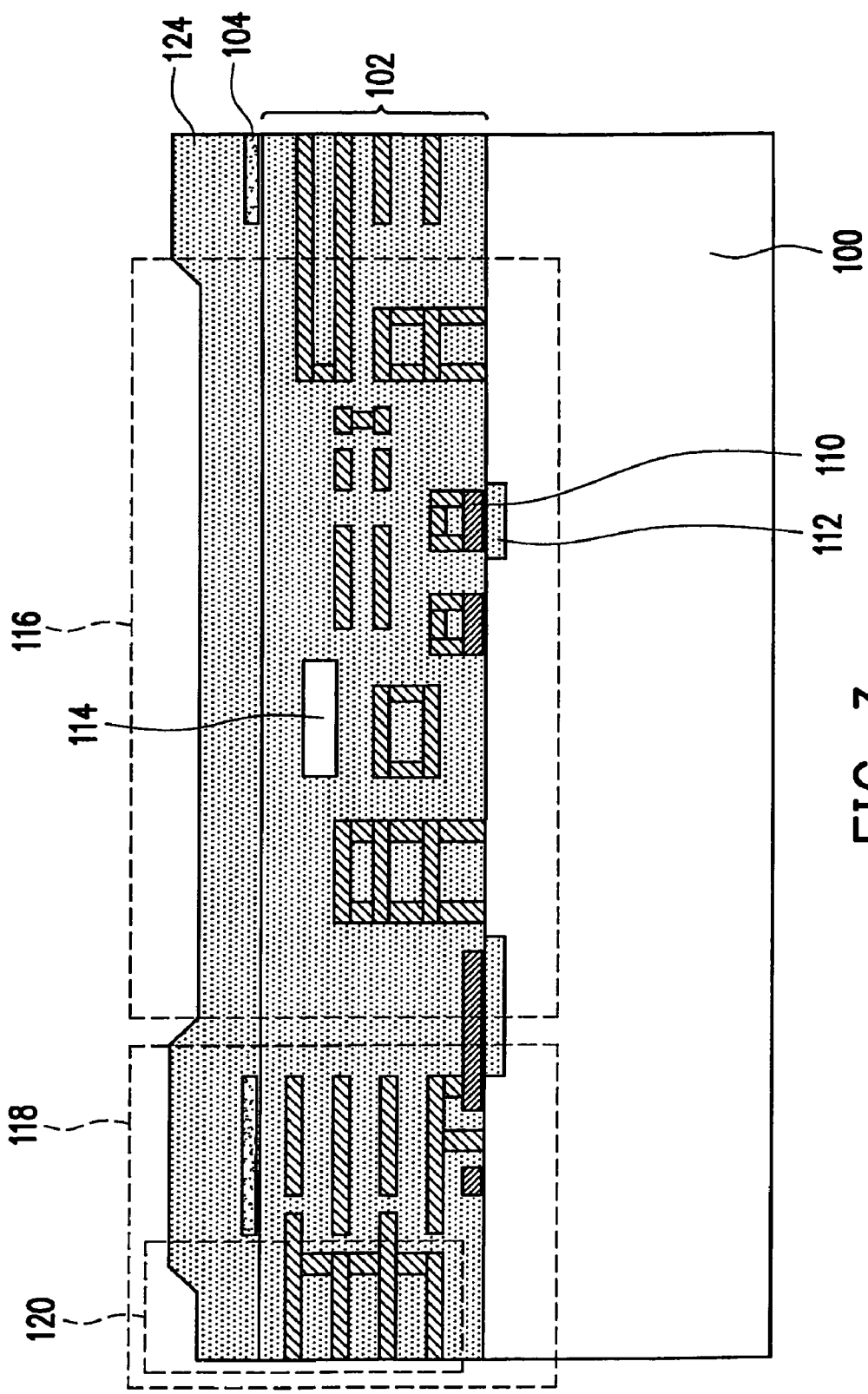
Figure 4:
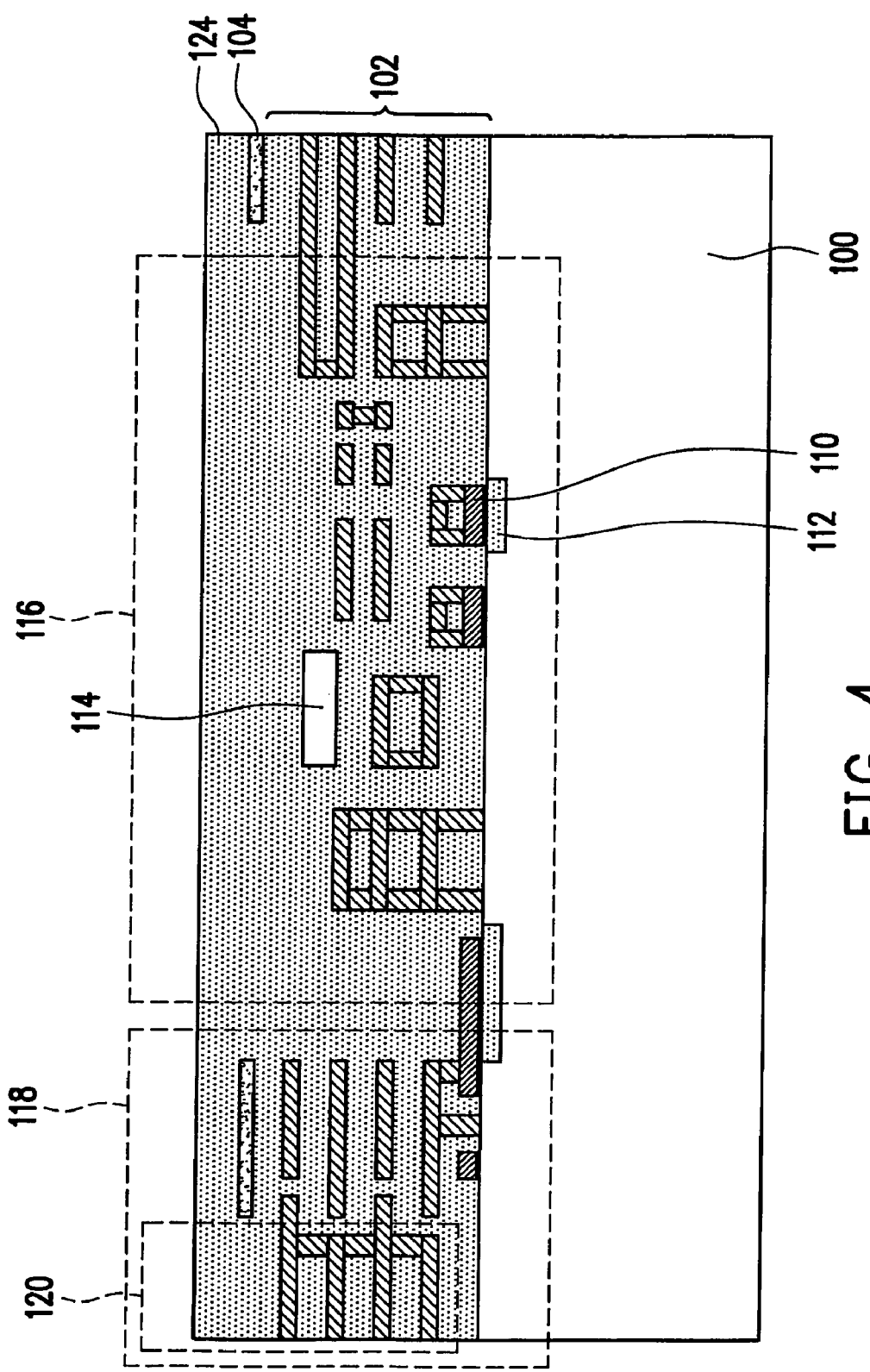

In FIG. 3, after removing the photoresist layer 122, another dielectric layer 124 may be further formed over the structural dielectric layer 102. In FIG. 4, a planarization process, such as the chemical mechanical polishing (CMP) process, is performed to planarize the dielectric layer 124. As a result, the dielectric layer 124 is merged in the structural dielectric layer 102, which has the embedded etching stop layer 104.

The substrate 100 at the second side, or the back side, is patterned with multiple patterning stages to have the desired structure having cavity and venting holes for the MEMS device. It is intended to form a plurality of regions of the substrate with different levels and a portion of the structural dielectric layer is exposed. It can be done by various choices of fabrication process flows.

Figure 5A:
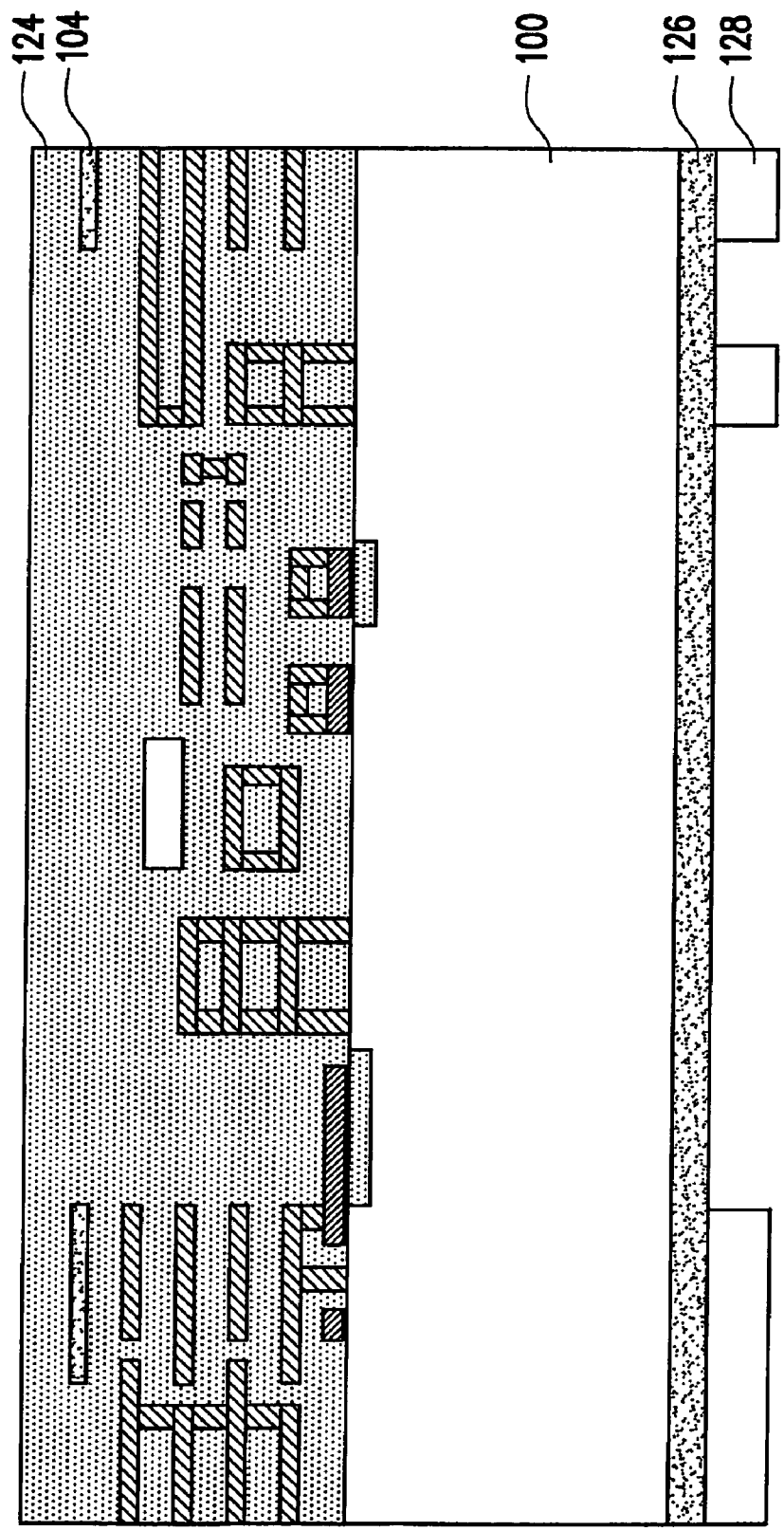
FIGS. 5A-5E are cross-sectional views, schematically illustrating a part of the process flow continuing from FIG. 4 for fabricating a MEMS device, according to a preferred embodiment of the invention.

FIGS. 5A-5E are cross-sectional views, schematically illustrating a part of the process flow continuing from FIG. 4 for fabricating a MEMS device, according to a preferred embodiment of the invention. In FIG. 5A, a hard mask layer 126 is formed over the substrate 100 at the second side. The material of the hard mask layer 126 can be, for example, Al, silicon oxide, or titanium nitride, for etching the substrate from the back side. An etching mask pattern, such as photoresist pattern 128, is formed on the hard mask layer 126, in which a portion of the hard mask layer 126 is exposed.

Figure 5B:
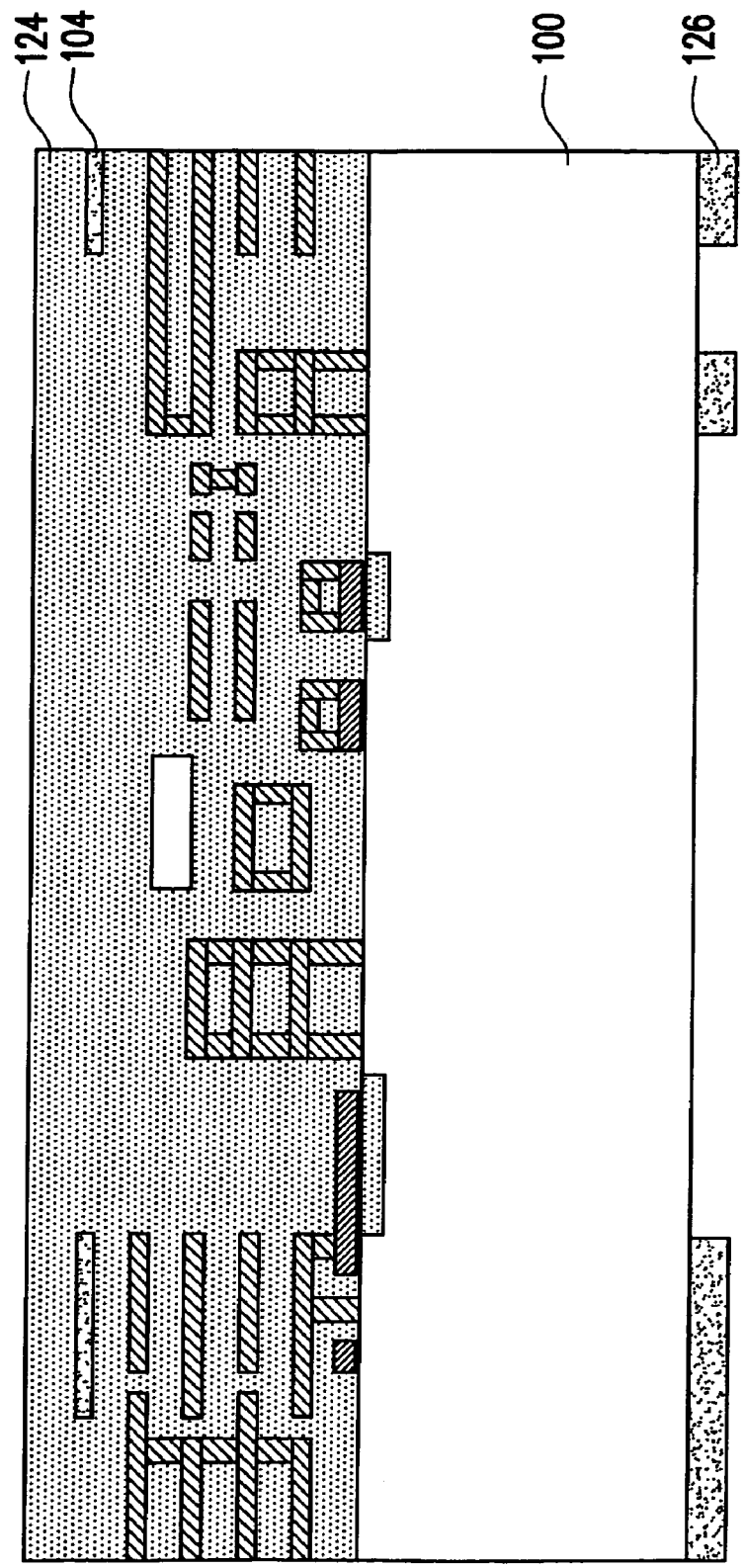
Figure 5C:
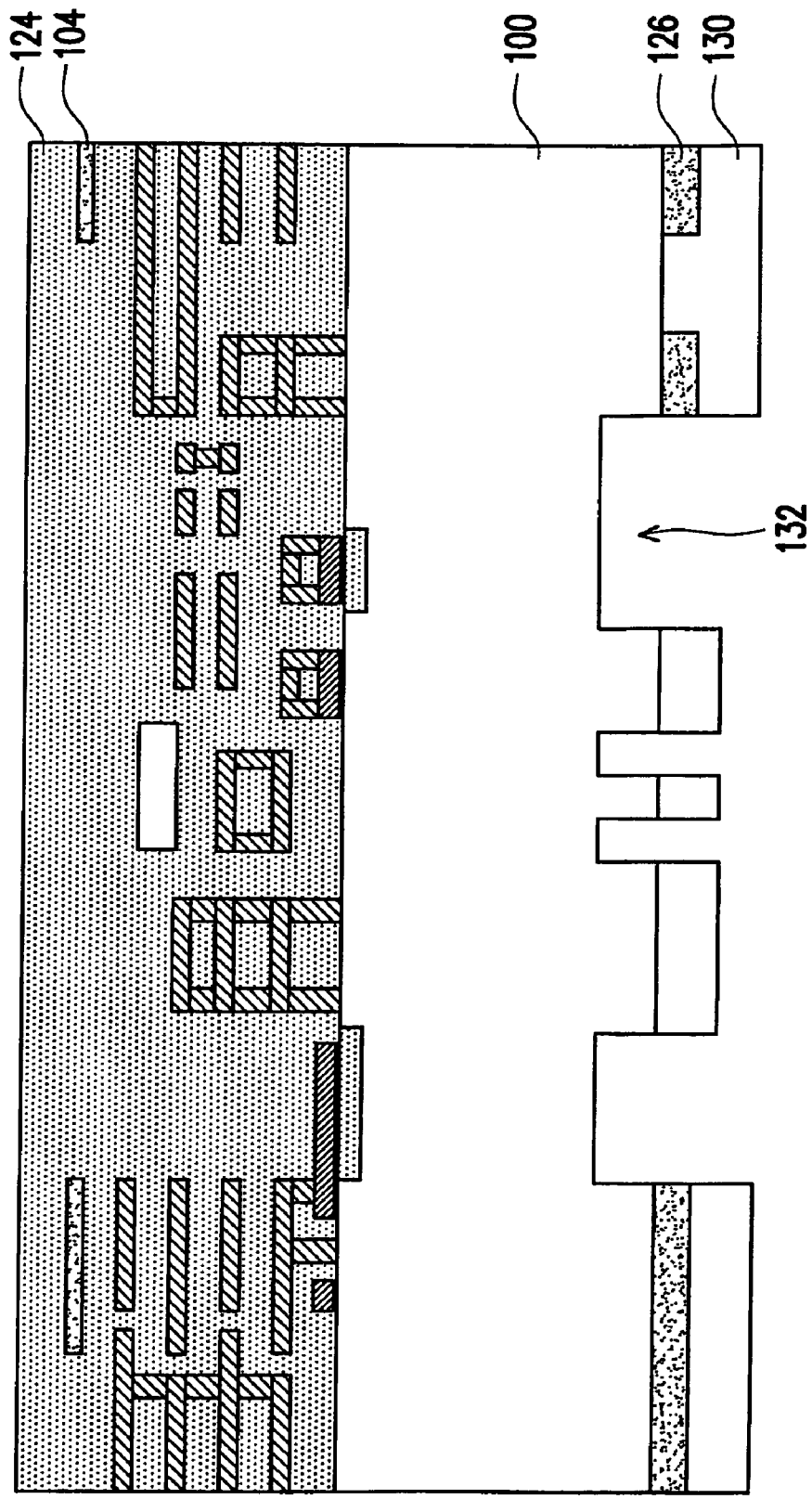
Figure 5D:
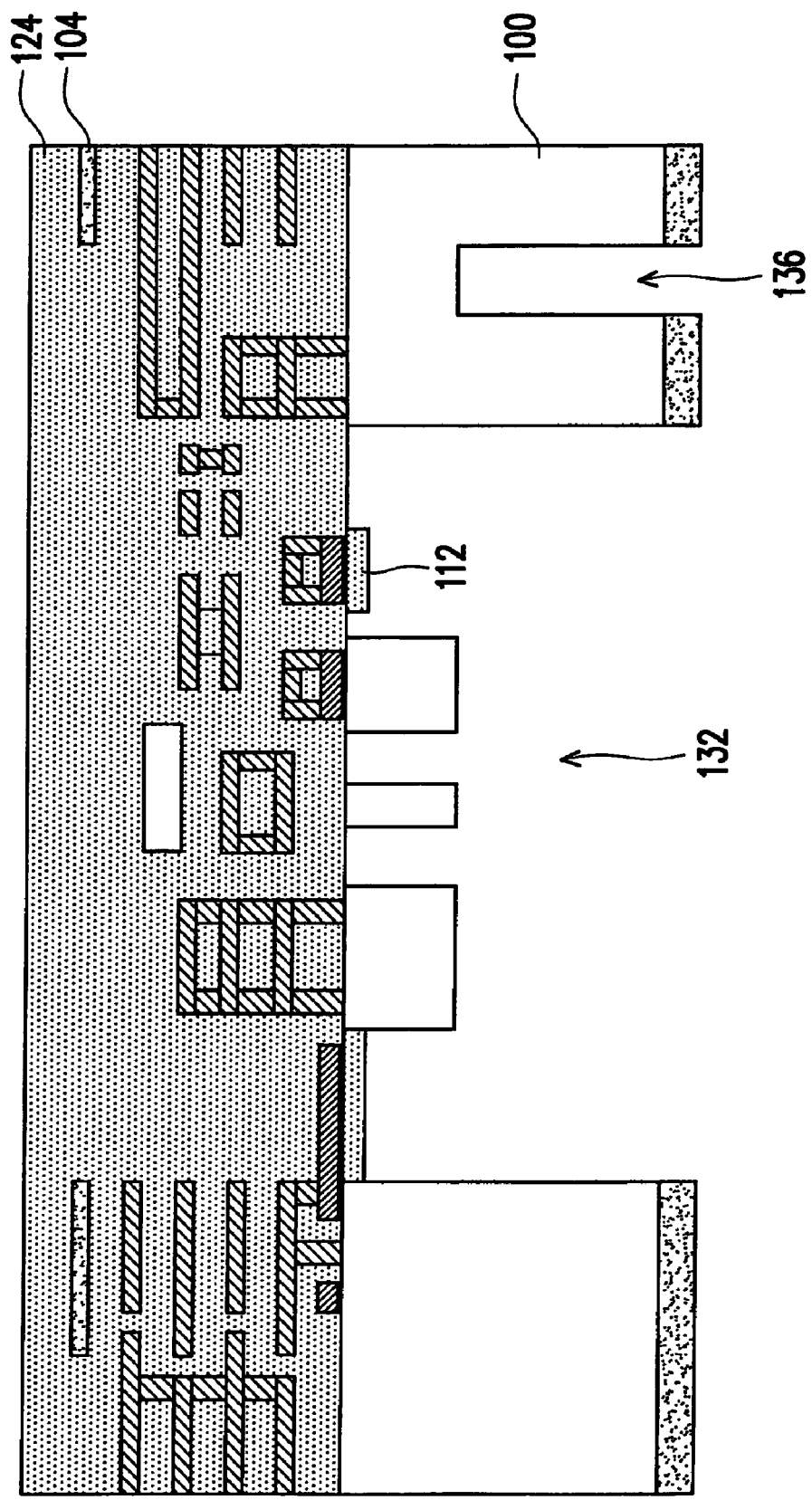
Figure 5E:
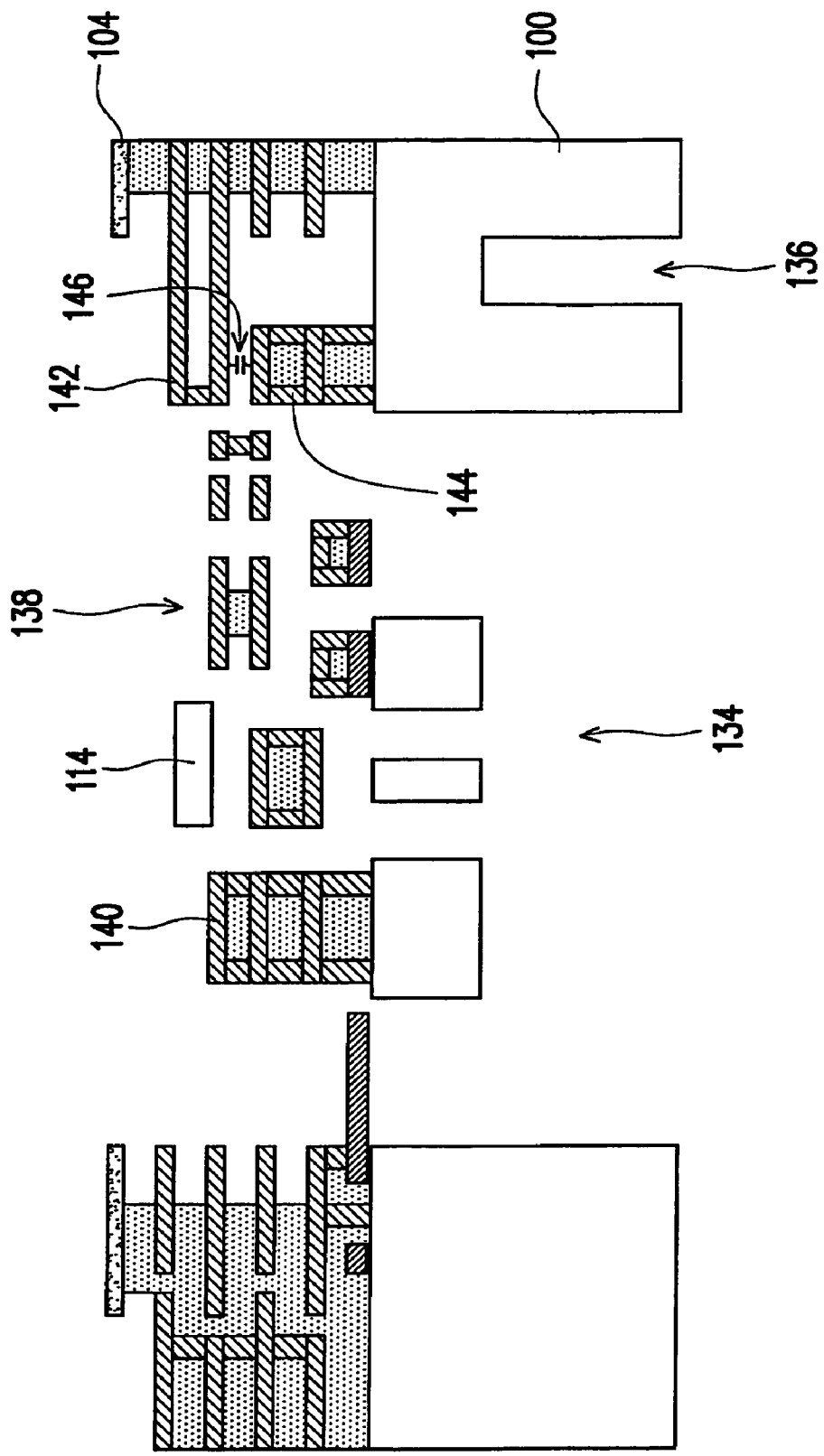

In FIG. 5B, after performing an etching process with the photoresist pattern 128 as the etching mask, the hard mask layer 126 is patterned and a portion of the substrate 100 is then exposed. In FIG. 5C, another photoresist pattern 130 is formed on the substrate 100 and the hard mask layer 126. An anisotropic etching process is performed to etch an exposed region 132 of the substrate 100 with a depth. In FIG. 5D, the photoresist pattern 130 is removed and another anisotropic etching process with the hard mask layer 126 as an etching mask, until the structural dielectric layer 102 is exposed, in which the shallow trench isolation layer 112 is also exposed. As a result, a cavity 132 is formed in the substrate 100 while the indented trench 136 is at different levels of height without exposing the structural dielectric layer 102. In FIG. 5E, the hard mask layer 126 may be removed by an additional etching step if the material is not similar to the structural dielectric layer 102 or removed in later isotropic etching process. An isotropic etching process such as vapor HF, wet etch, with the etching stop layer 104 as an etching stop is performed to remove a portion of dielectric in the structural dielectric layer 102 through the exposed regions in the cavity 134 and/or the top of the dielectric layer 124. As result, a MEMS structure 138 mainly from the structural conductive layer 108 is exposed. There are several venting holes and discrete substrates with a thickness with the cavity 134 formed, as well. Two conductive layers 142 and 144 of the structural conductive layer 108 can form a capacitor 146. The structural conductive layers and structural substrate form a proof mass for accelerometer. The structural conductive layers enclosing dielectric layers can also serve as a diaphragm. Since the indented trench 136 cause the thinner portion of substrate 100, the massive MEMS structure can shift in position and causing the different capacitance of the capacitor 146. For example, if the MEMS device is used to monitoring the acceleration in motion, when an acceleration speed is created depending on the force F and the mass M, the distance between the conductive layers 142 and 144 is changed and the capacitance can reflect this shift.

Figure 6A:
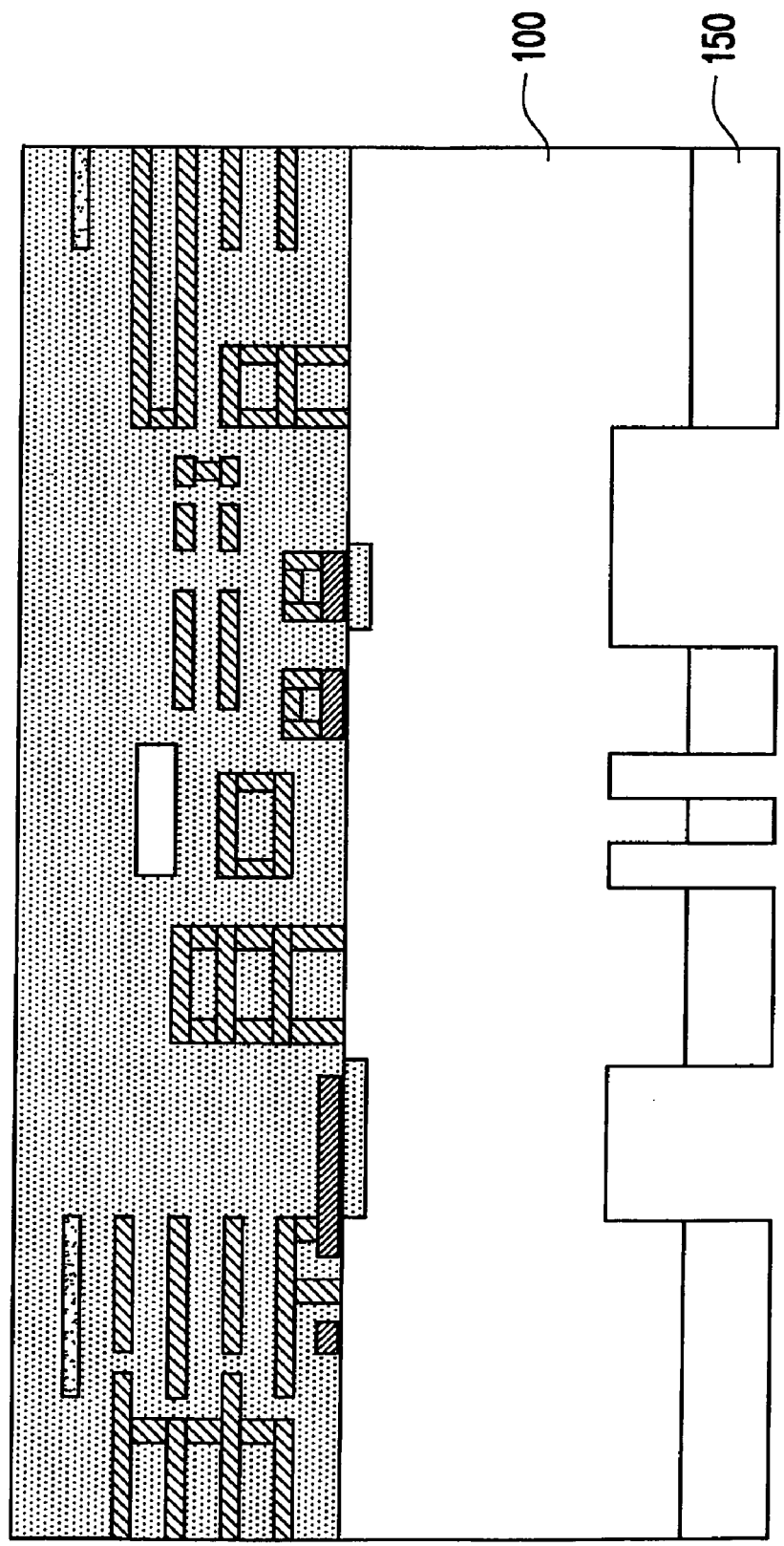
FIGS. 6A-6D are cross-sectional views, schematically illustrating a part of the process flow continuing from FIG. 4 for fabricating a MEMS device, according to a preferred embodiment of the invention.
Figure 6B:
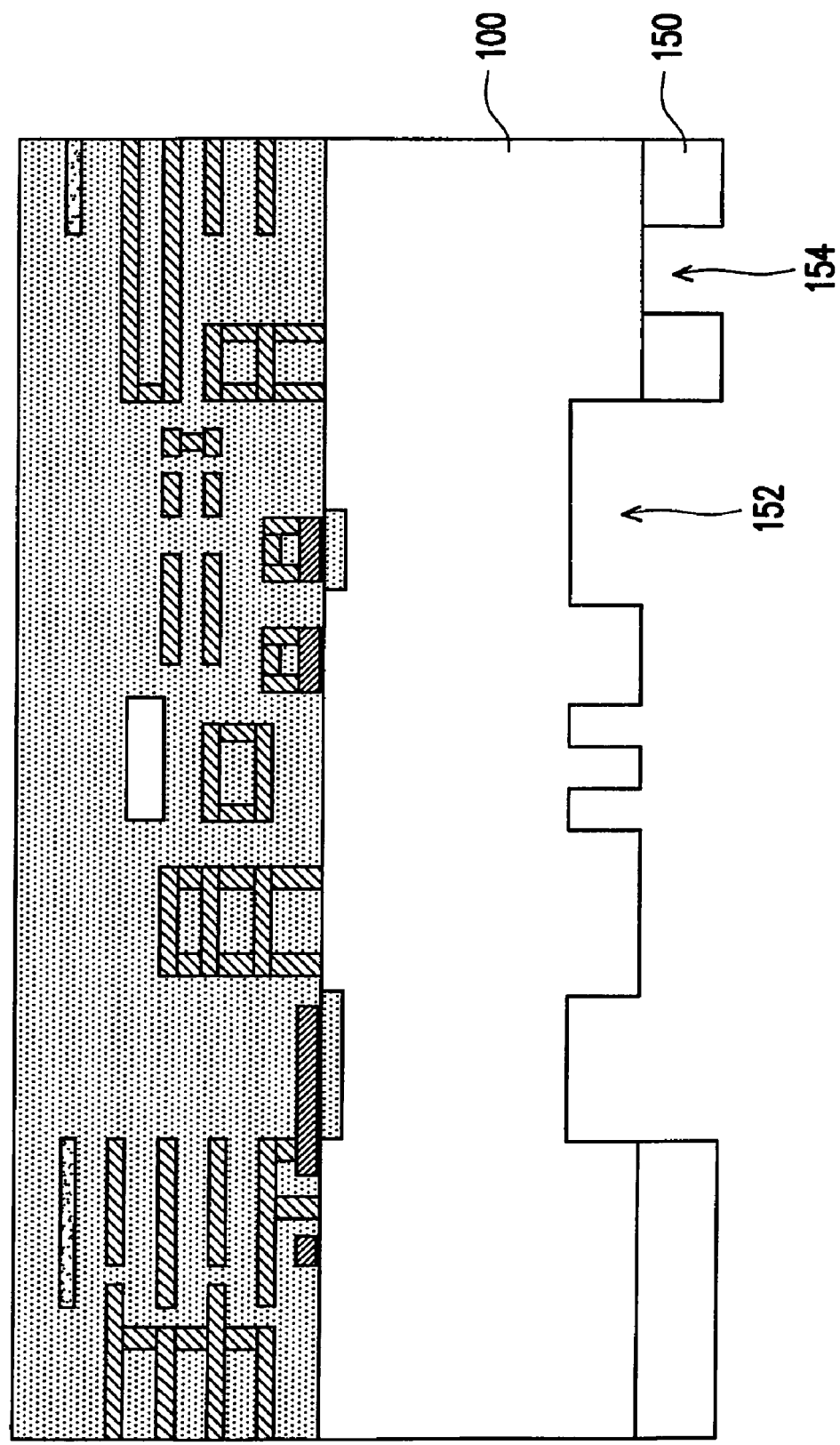
Figure 6C:
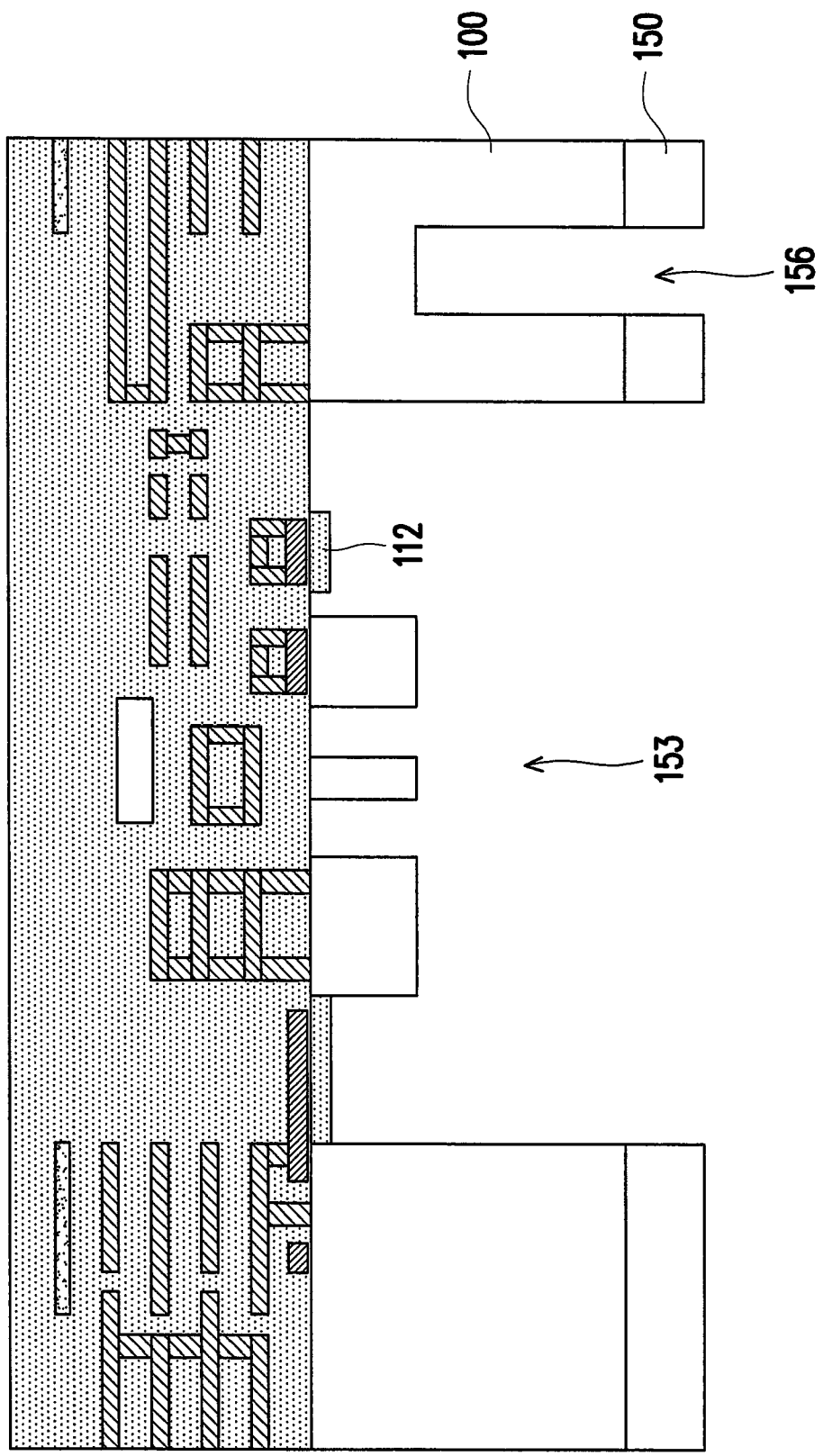
Figure 6D:
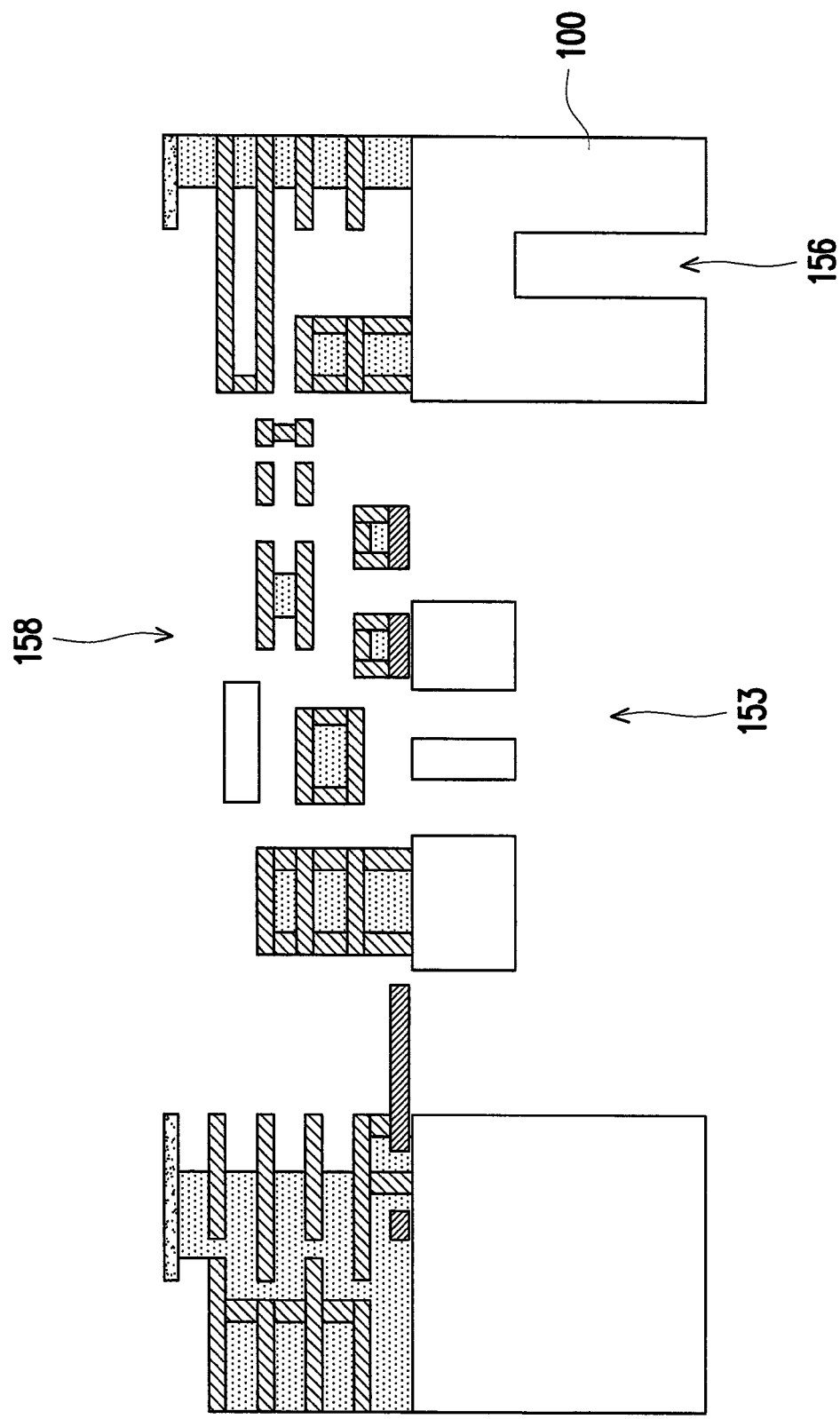

With the similar mechanism of MEMS device, the substrate can be patterned into various structures. FIGS. 6A-6D are cross-sectional views, schematically illustrating a part of the process flow continuing from FIG. 4 for fabricating a MEMS device, according to a preferred embodiment of the invention. In FIG. 6A, a photoresist pattern 150 is formed on the substrate 100 at the backside and expose a portion of the substrate 100. An anisotropic etching process is performed to etch the substrate 100 by a depth. In FIG. 6B, a portion of the photoresist pattern 150 is further removed in which a cavity is to be formed later. Alternatively, a new photoresist pattern 150 is formed again. As a result, the substrate 100 at the regions 152 and the region 154 is exposed. In FIG. 6C, an etching process with the photoresist pattern 150 as the etching mask is performed to etch the exposed portion of the substrate 100 until the structural dielectric layer 102 is exposed. The region 152 becomes the cavity 153 of the MEMS device. The indent trench 156 is also formed at the region 154. In FIG. 6D, after removing the photoresist pattern 150, an isotropic etching process is performed, such as from one side or from both sides. As a result, a portion of the dielectric in the structural dielectric layer 102 is removed to expose the structural conductive layer 108 as a diaphragm (proof mass, capacitor, cantilever, spring etc.) of the MEMS structure 158. The substrate 100 with the cavity 153 has multiple venting holes and multiple discrete substrates with a thickness. The operation mechanism for the capacitor is similar to the capacitor in FIG. 5E.

Figure 7A:
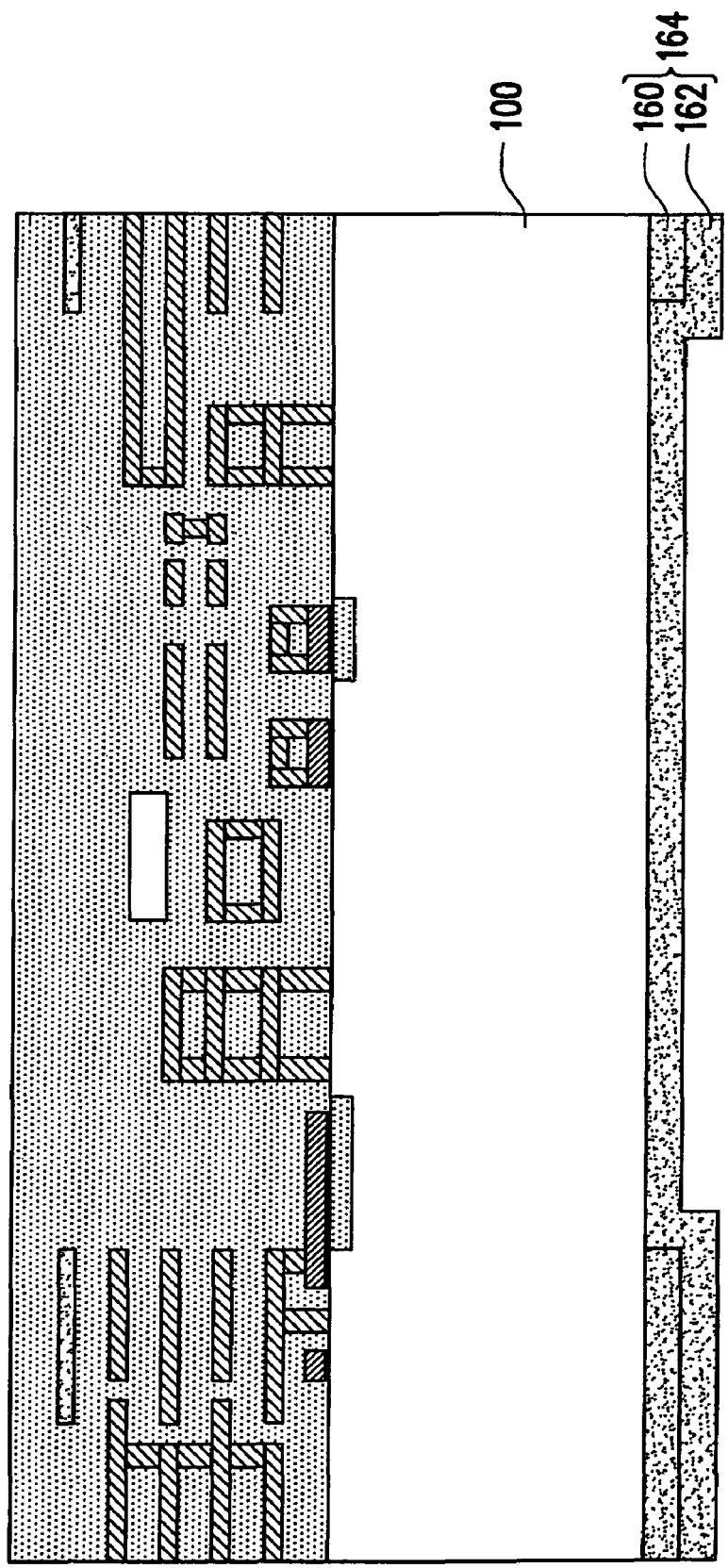
FIGS. 7A-7F are cross-sectional views, schematically illustrating a part of the process flow continuing from FIG. 4 for fabricating a MEMS device, according to a preferred embodiment of the invention.
Figure 7B:
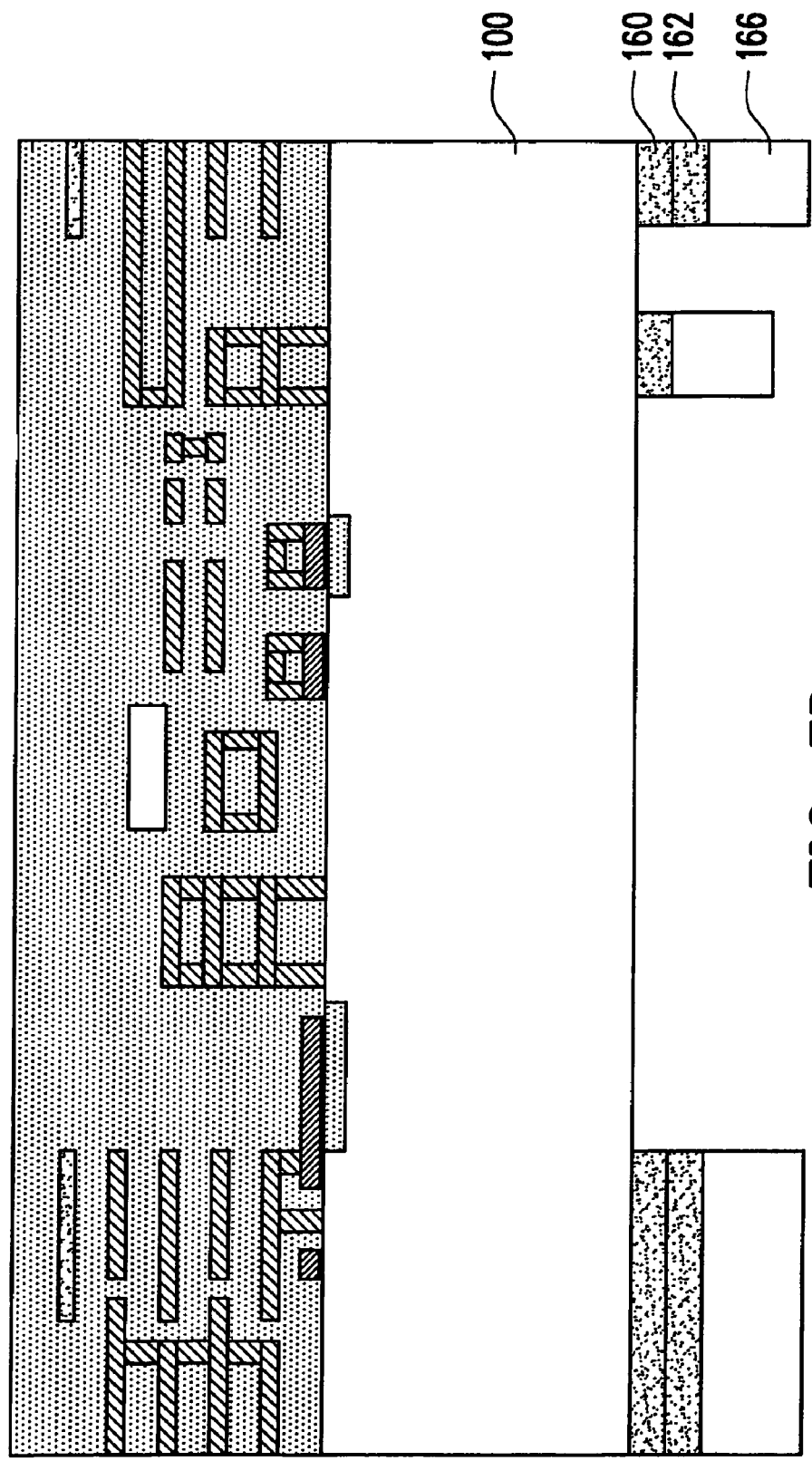

FIGS. 7A-7F are cross-sectional views, schematically illustrating a part of the process flow continuing from FIG. 4 for fabricating a MEMS device, according to a preferred embodiment of the invention. In FIG. 7A, a hard mask layer 160 is formed on the substrate 100 at the backside and expose a portion of the substrate 100. Another hard mask layer 162 is formed over the substrate 100 and the also cover the hard mask layer 160. As a result, the hard mask layer 164 with different levels of height is formed, in which two-layer stack structure is just the example. In FIG. 7B, a photoresist pattern 166 is formed on the hard mask layer 162, and an anisotropic etching process is performed on the hard mask layer 162 to expose the substrate 100.

Figure 7C:
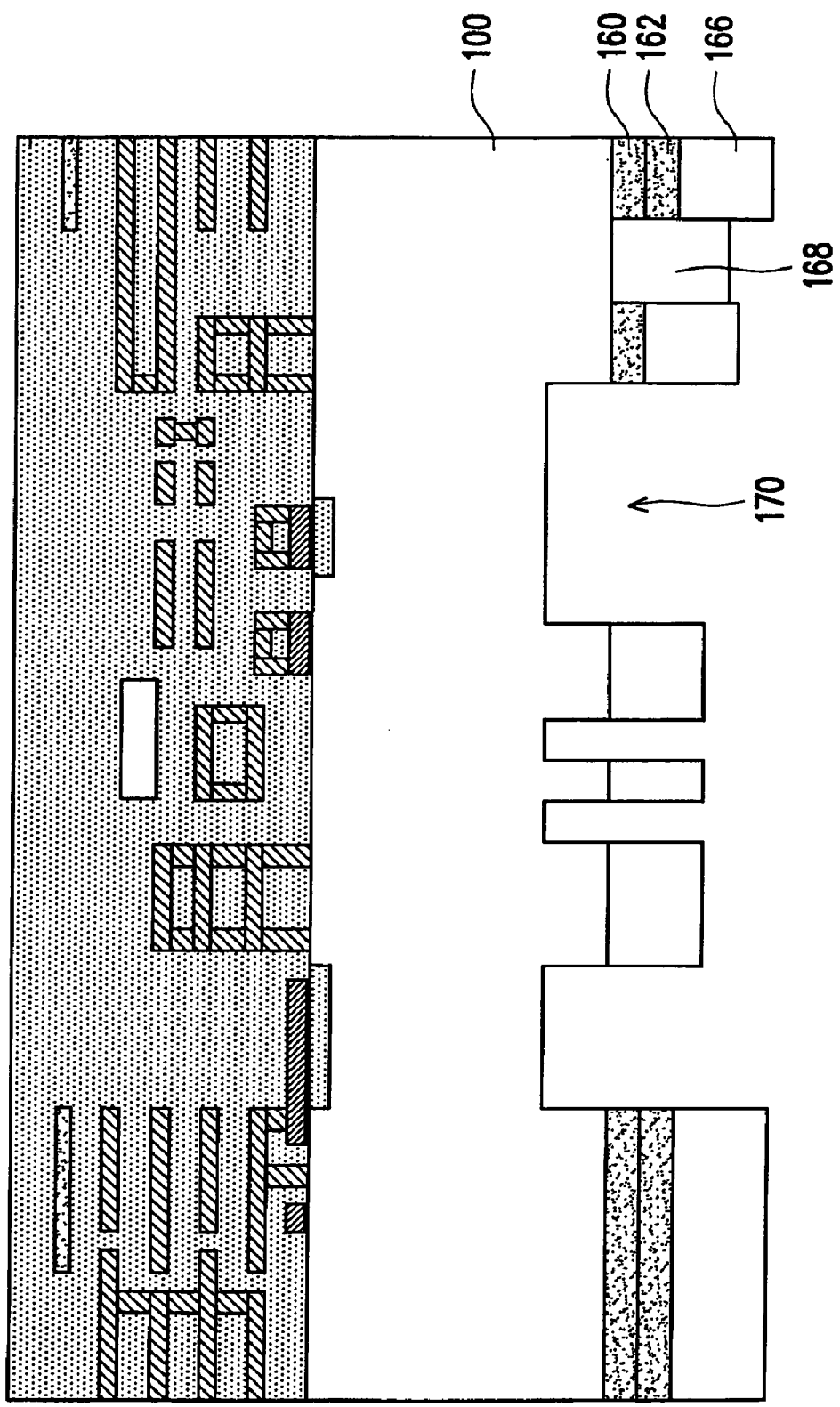
Figure 7D:
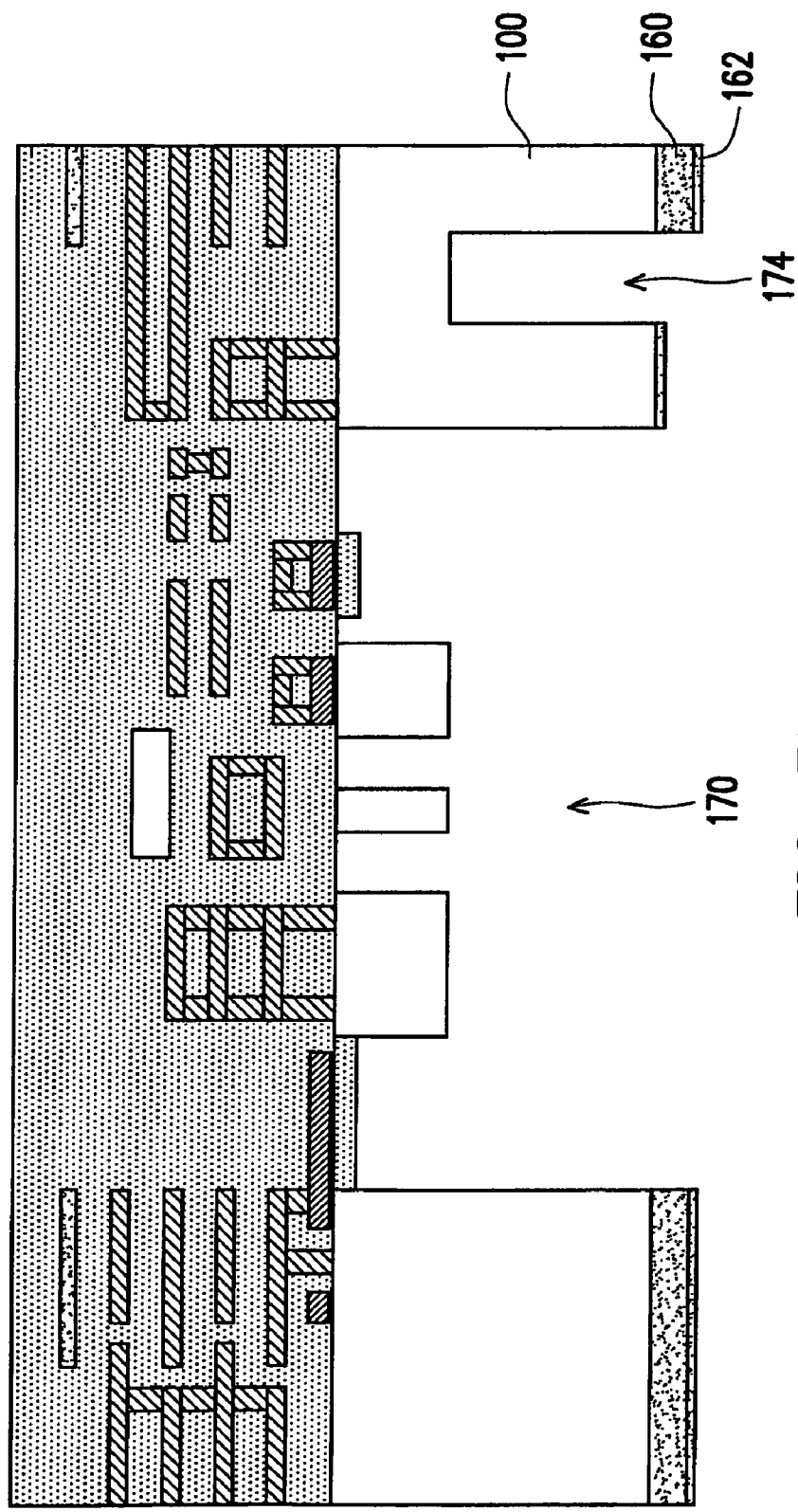
Figure 7E:
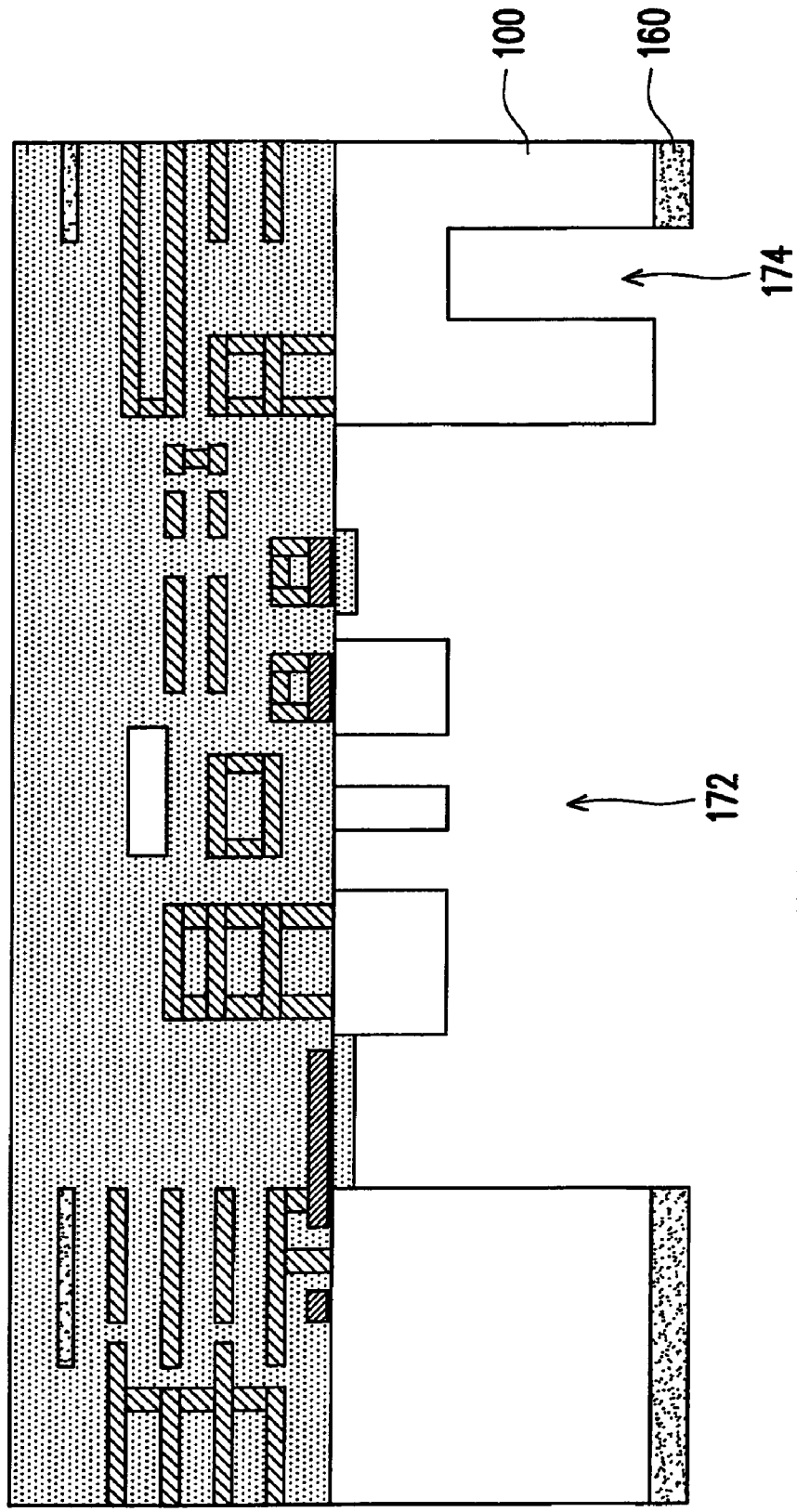
Figure 7F:
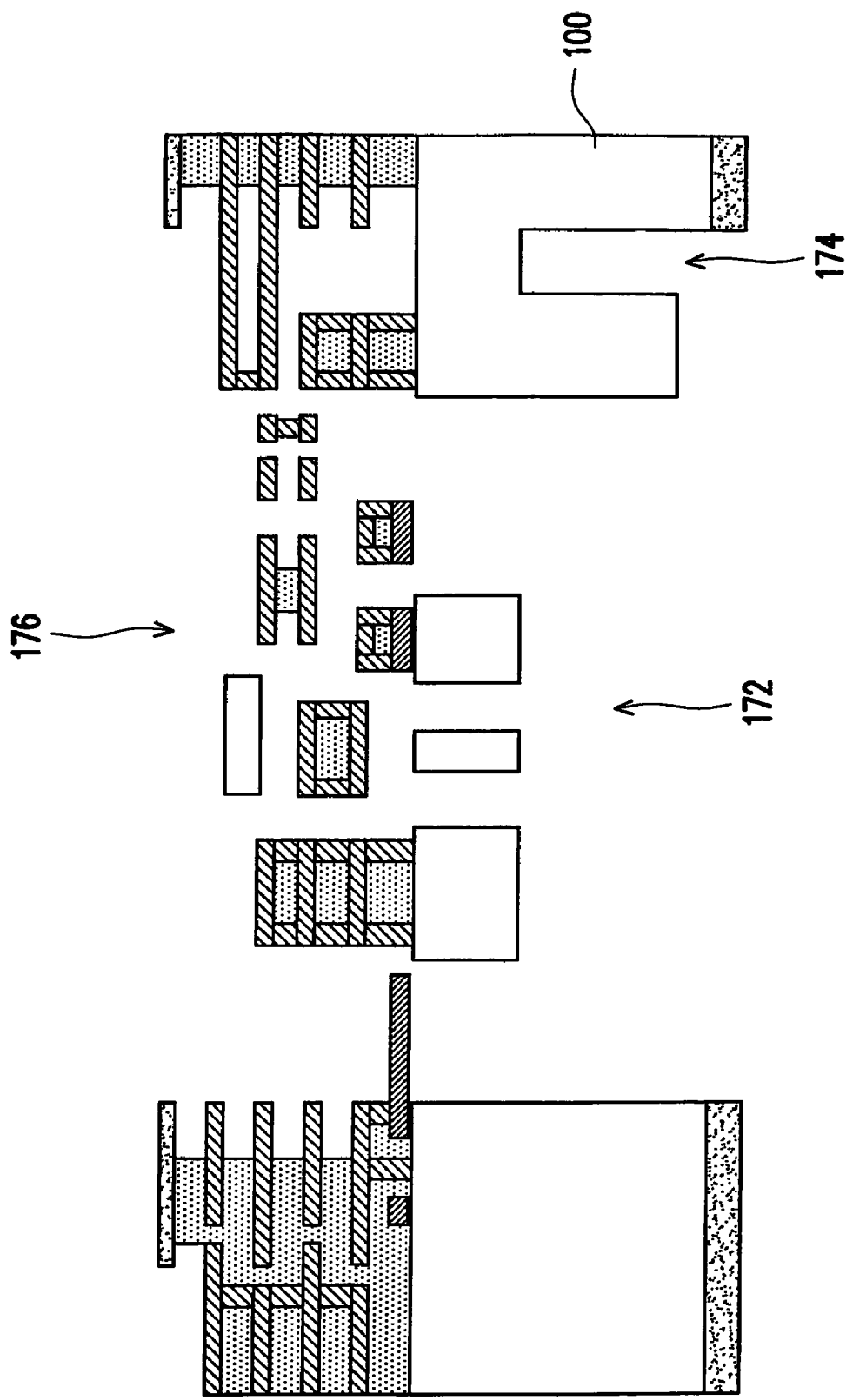

In FIG. 7C, another photoresist pattern 168 is formed with the photoresist pattern 168 as another etching mask. The exposed portion of the substrate 100 at the region 170 is etched by a depth. In FIG. 7D, the photoresist patterns 166 and 168 are removed. Another anisotropic etching process is performed to etching the exposed portion of the substrate 100 until the structural dielectric layer is exposed. As a result, a cavity 170 and an indent trench 174 are formed in the substrate 100. In this etching process, a portion of the hard mask layer 162 may be etched as well. In FIG. 7E, the hard mask layer 162 may be removed to expose addition portion of the substrate 100, while the hard mask layer 160 still covers on the substrate 100. In FIG. 7F, another etching process is performed so as to further etch a portion of the substrate 100 in thickness. In this situation, more levels of heights for the substrate can be formed as desired. Then an isotropic etching [process is performed. Likewise in previous embodiment, the cavity 172 with the indent trench 174 is formed in the substrate 100. and the structural conductive layer as the MEMS structure 176 is exposed. The hard mask layer 160 may be, for example, also removed in the same isotropic etching process, or removed layer.

Figure 8:
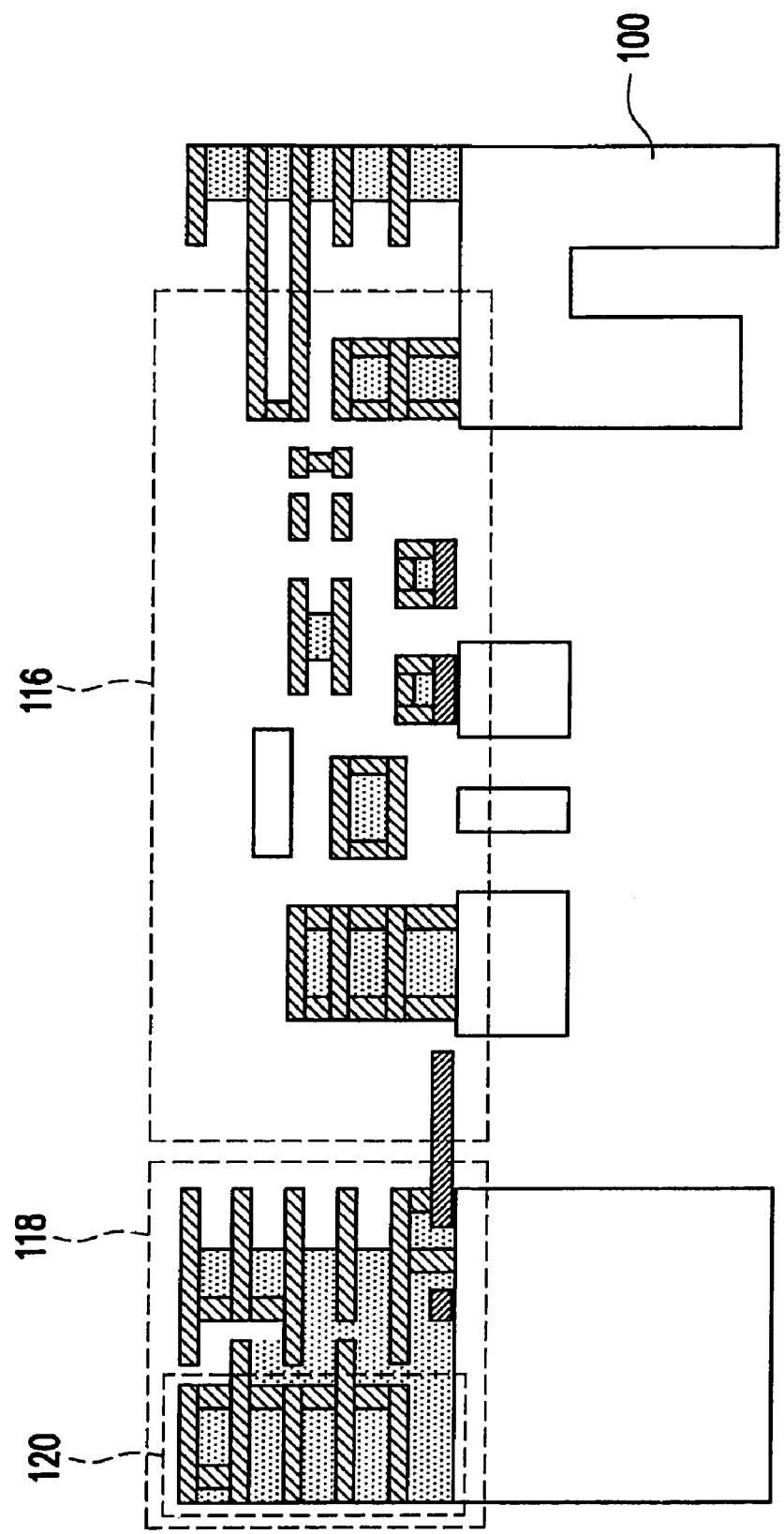
FIG. 8 is a cross-sectional view, schematically illustrating a structure of MEMS device, according to a preferred embodiment of the invention.

With the foregoing fabrication processes, FIGS. 5E, 6D, and 7F are not the only structures can be formed. Actually, due the fabrication process from the back side of the substrate with the etching stop and the photoresist pattern, the substrate can be fabricated in more choices, to achieve the desired mass and capacitance of the formed capacitor. FIG. 8 is a cross-sectional view, schematically illustrating a structure of MEMS device, according to a preferred embodiment of the invention. In FIG. 8, the material for the etching stop layer and the CMOS circuit can be modified under the same principle of the present invention. The etching stop layer 104 for stopping the isotropic etching process can be the metal, such as aluminum, in this example. The boding pad structure 120 and the CMOS circuit 118 can also be formed in different structure as desired.

Figure 9:
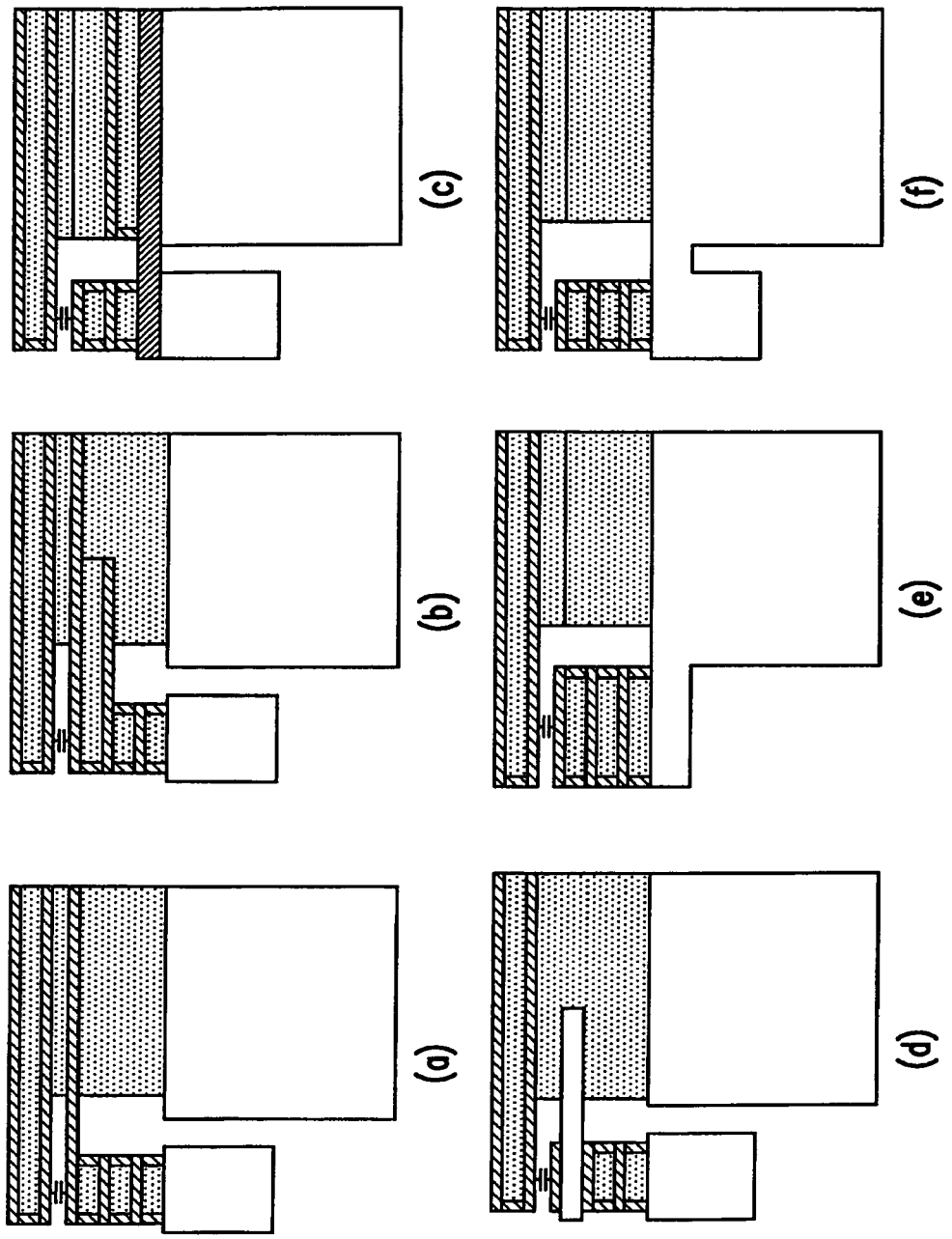
FIG. 9 is a cross-sectional view, schematically illustrating various options of structure to form a capacitor, according to a preferred embodiment of the invention.

FIG. 9 is a cross-sectional view, schematically illustrating various options of structure to form a capacitor, according to a preferred embodiment of the invention. In FIG. 9, if the MEMS DEVICE is to form a capacitor to monitor the acceleration in motion, there are several structures to take. In FIG.

9(a) to FIG. 9(f), if the motion is on the direction perpendicular to the substrate, two separated horizontal metal layer can formed capacitor, in which one massive part is, for example, held by the substrate and can respond to a force with the acceleration. When the capacitance is change due to shift, the motion with the external force can be monitored. Here, as for example shown in FIG. 9(b) and FIG. 9(d), the massive block is not necessarily to be held by the substrate. Instead, it can be, for example, held by another structure layer. The present invention provided the method to form the desired structure as actually needed.

Figure 10:
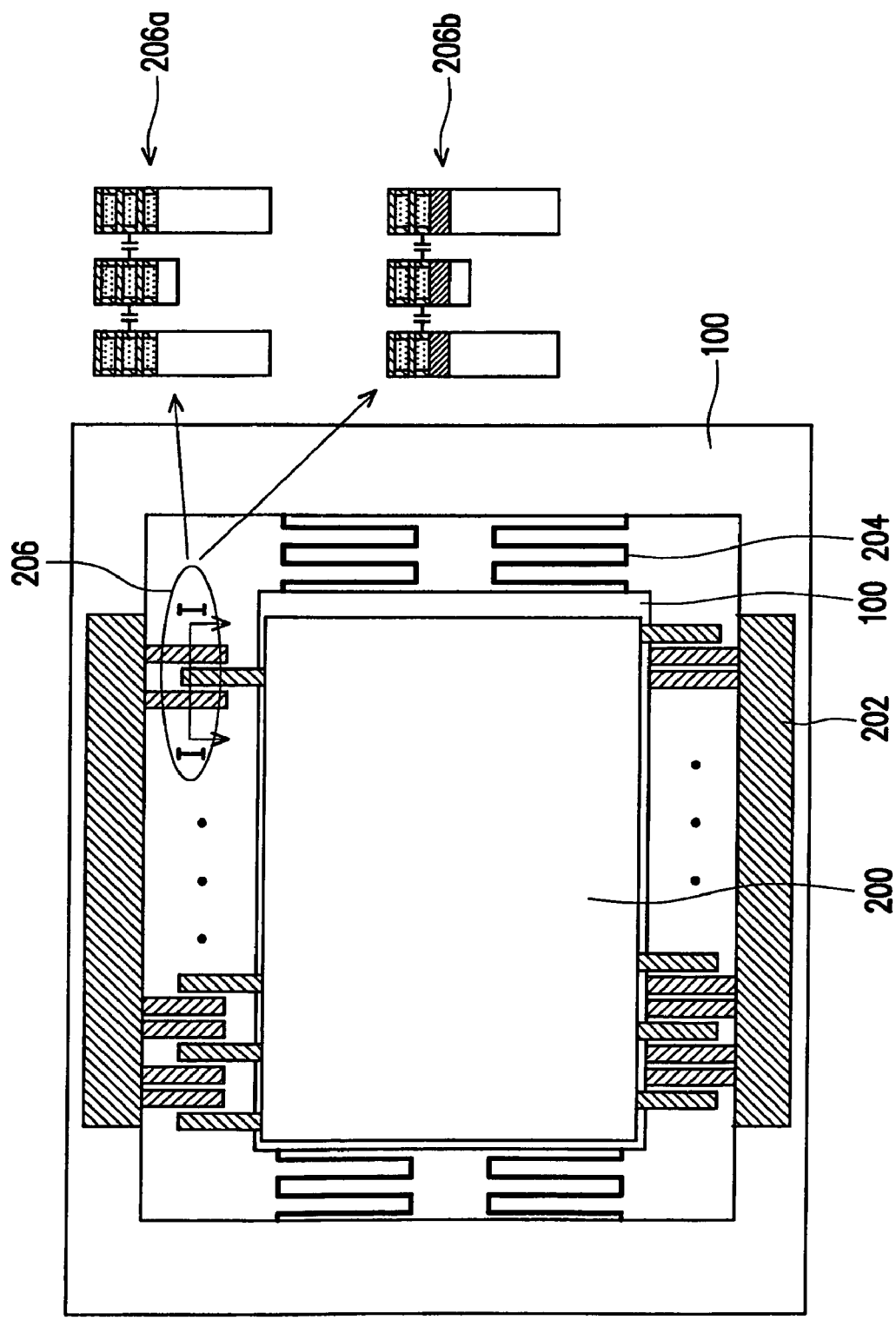

FIGS. 10-16 are cross-sectional or top views, schematically illustrating various applications of the MEMS device, according to a preferred embodiment of the invention. In FIG. 10, the MEMS structure with two metal parts 200 and 202 is formed on the substrate 100 at the suspending part and the main part. In this situation, the motion is on the horizontal direction, such as left to/from right. The capacitor structure 206 can be formed. The detail of the capacitor structure 206 in cross-sectional view at the cutting line I-I is shown, for example, in the structure 206a and 206b. Herein, the capacitor is formed form two vertical metal layers. The present invention allows the structure to be formed with the semiconductor fabrication process.

Figure 11:
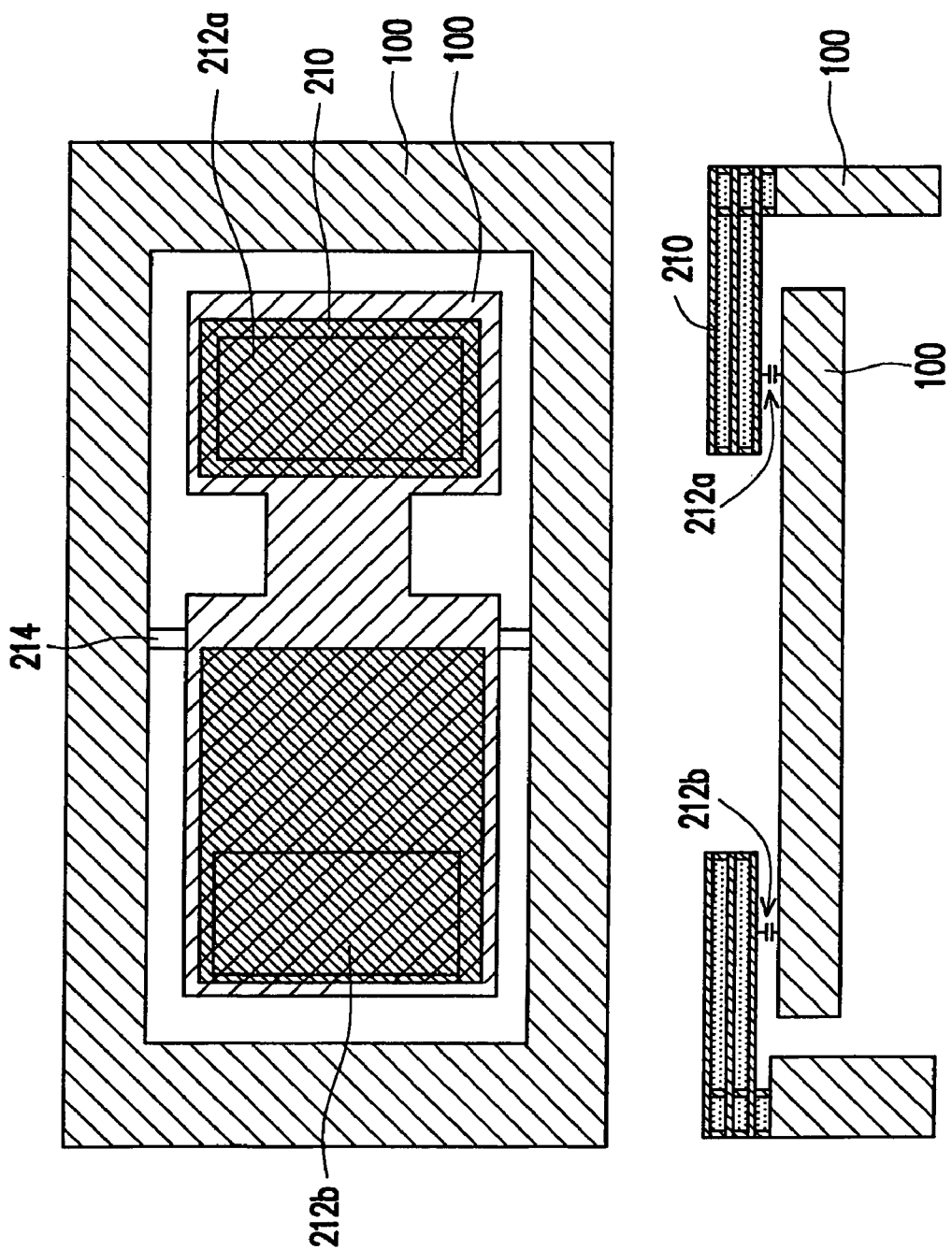
Figure 12:
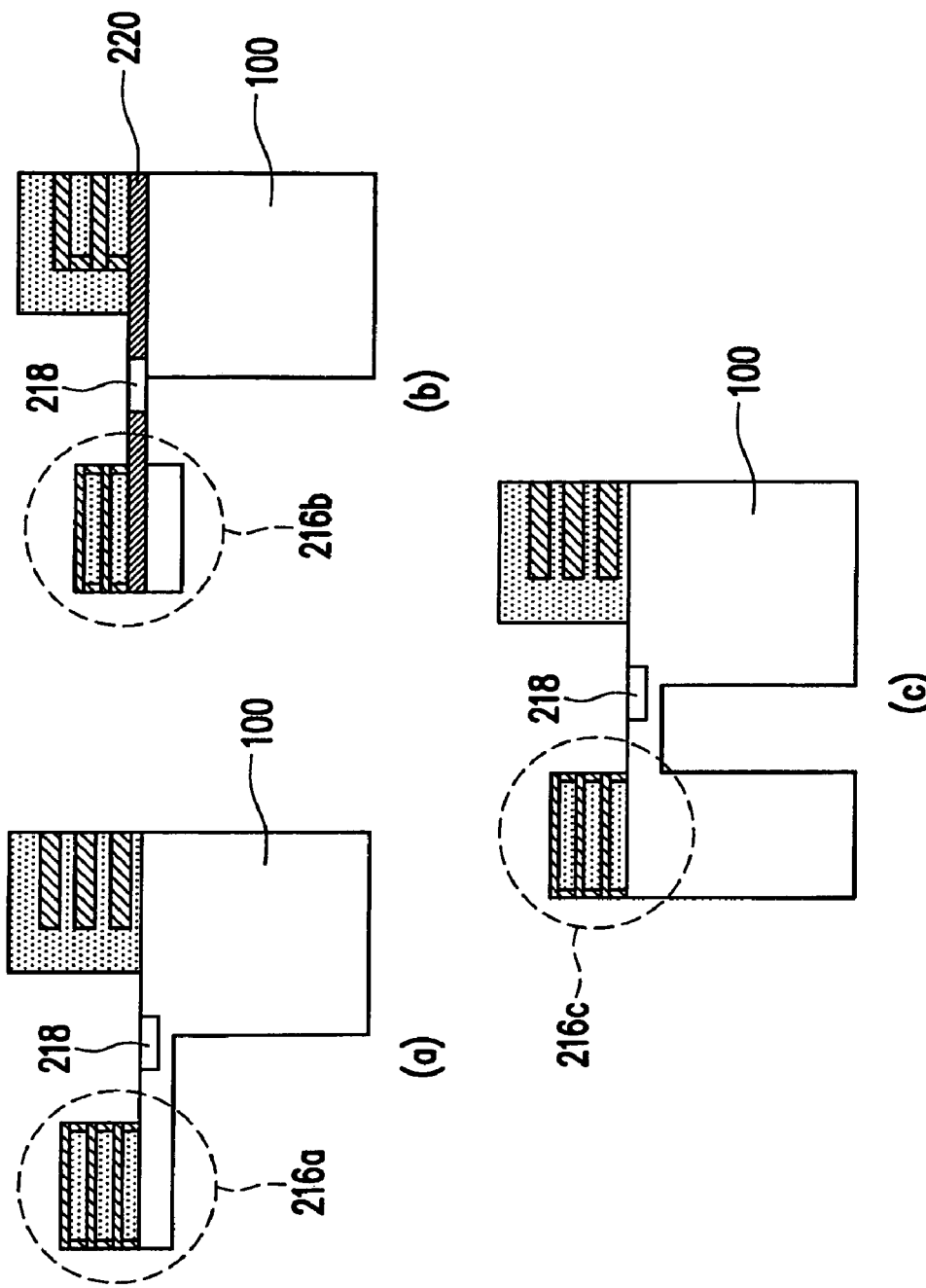

In FIG. 11, the MEMS device is designed as an unbalance single axis accelerometer. The substrate 100 has an outer part substrate and inner part substrate. The inner part substrate 100 is held be the structure layer 214 with a desired torsion. The structure layer 214 can be any desired formed to hold the inner part substrate 100 with different size. Also, the structural conductive layer 210 accordingly has two parts to form a capacitor 212a and another capacitor 212b. In the lower drawing for the cross-sectional view, the two capacitors 212a and 212b, for example, use the substrate 100 as the lower common electrode.

In FIG. 12(a), in another application, the capacitor is not necessarily formed in the MEMS structure. Instead, a piezoresistor 218, such as the N-type or P-type doped layer, can be formed on in the substrate at the suspending arm for holding the mass block 216a. Then, when a motion is made, the resistance deviation can be detected. Alternatively, in FIG. 12(b), another MEMS structure can be fabricated. The mass block 216b can be held by an arm, which is a layer 220 with the piezoresistor 218 without the substrate 100. In FIG. 12(c), the mass block 216c can have more weight, form the substrate block.

Figure 13:
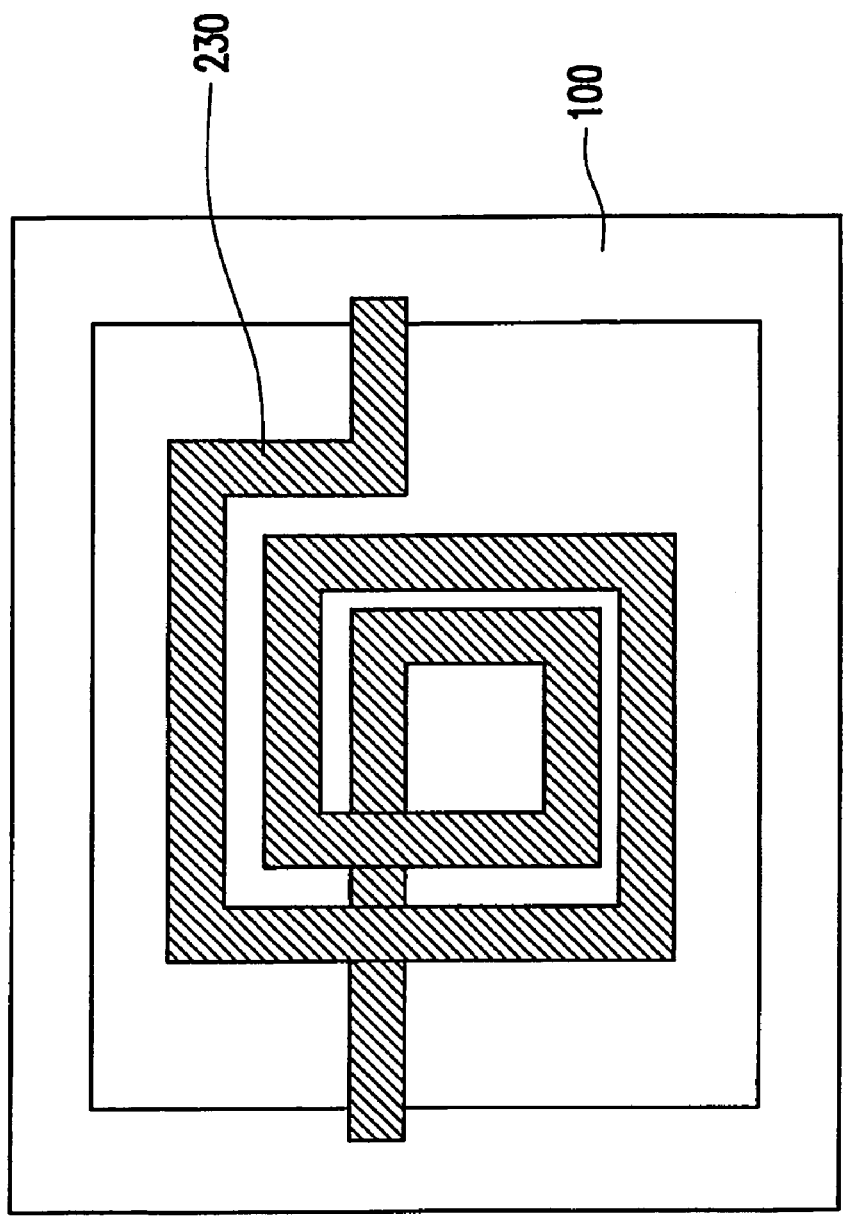

In FIG. 13, an inductor 230 can also be formed with a hole of the substrate 100. In this situation, there is no substrate under the inductor 230 and the Q value of the inductor can be improved.

Figure 14:
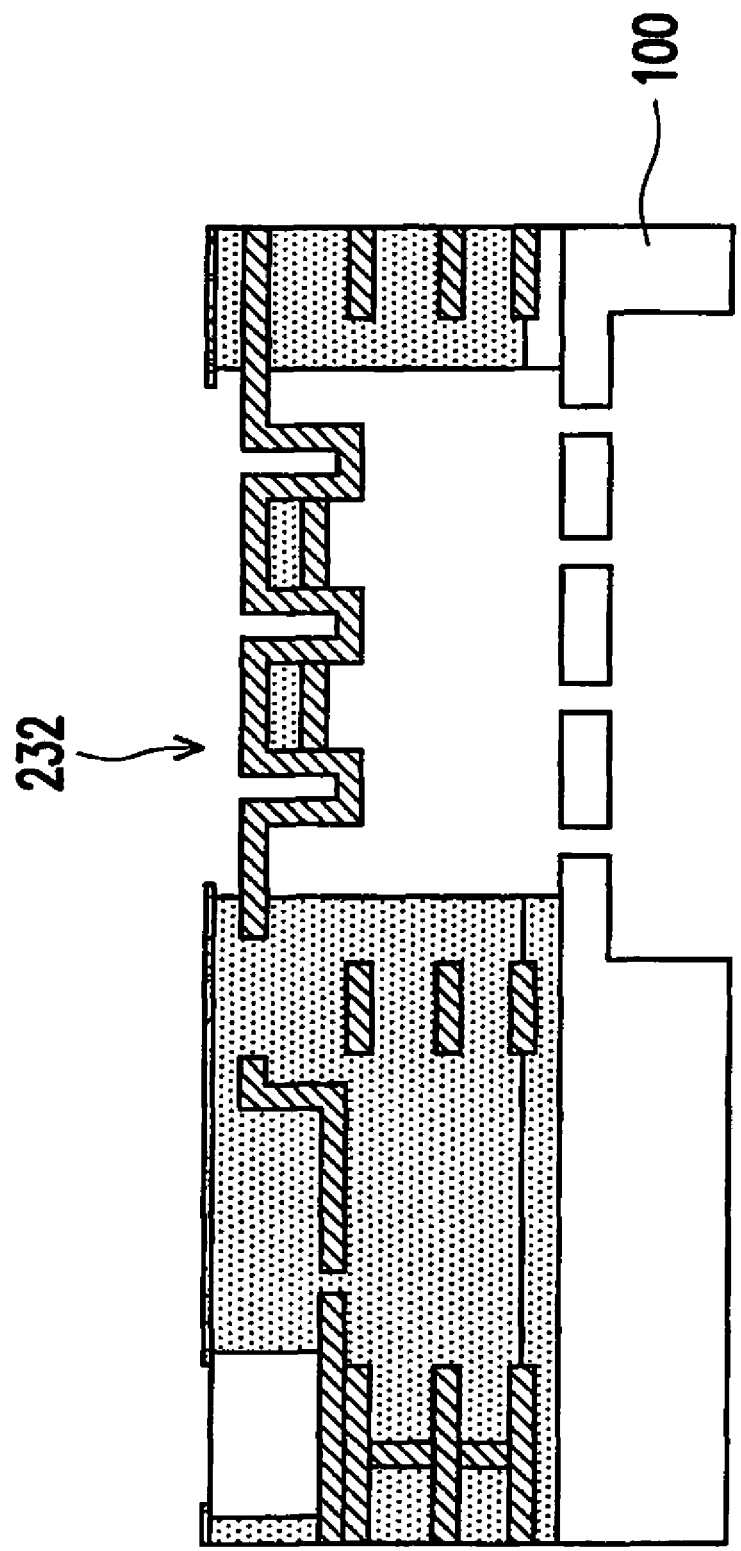
Figure 15:
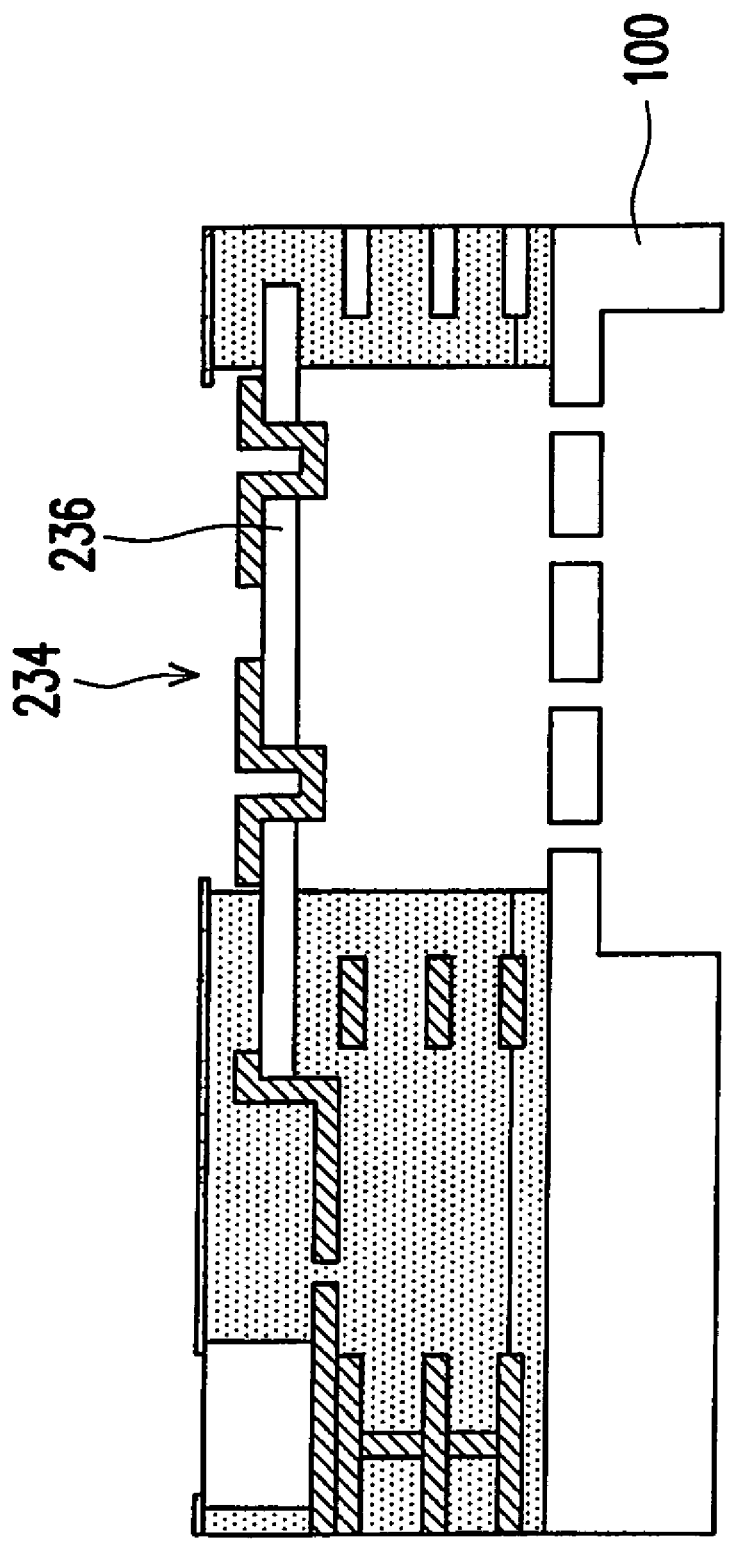

In FIG. 14, the MEMS structure 232 can be a diaphragm with corrugated structure using foregoing process flow. In this example, the corrugated structure is formed form multiple horizontal layers and the vertical via layers. The corrugated structure is helpful in improving the elastic properties, such as the spring effect. In FIG. 15, similarly, MEMS structure 234 is also designed as the corrugated structure in a diaphragm structure. However, the conductive layer is not continuous. Then the composite layer 236 can be formed for the mechanical connection to hold the discrete metal layers. In FIG. 16, the vertical via layer of the corrugated structure may be replaced by the slant layer. In order to for the slant part, the taper etching is involved as to be described later in FIGS. 17A-17M. In this embodiment, a dielectric residue 244 may remain at the corner. The etching stop layer 242 and the hard mask layer 240 may be involved.

Figure 17A:
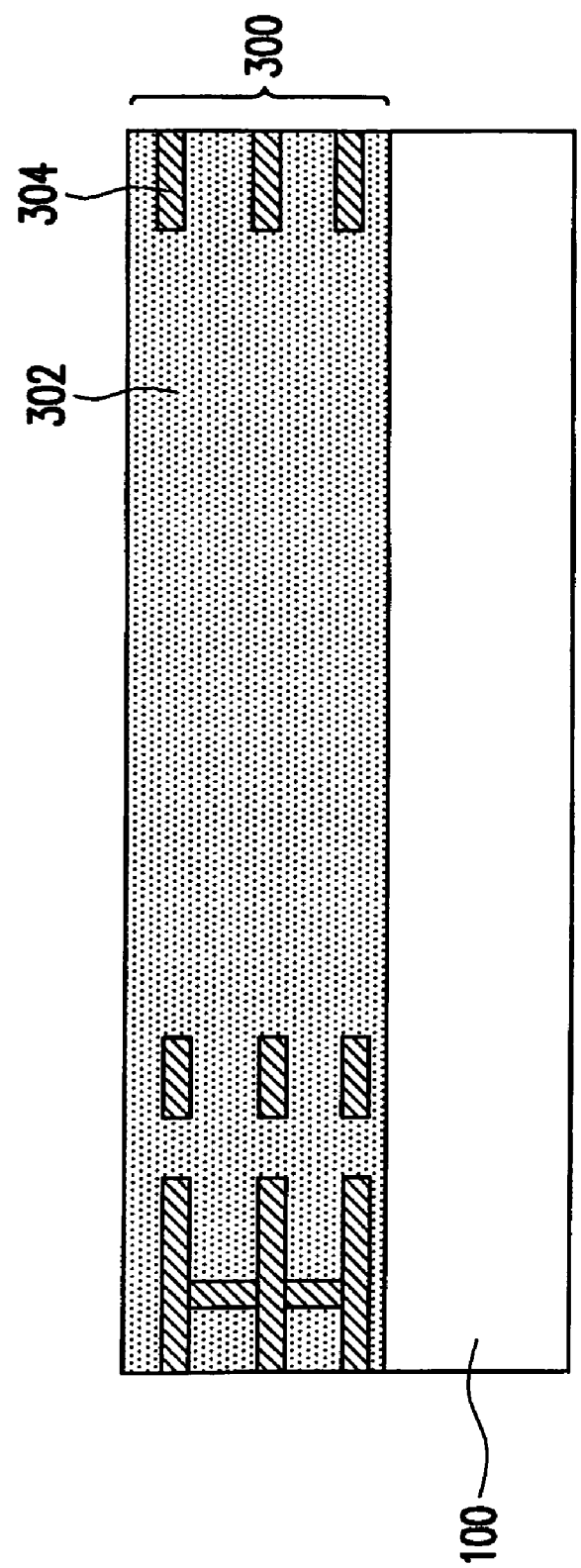
FIGS. 17A-17M are cross-sectional views, schematically illustrating a process for fabrication a MEMS device with corrugated diaphragm, according to a preferred embodiment of the invention.
Figure 17B:
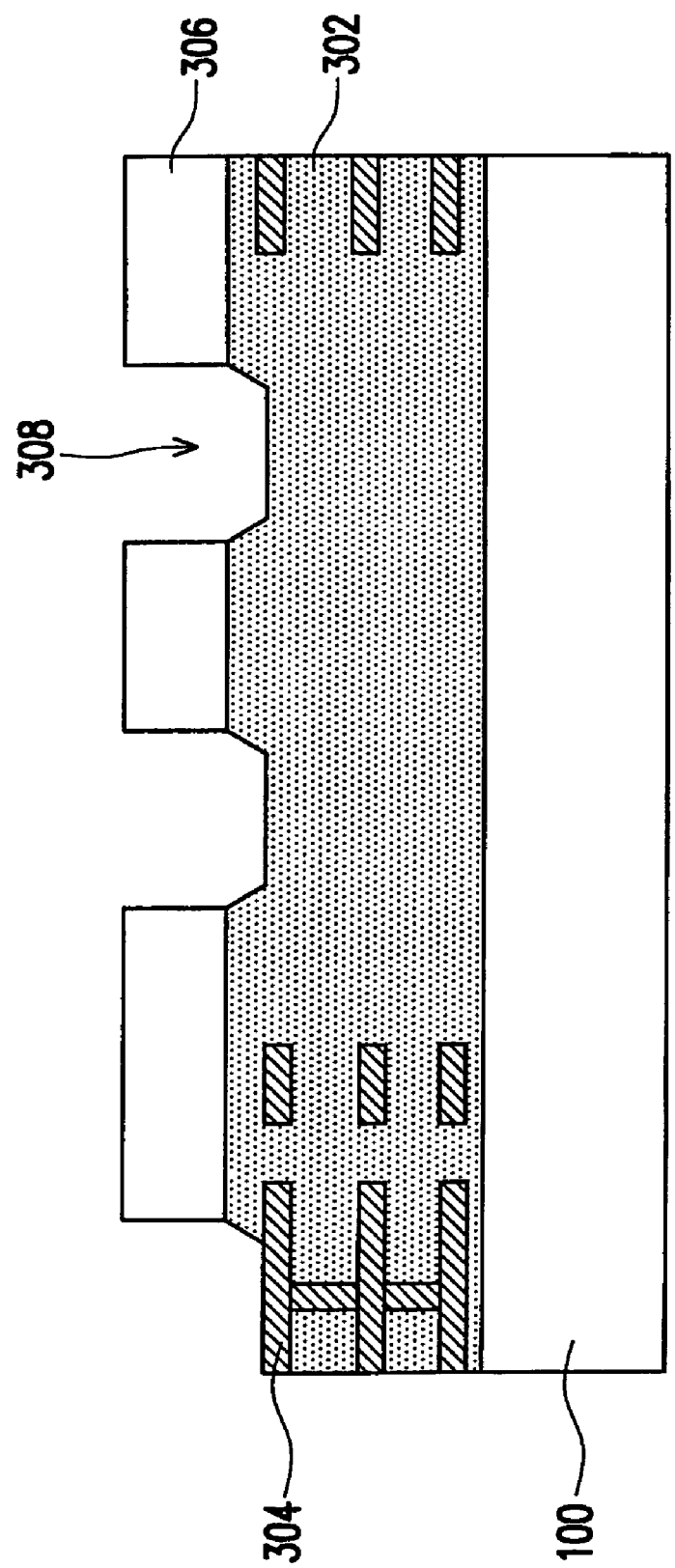
Figure 17C:
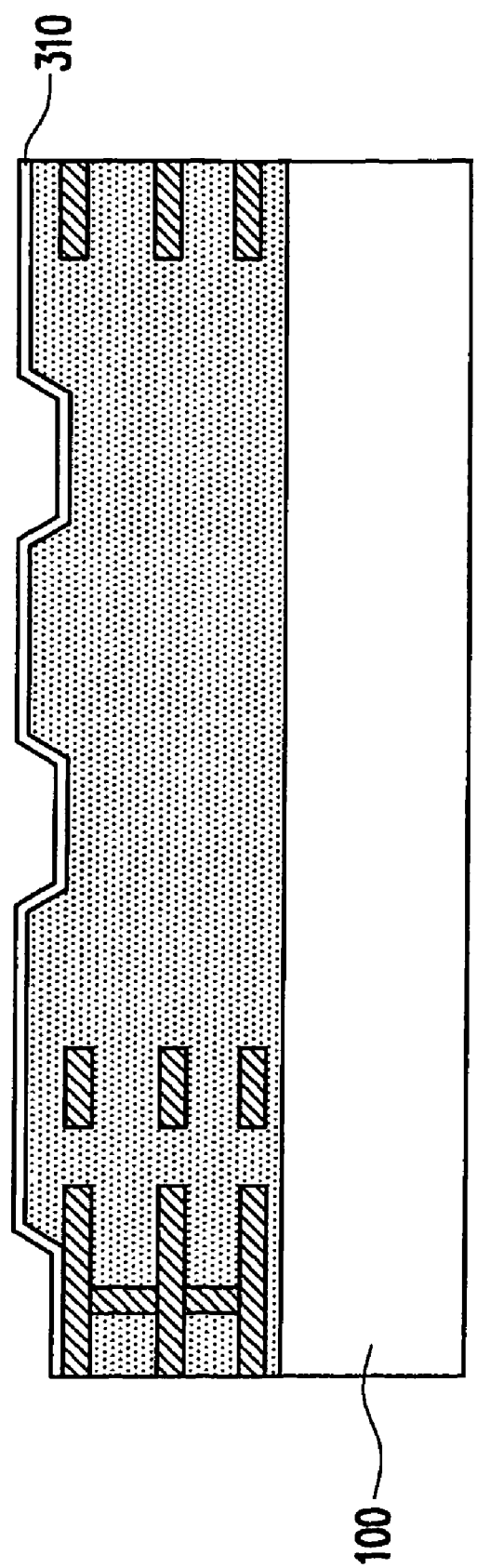
Figure 17D:
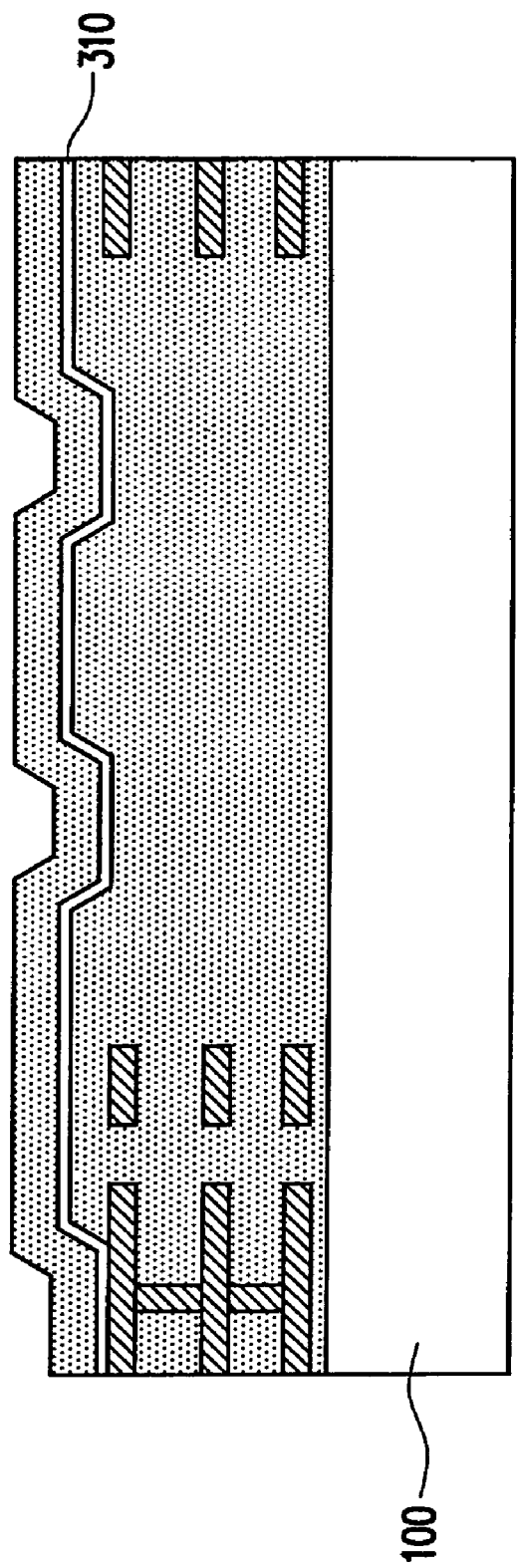

FIGS. 17A-17M are cross-sectional views, schematically illustrating a process for fabrication a MEMS device with corrugated diaphragm, according to a preferred embodiment of the invention. In FIG. 17A, a structural dielectric layer 300 embedded with s structural conductive layer 304 in the dielectric layer 302 is formed on a substrate 100, in which the dielectric layer 302 includes several sub-layers for adapting the structural conductive layer 304. In FIG. 17B, an etching mask pattern 306, such as the photoresist pattern 306, is formed on the substrate dielectric layer 302. A etching process is performed on the dielectric layer 302 with the photoresist pattern 306 as the etching mask. Due to the taper etching, the indent region 308 has slant sidewall. In FIG. 17C, after removing the photoresist pattern 306, a first conductive layer 310, such as a metal layer 310, is formed on the dielectric layer. The thickness of the first conductive layer 310 is small, so that the tapered indent structure still remains in conformal shape. In FIG. 17D, a dielectric layer is formed on the conductive layer 310 in which the tapered indent structure still remains.

Figure 17E:
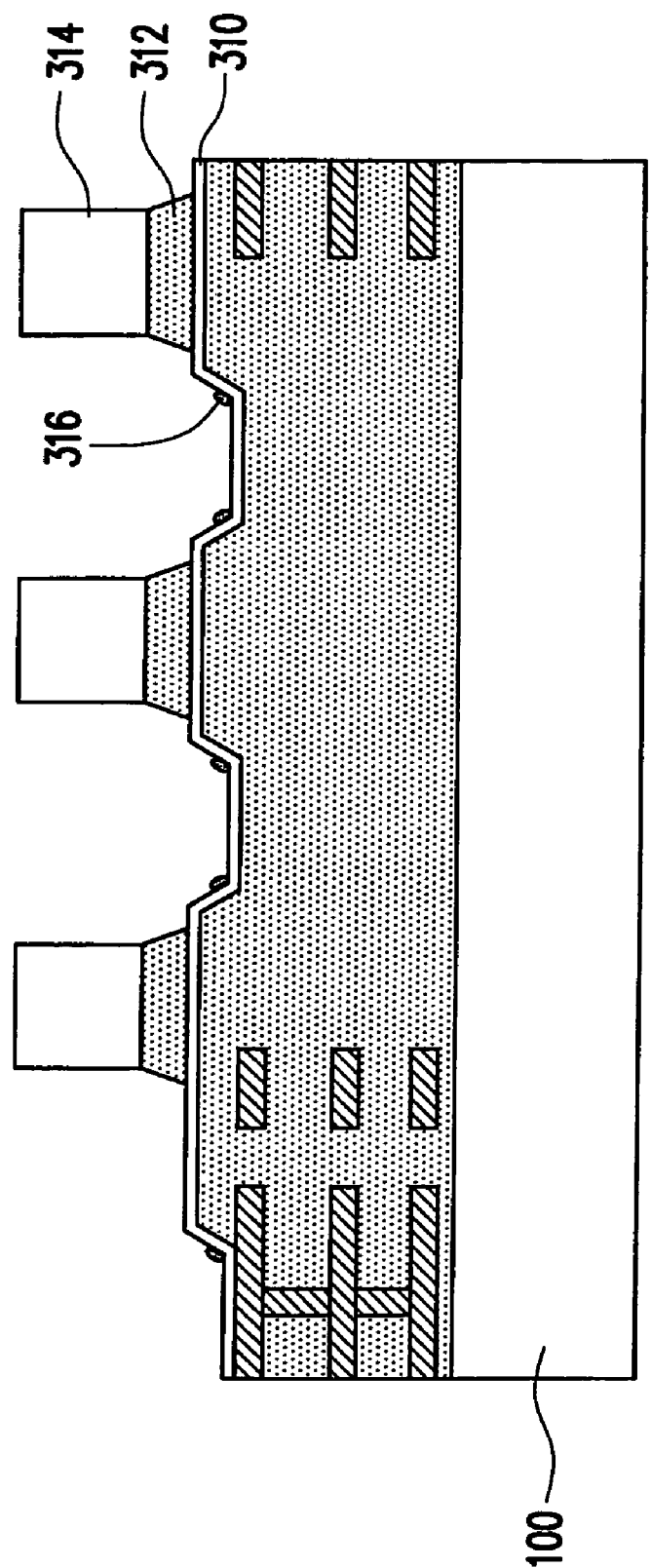
Figure 17F:
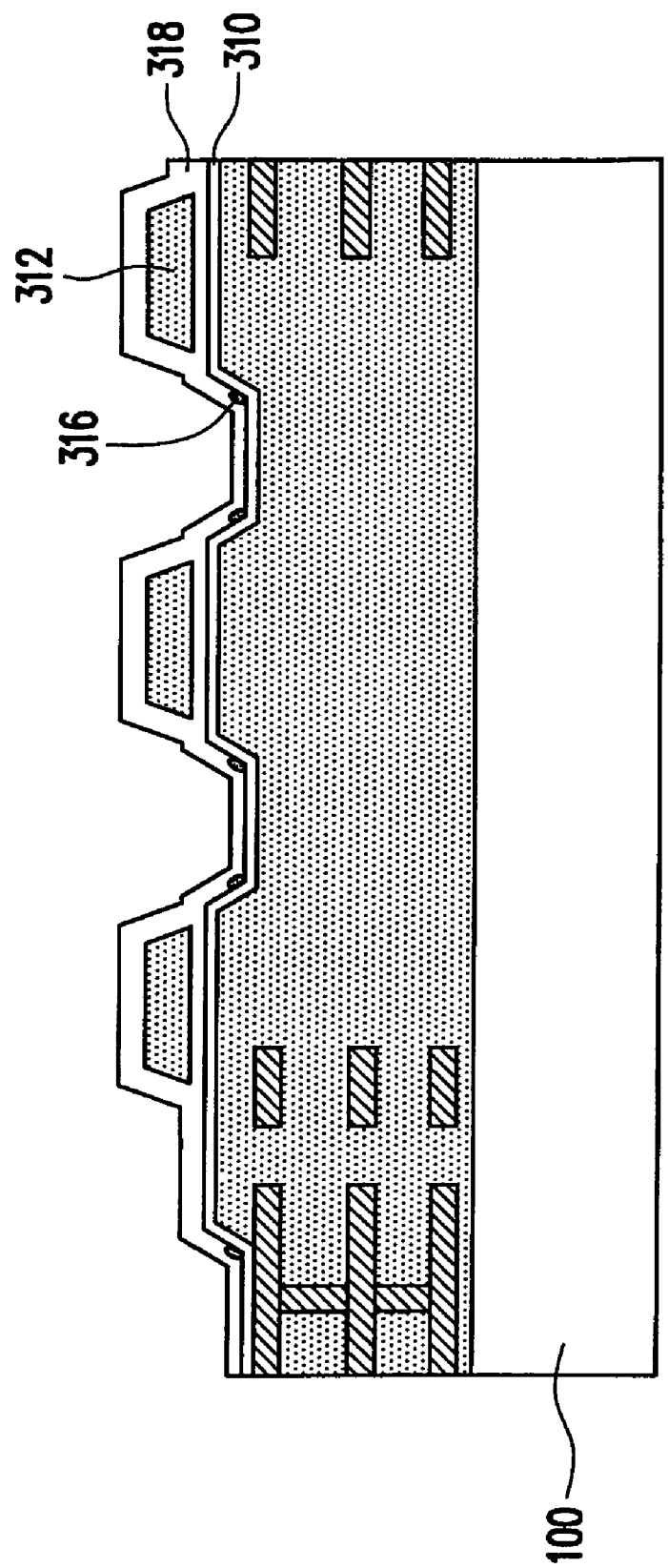
Figure 17G:
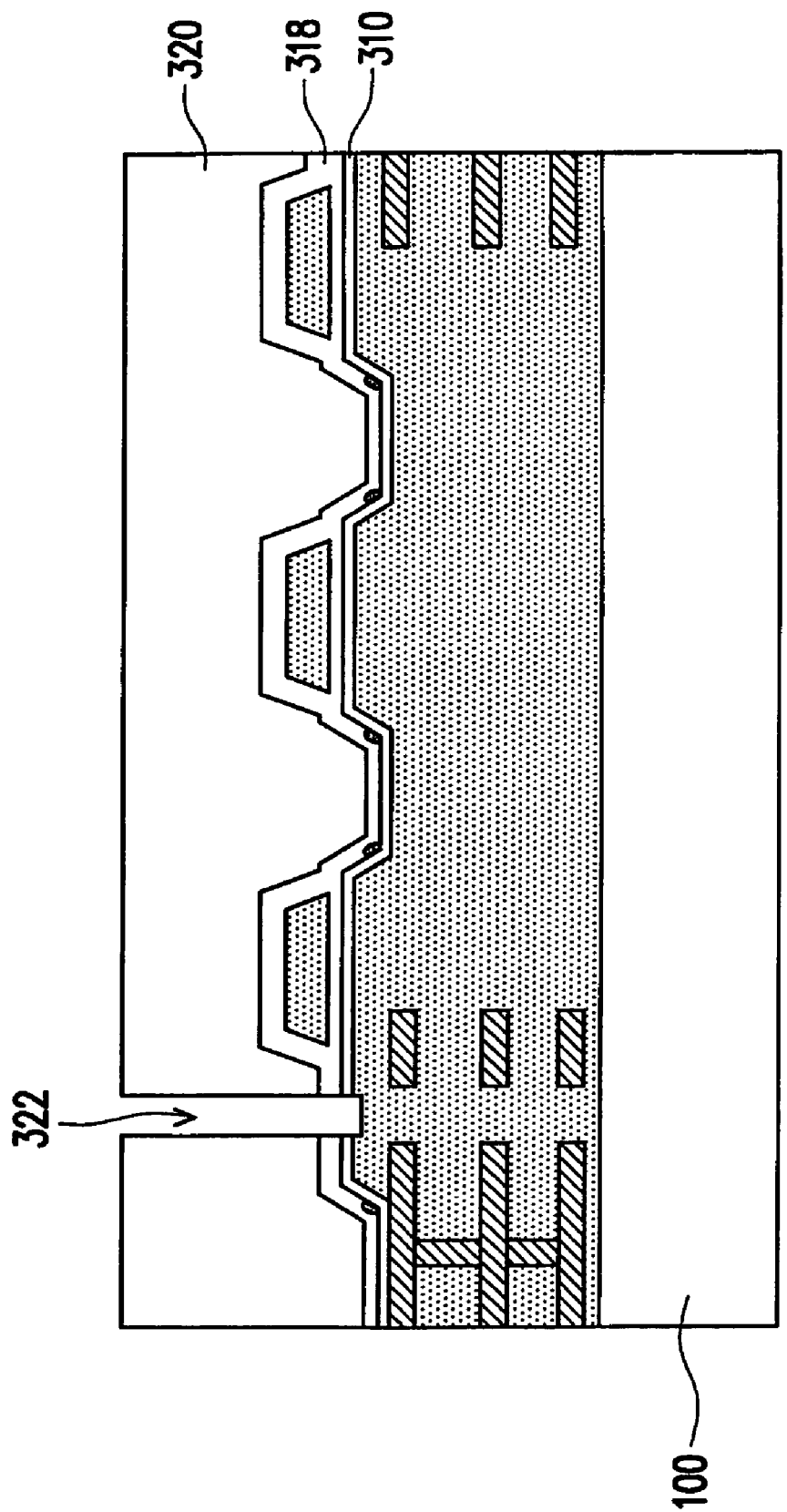
Figure 17H:
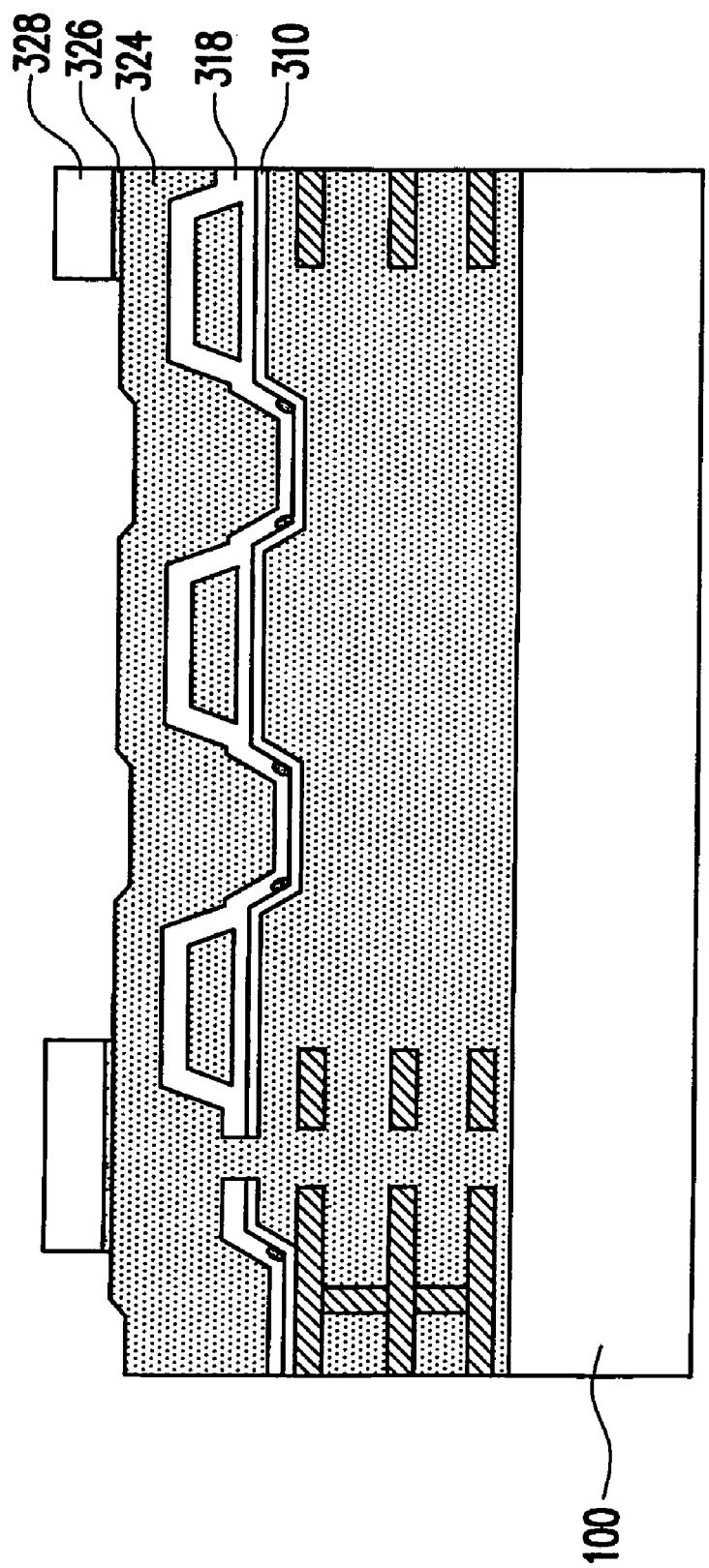

In FIG. 17E, a photoresist pattern 314 is formed on the dielectric layer other than the tapered indent region. Another taper etching process is performed to etch the dielectric layer. The remaining portion of the dielectric layer forms the island-like dielectric layer 312 with taper sidewall on the conductive layer 310. Here due to the etching performance, a reside spacer 316 may remain at the corners. However, the reside spacer 316 may be removed too. In FIG. 17F, another conductive layer 318 is formed on the conductive layer 310 and the dielectric layer 312, so as to integrate as a conductive layer enclosing the dielectric layer 312. In FIG. 17G, a photoresist layer 320 is formed over the substrate with an opening pattern 322 and an etching process is performed to etching the conductive layer. As a result, the conductive layers 310+318 are patterned into interconnection structure while the MEMS structure in diaphragm is formed as well. In FIG. 17H, after removing the photoresist layer 320, another dielectric layer 324 is formed over the conductive layer 318, in which the tapered indent region is also filled. An etching stop layer 326 is formed on the dielectric layer 324. The photoresist layer 328 is formed on the etching stop layer 326 and an etching process is performed. As a result, the etching stop layer 326 is patterned to cover a desired portion of the dielectric layer 324.

Figure 17I:
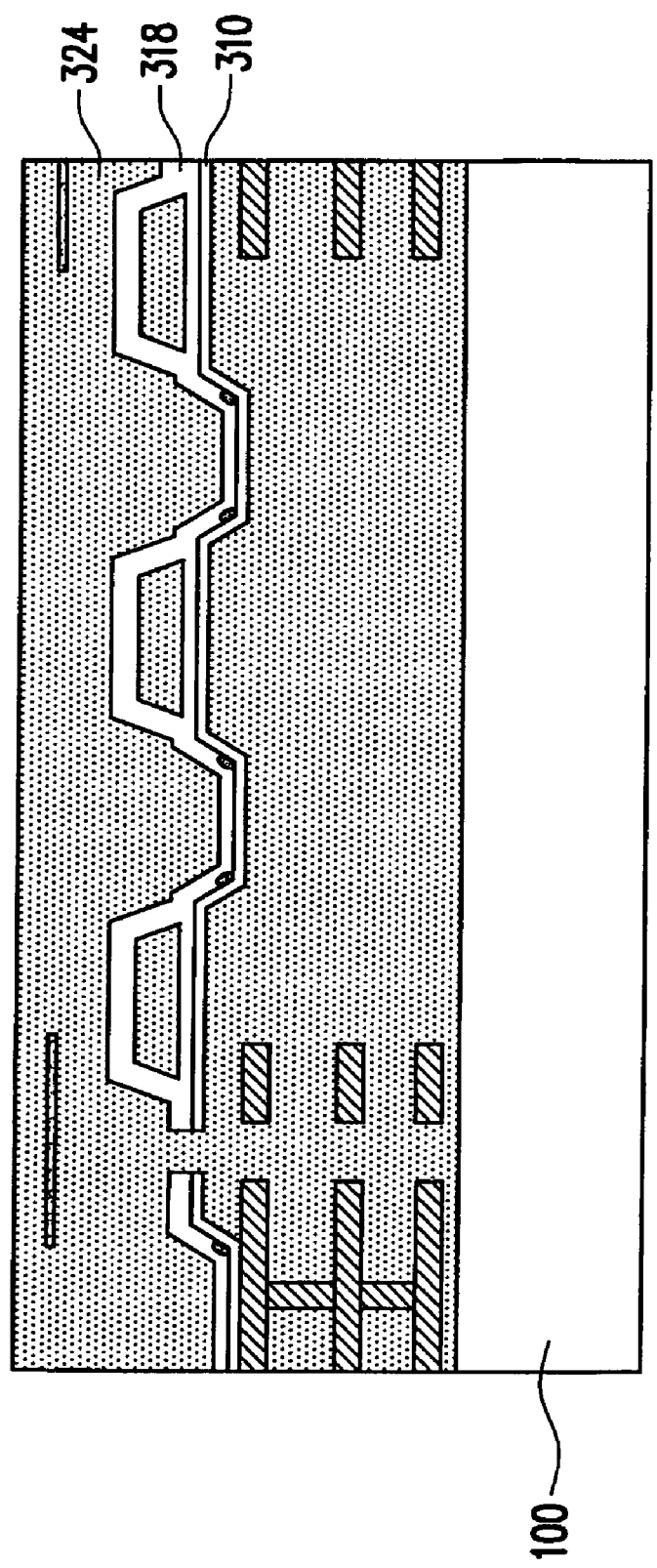

In FIG. 17I, after removing the photoresist layer 328, a planarized dielectric layer is formed on top. The planarized layer can be formed by depositing additional dielectric layer on top and performing a planarization process, such as the chemical mechanical polishing (CMP) process, on the additional dielectric layer. As a result, the etching stop layer 326 is embedded in the dielectric layer 324. However, the process in FIG. 17I may be not necessary. It depends on the actual need.

Figure 17J:
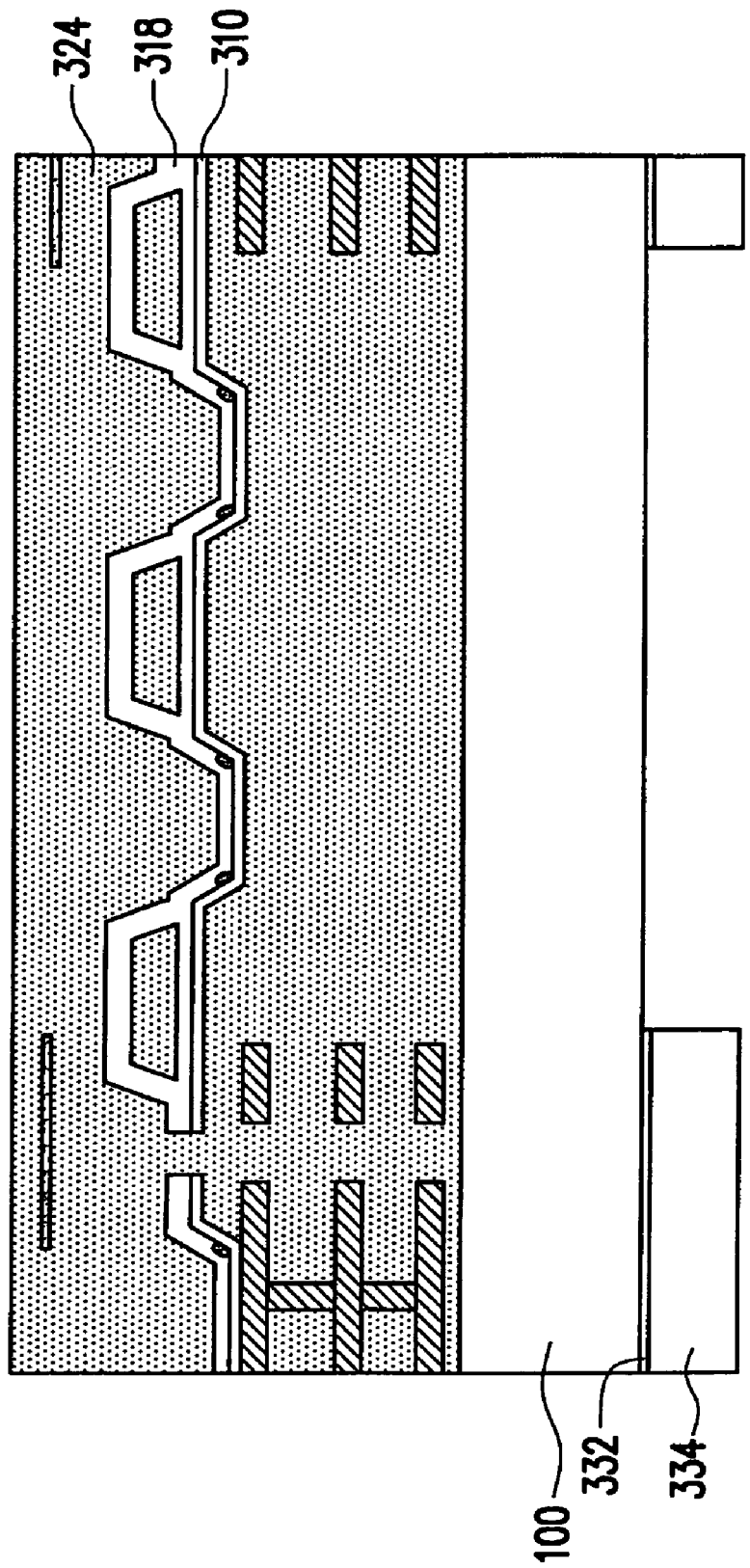
Figure 17K:
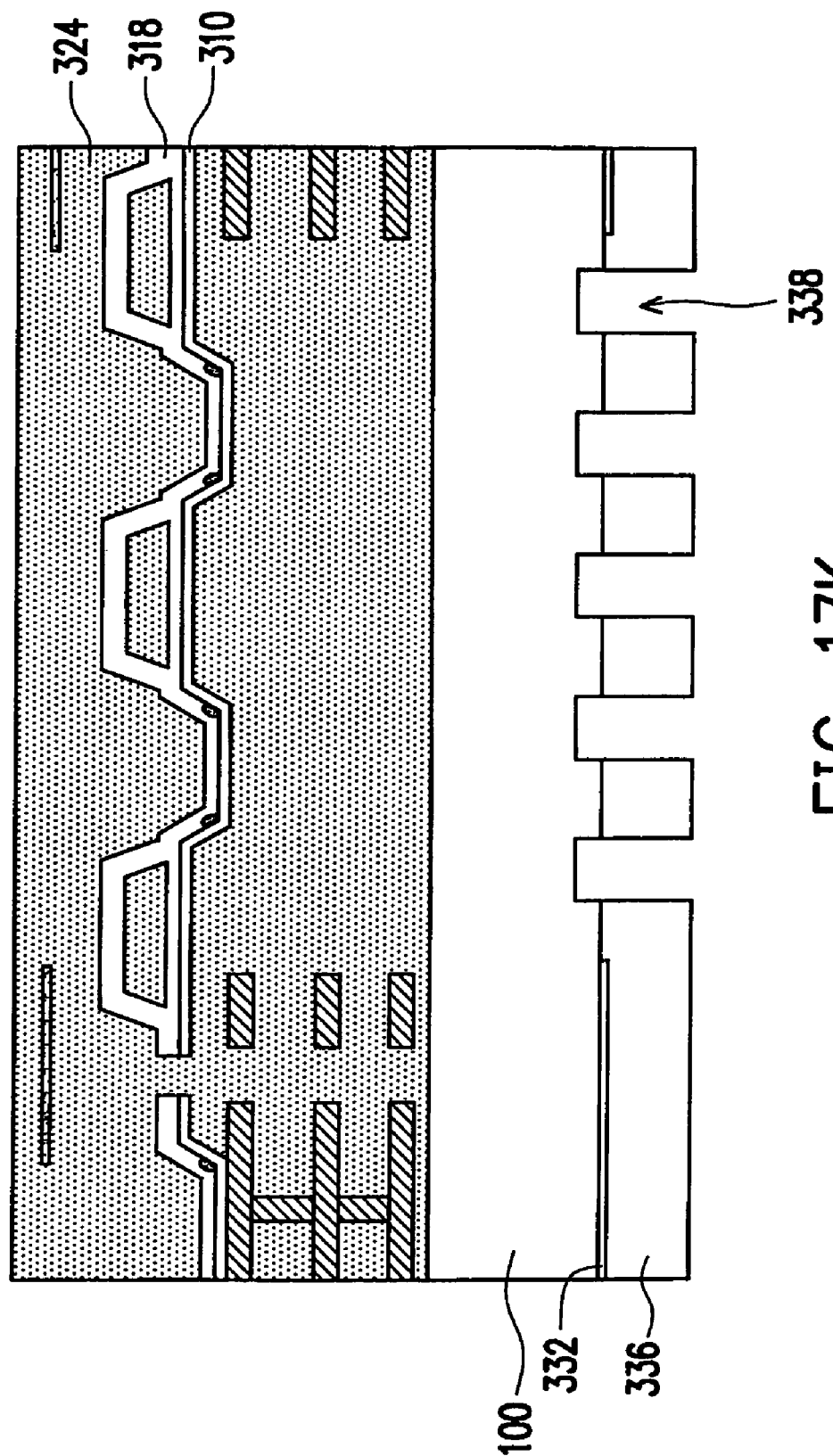
Figure 17L:
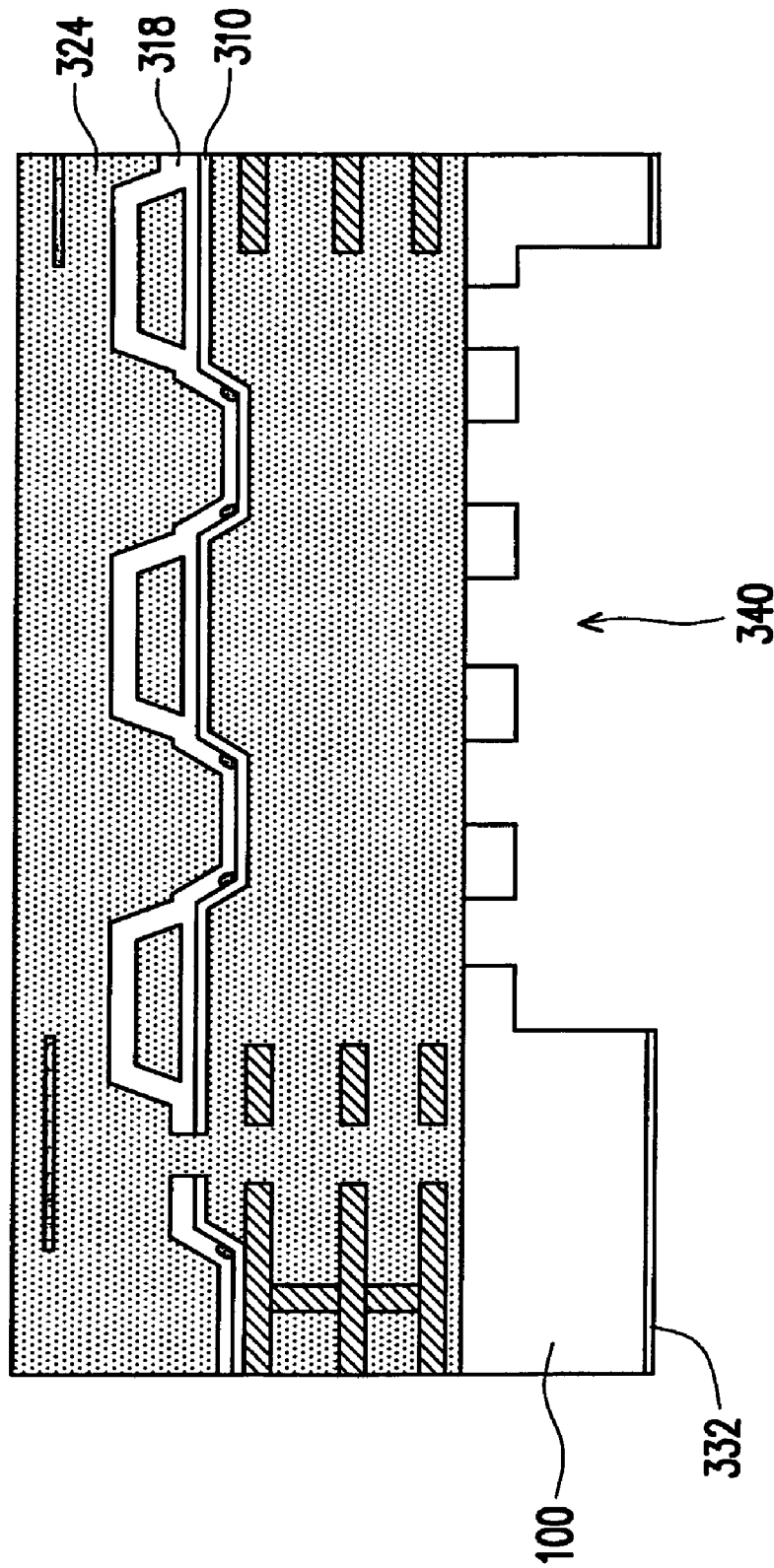
Figure 17M:
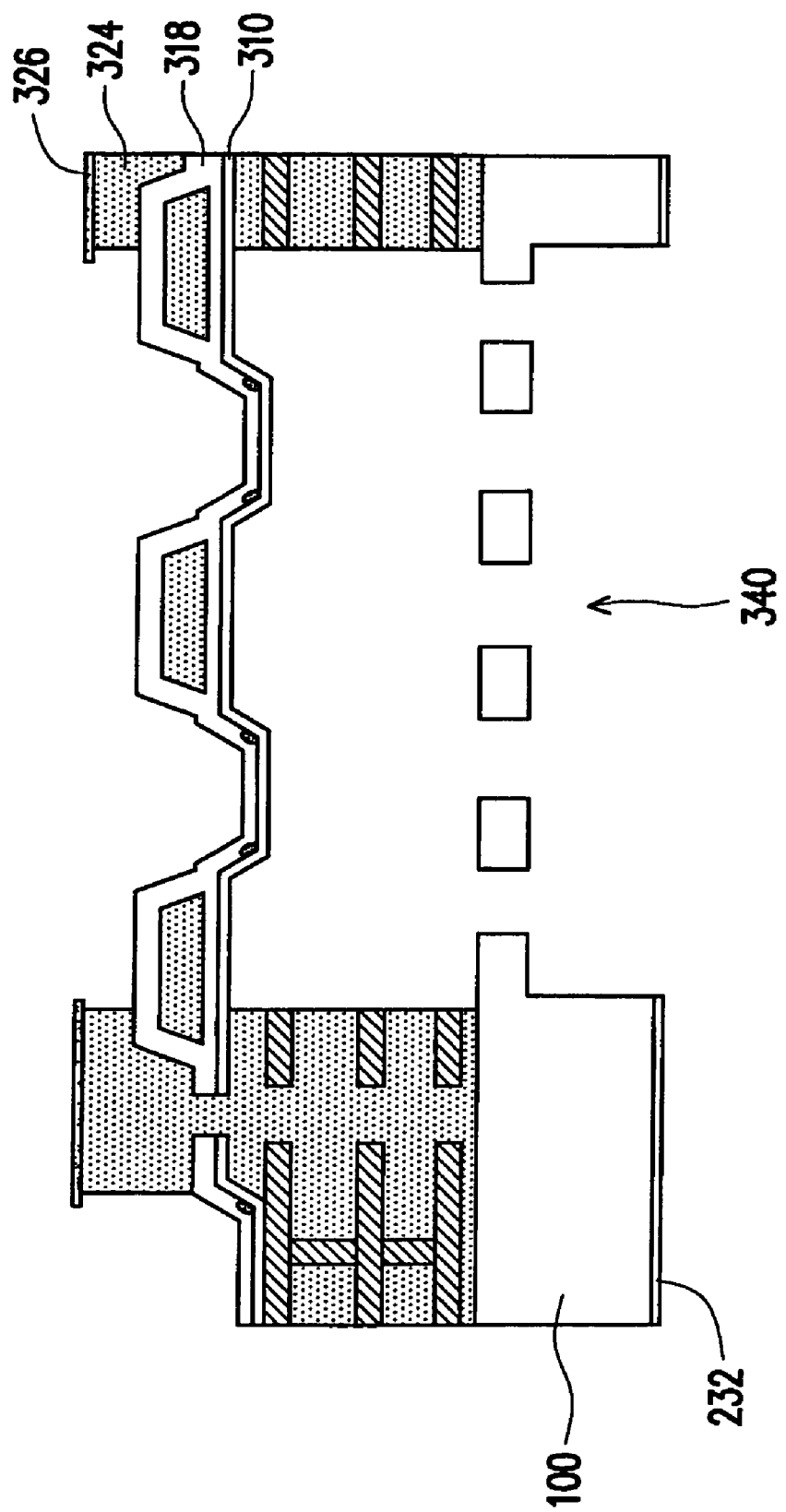

In FIG. 17J, a hard mask layer 332 is formed on the substrate 10 at the backside. A photoresist layer 334 is formed on the hard mask layer 332 with an exposed portion. The hard mask layer 332 is then etched by using the photoresist layer 334 as the etching mask, so as to expose the substrate 100, at which a cavity of the MEMS structure is to be formed later. In FIG. 17K, another photoresist layer 336 is formed. The photoresist layer 336 covers the hard mask layer 332 with a plurality of openings to expose the substrate 100. The photoresist layer 336 also covers a region of the substrate 100 at the periphery of the hard mask layer 332. An anisotropic etching process is performed to etch the substrate 100 by a depth to form an indent region 338. In FIG. 17L, the photoresist pattern 336 is removed, and the hard mask layer 332 is used as the etching mask while another anisotropic etching process is performed to etch the substrate 100 until the structural dielectric layer 300 is exposed to form a cavity 340. In FIG. 17M, an isotropic etching process is performed to etch the dielectric in the structural dielectric layer 300, so ad to expose the conductive layer 318 and 310. Due to the etching stop layer 326, a portion of the dielectric layer 324 remains. As a result, a conductive diaphragm is formed. In thin embodiment, the corrugated structure is based on taper etching. The mechanical strength may be improved. In addition, the conductive corrugated structure may be formed together with the metal in CMOS circuit.

FIGS. 18A-18F are cross-sectional views, schematically illustrating another process for fabrication a MEMS device with corrugated diaphragm, according to a preferred embodiment of the invention. Alternatively, in FIG. 18A, a substrate 400 is provided. A structural dielectric layer 402 is formed over the substrate 400. The structural dielectric layer 402 is similar to the previous descriptions, such as the structural dielectric layer 102 in FIG. 1, and its descriptions are omitted here. Then, a hard mask layer 404 is formed on the substrate 400 on the other side, that is the backside. An etching mask layer 406, such as photoresist layer 406, with a desired pattern is formed on the hard mask layer 404. The materials for the hard mask layer can be, for example, silicon nitride or any proper material for later etching process. The etching mask layer 406 exposes a portion of the hard mask layer 404 at the desired regions.

Figure 18A:
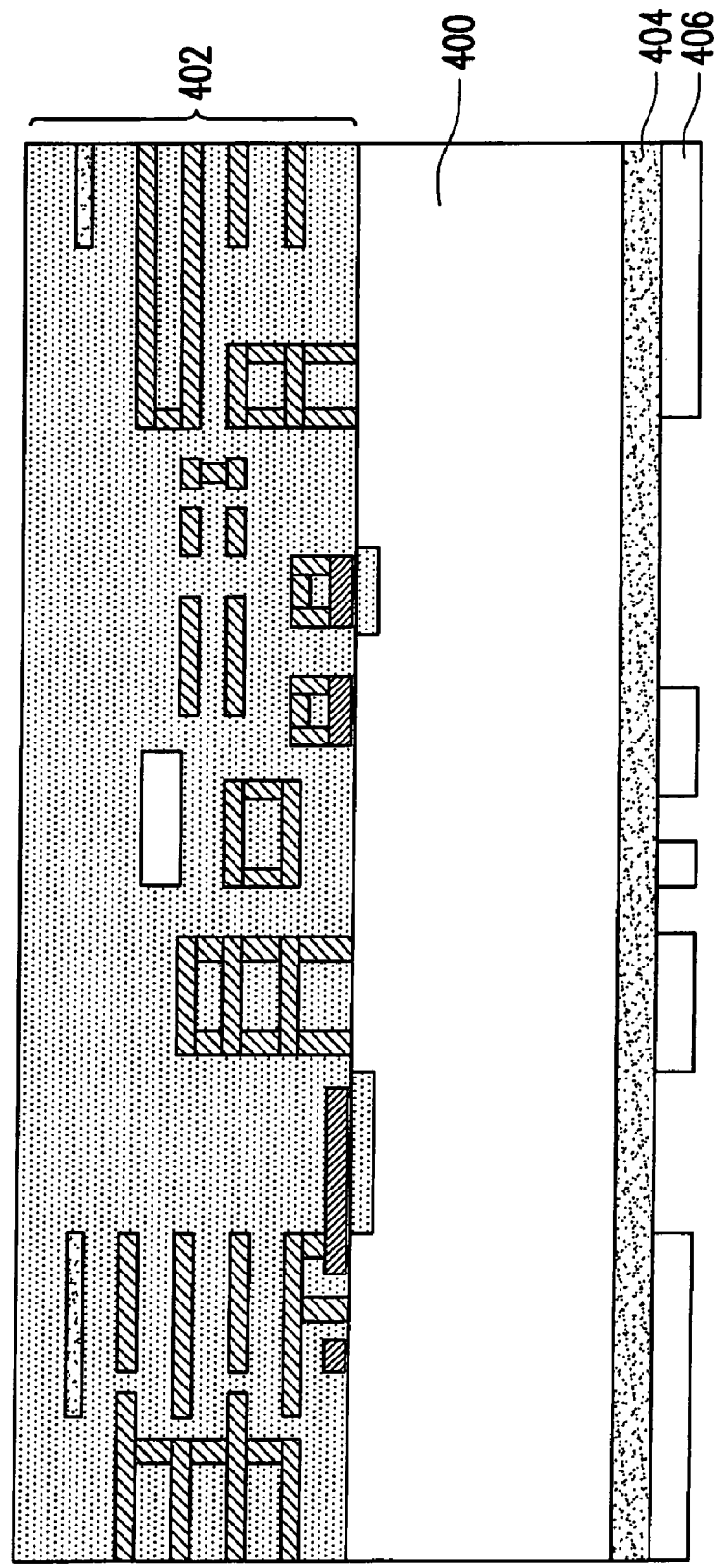
FIGS. 18A-18F are cross-sectional views, schematically illustrating another process for fabrication a MEMS device with corrugated diaphragm, according to a preferred embodiment of the invention.
Figure 18B:
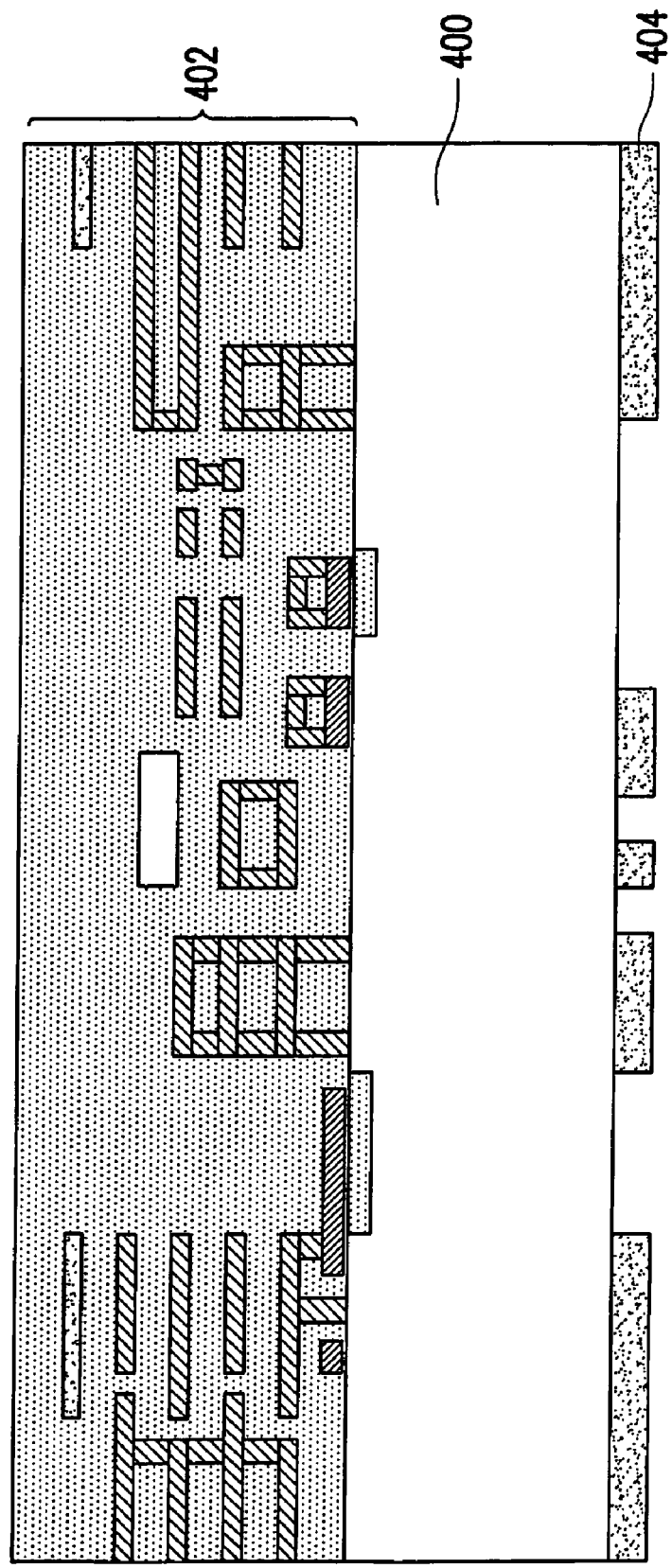
Figure 18C:
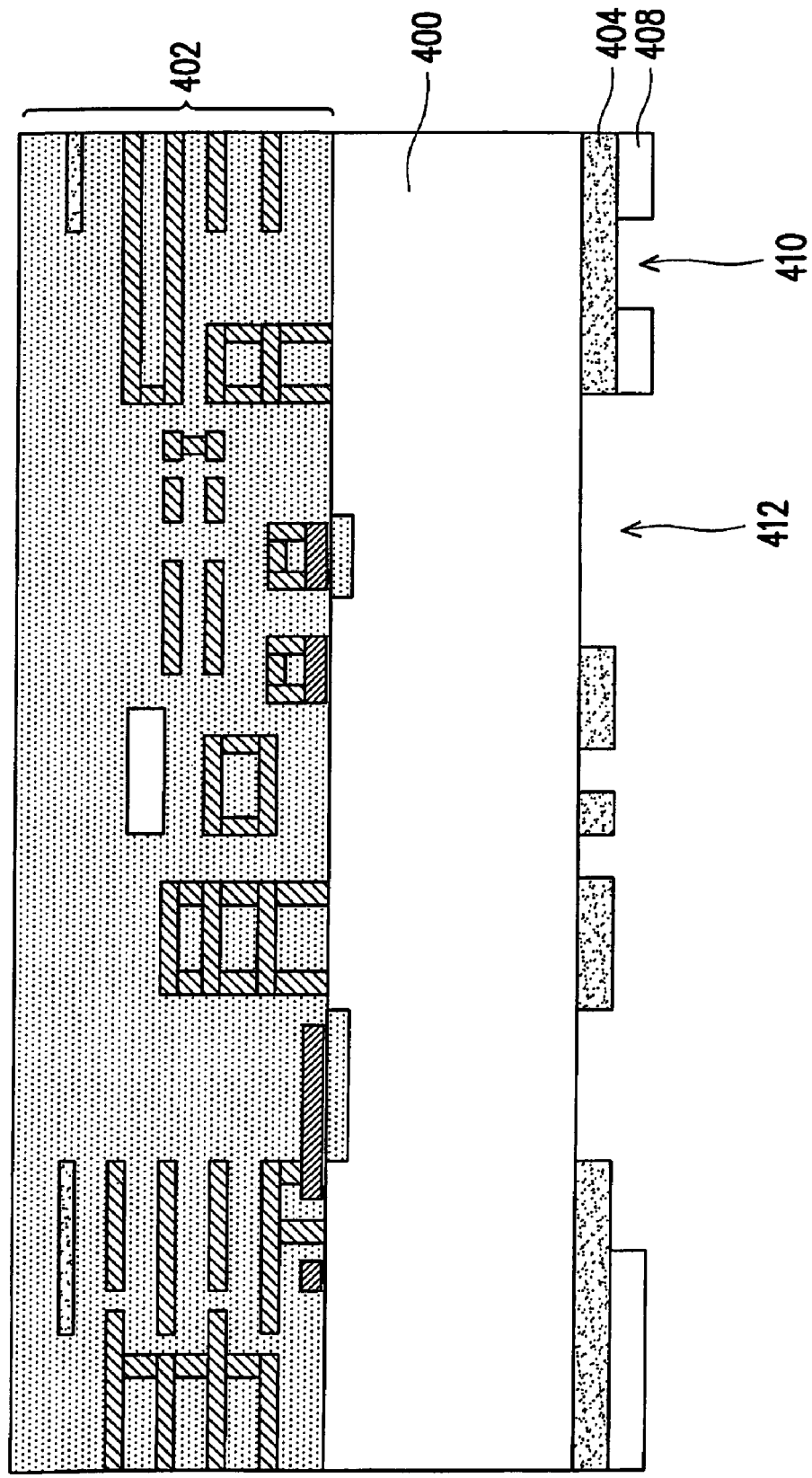

In FIG. 18B, the hard mask layer 404 is then etched to transfer the pattern of the etching mask layer 406 onto the hard mask layer 404. After the etching mask layer 406 is removed, a portion of the substrate is exposed. In FIG. 18C, another etching mask layer 408 is further formed on the hard mask layer 404 to cover a portion, in which an opening portion exposes the hard mask layer 404 at the region 410 and another opening portion exposes the substrate at the region 412.

Figure 18D:
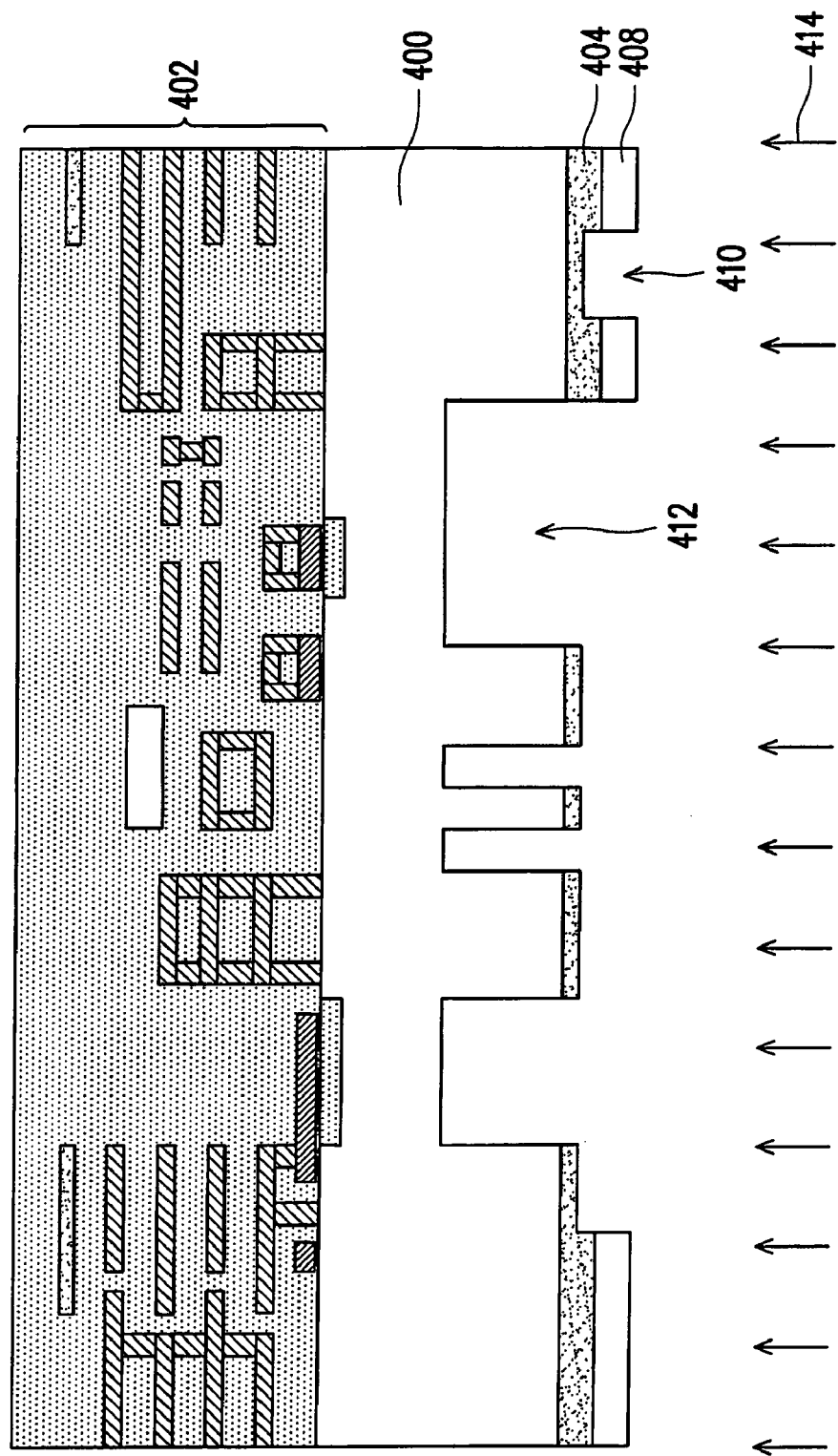
Figure 18E:
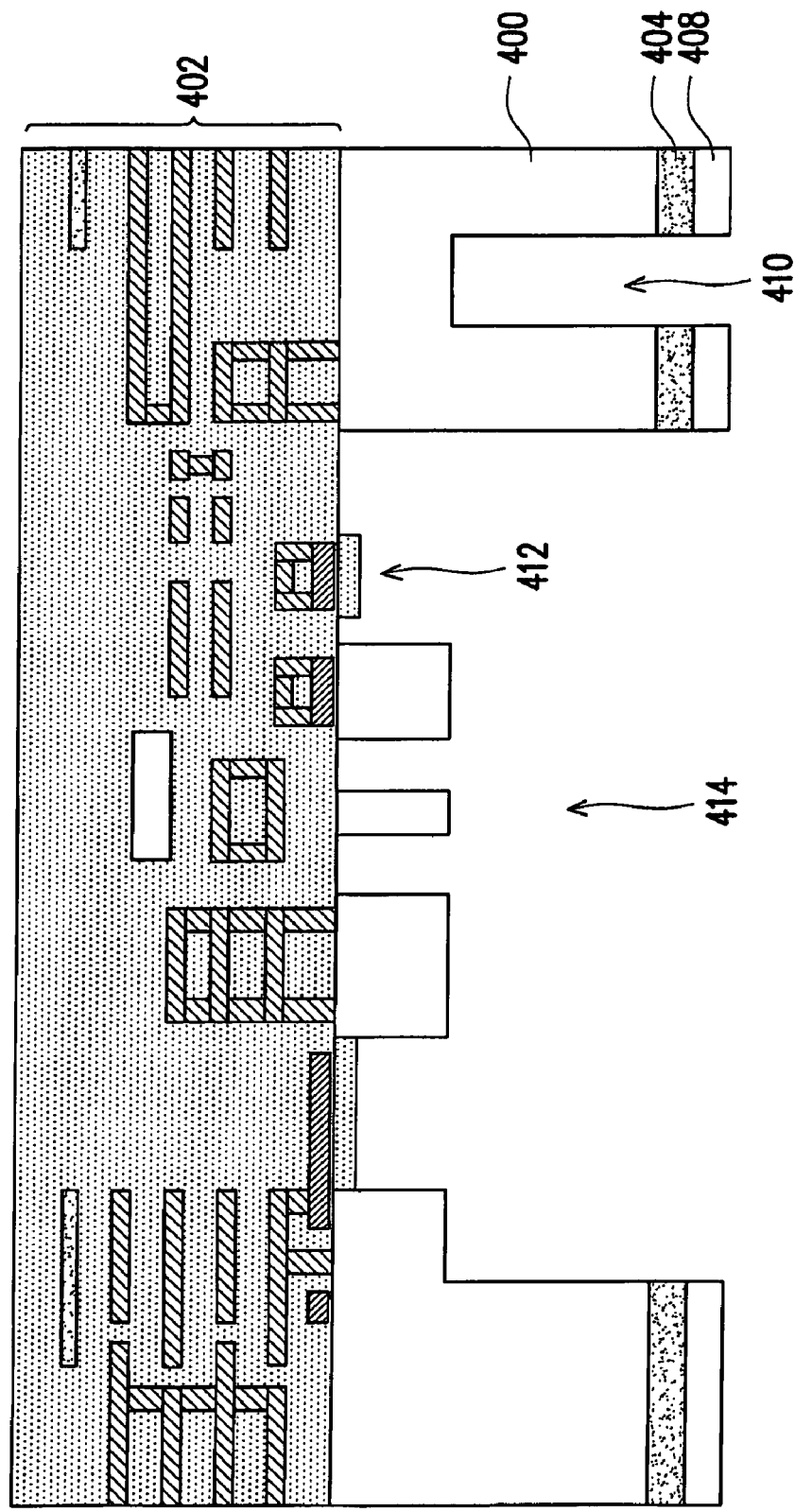

In FIG. 18D, by the etching mask layer 408, an anisotropic etching process 414 is performed to etch back the substrate 400. As a result, the substrate 400 at the region 412 is etched by a depth. Another etching process with different etchant is performed to remove the exposed portion of the hard mask layer 404 not mask by the etching mask layer 408. However in alternative manner, the substrate 400 and the hard mask layer 404 can be simultaneously etched. Due to the effect of the hard mask layer 404, the substrate can be etched with a depth. In FIG. 18E, after the etching process is continuously performed to completely remove the exposed portion of the hard mask layer 404, a newly exposed portion of the substrate 400 is exposed. Then, the etching mask layer 408 is still used as a mask, and the substrate 400 is etched until the structural dielectric layer 402 is exposed.

Figure 18F:
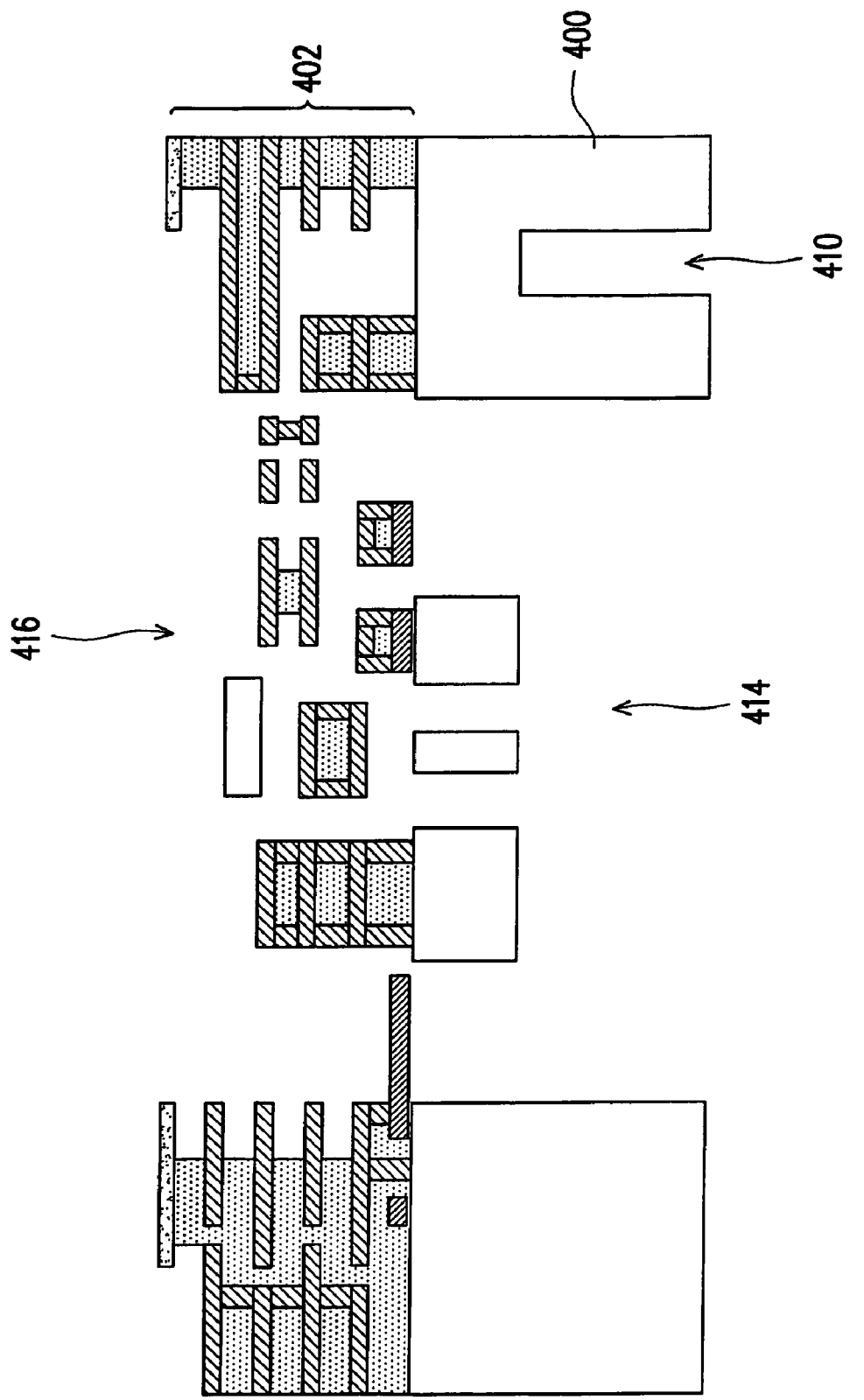

In FIG. 18F, the exposed portion of dielectric in the structural dielectric layer 402 is etched by, for example, an isotropic etching process from on side or both sides. As a result, the cavity 414 in the substrate 400 is formed while the remaining portion of the structural dielectric layer 402 with the integrated portion of the remaining substrate 400 becomes the diaphragm 416. Here in the example of FIG. 18F, since the two protruding portions of the substrate 400 has the same height level. The vibrating action of the diaphragm may be affected when the diaphragm is bent downward. However, it can also be further solved by following process and structure with more height levels.

Figure 19A:
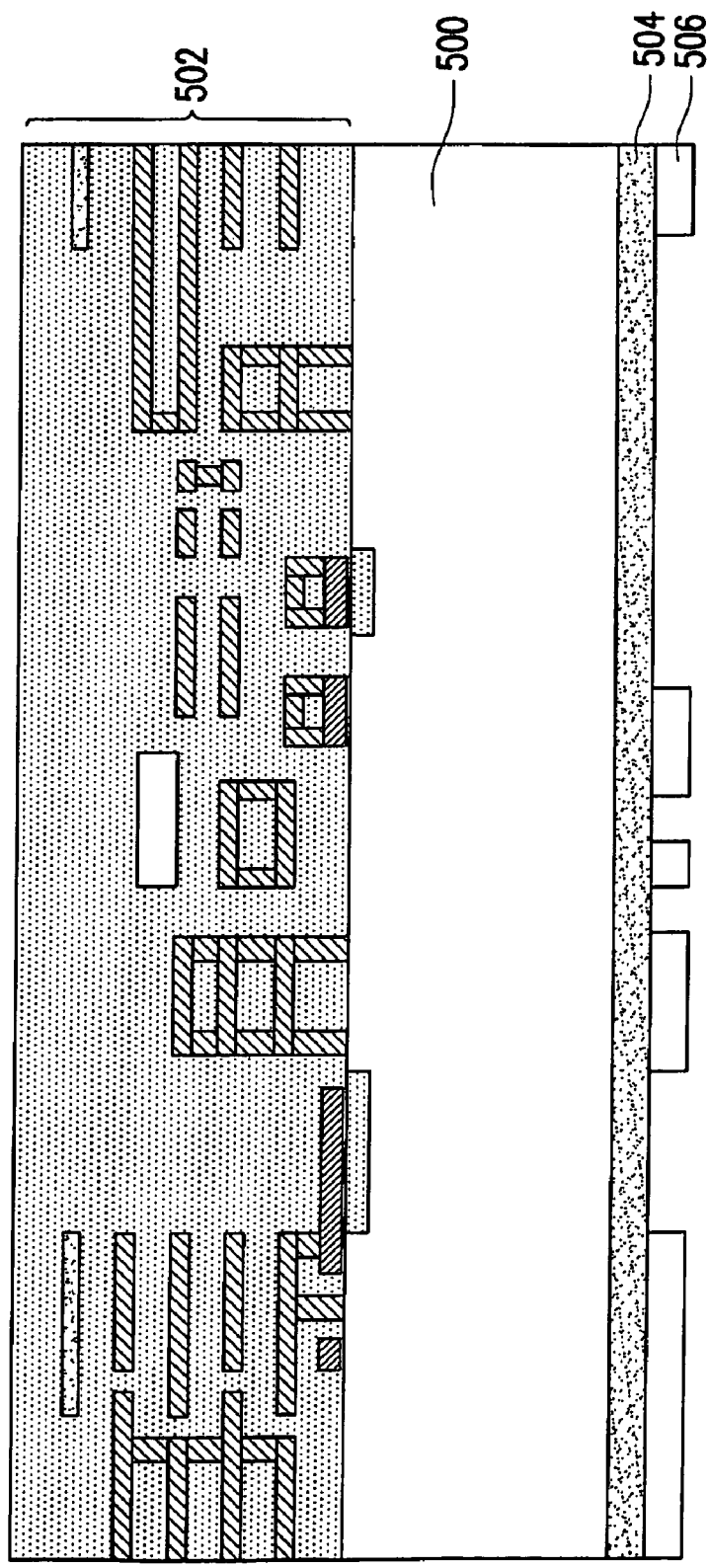
FIGS. 19A-19G are cross-sectional views, schematically illustrating another process for fabrication a MEMS device with corrugated diaphragm, according to a preferred embodiment of the invention.
Figure 19B:
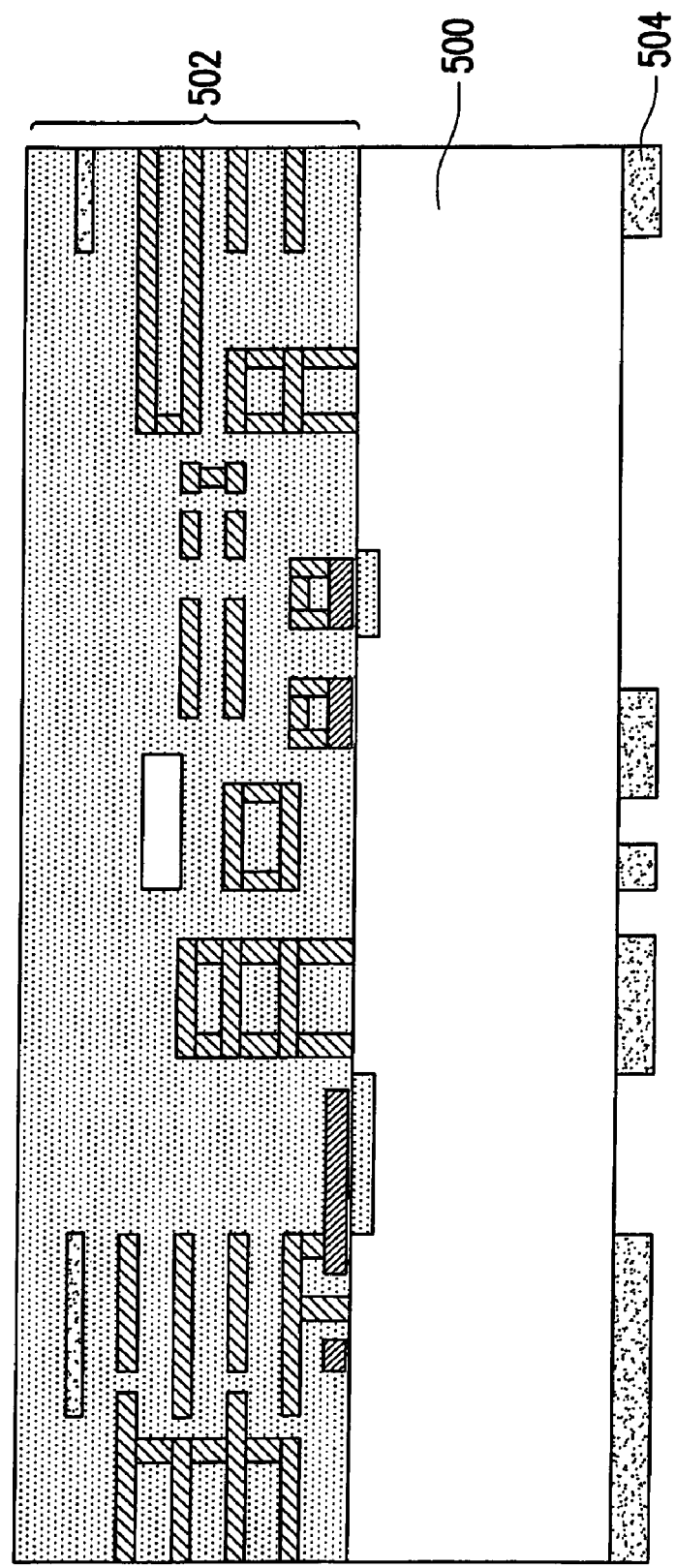

FIGS. 19A-19G are cross-sectional views, schematically illustrating another process for fabrication a MEMS device with corrugated diaphragm, according to a preferred embodiment of the invention. In FIG. 19A, like FIG. 18A, a substrate 500 is provided. A structural dielectric layer 502 is formed over the substrate 500. The structural dielectric layer 502 is similar to the previous descriptions, such as the structural dielectric layer 102 in FIG. 1, and its descriptions are omitted here. Then, a hard mask layer 504 is formed on the substrate 500 on the other side, that is the backside. An etching mask layer 506, such as photoresist layer 506, with a desired pattern is formed on the hard mask layer 504. Here, in order to have more height level for the substrate 500, in comparing with FIG. 18A, the width of the photoresist layer 506 for the edge region is narrower, which region is to remain the largest thickness as to be seen. In FIG. 19B, the hard mask layer 504 is etched to have the pattern to expose the substrate 500.

Figure 19C:
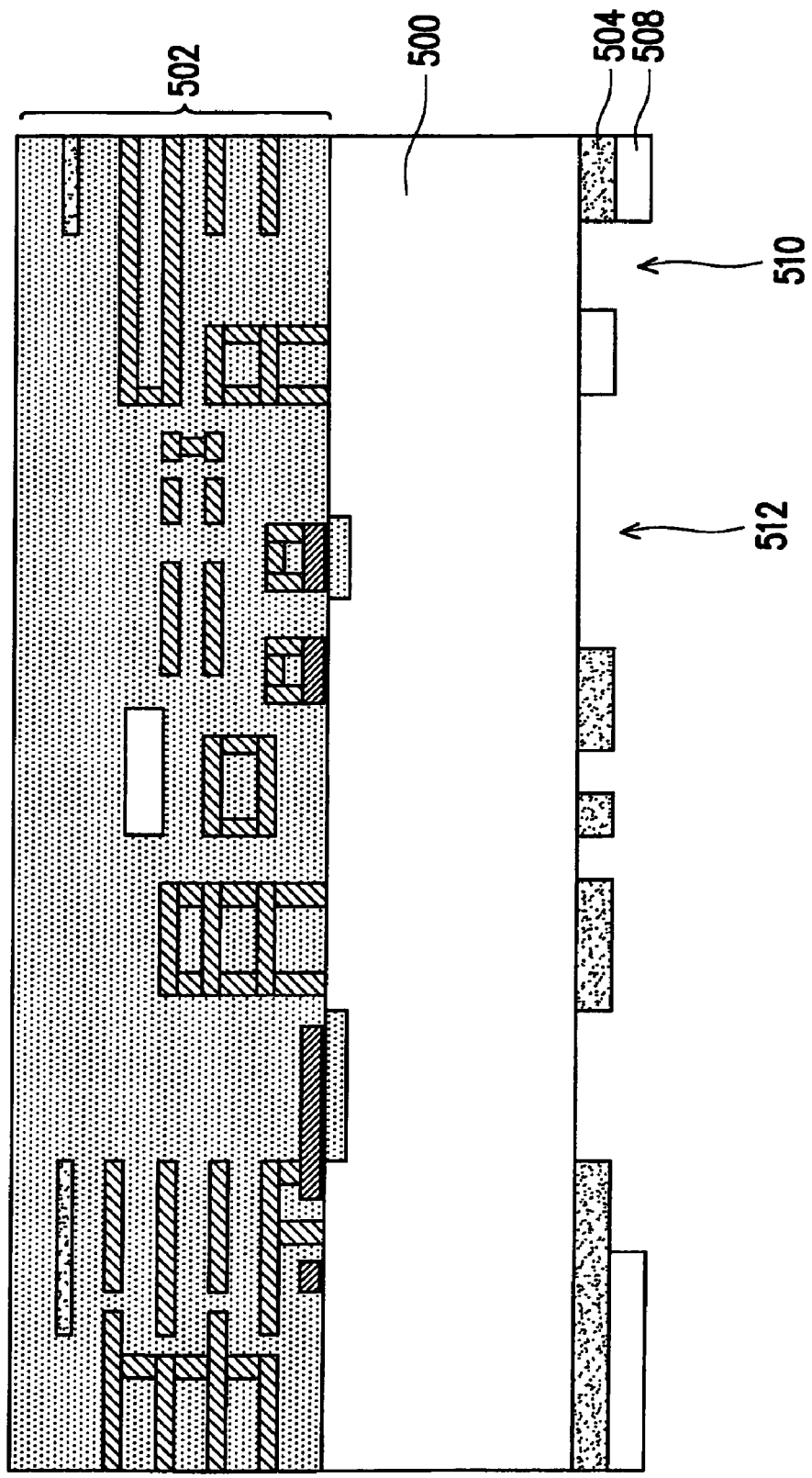
Figure 19D:
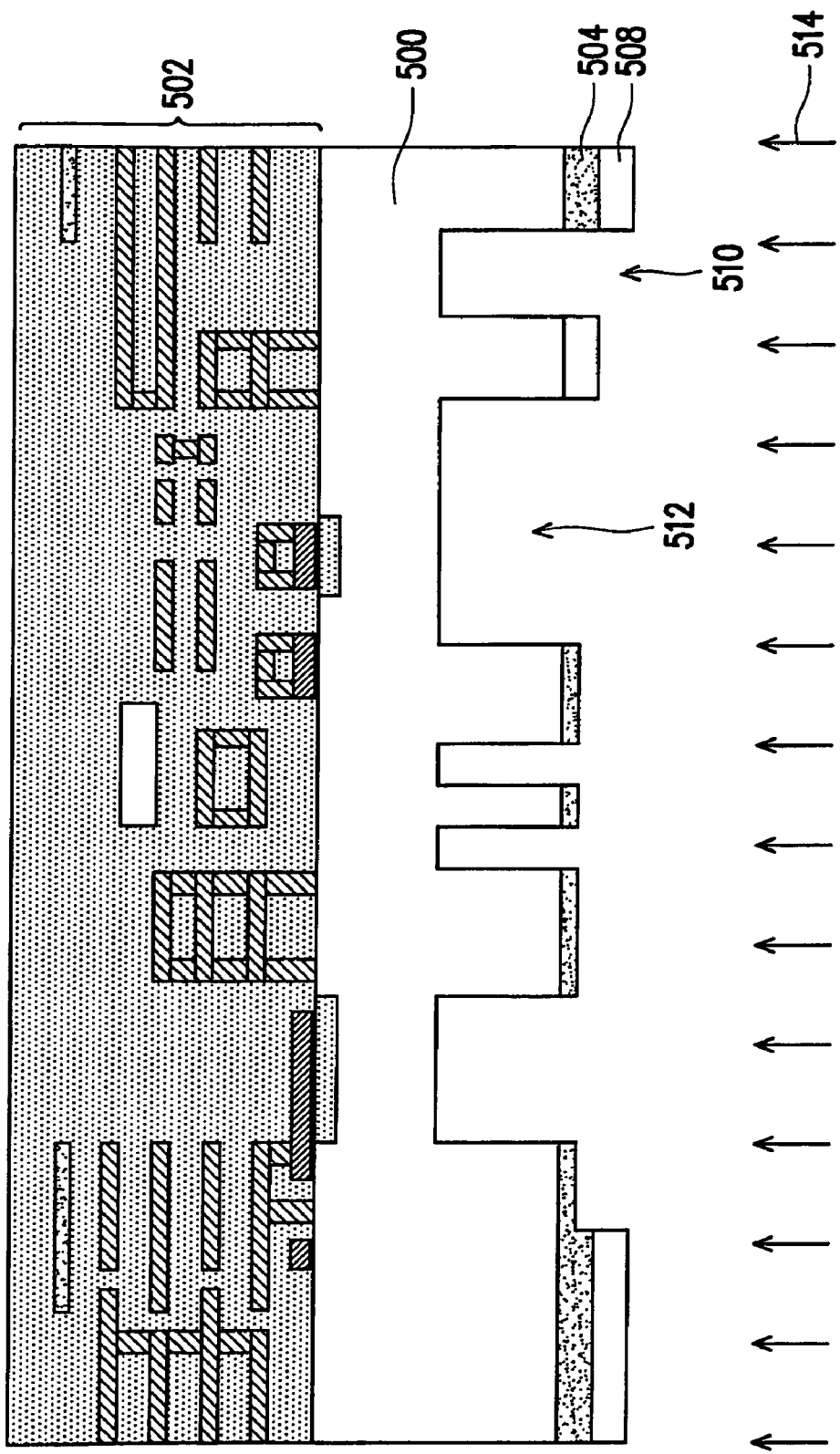

In FIG. 19C, another etching mask layer 508 is formed on the had mask layer 504 to cover a portion of the had mask layer 504. In FIG. 19D, an anisotropic etching process 514 is performed from the backside of the substrate 500. Due to the hard mask layer 504, the exposed portion of the substrate 500 at the region 512 and region 510 is etched by a depth while the hard mask layer 504 still masks the substrate 500. Then, another etching process with the etchant is performed to etching the exposed portion of the hard mask layer 504 while the etching mask layer 508 is used a mask. The etching process is continuously performed to remove the exposed portion of the hard mask layer 504 so as to further expose another portion of the substrate 500. However in alternative manner, the substrate 500 and the hard mask layer 504 can be simultaneously etched. Due to the effect of the hard mask layer 504, the substrate can be etched with a depth.

Figure 19E:
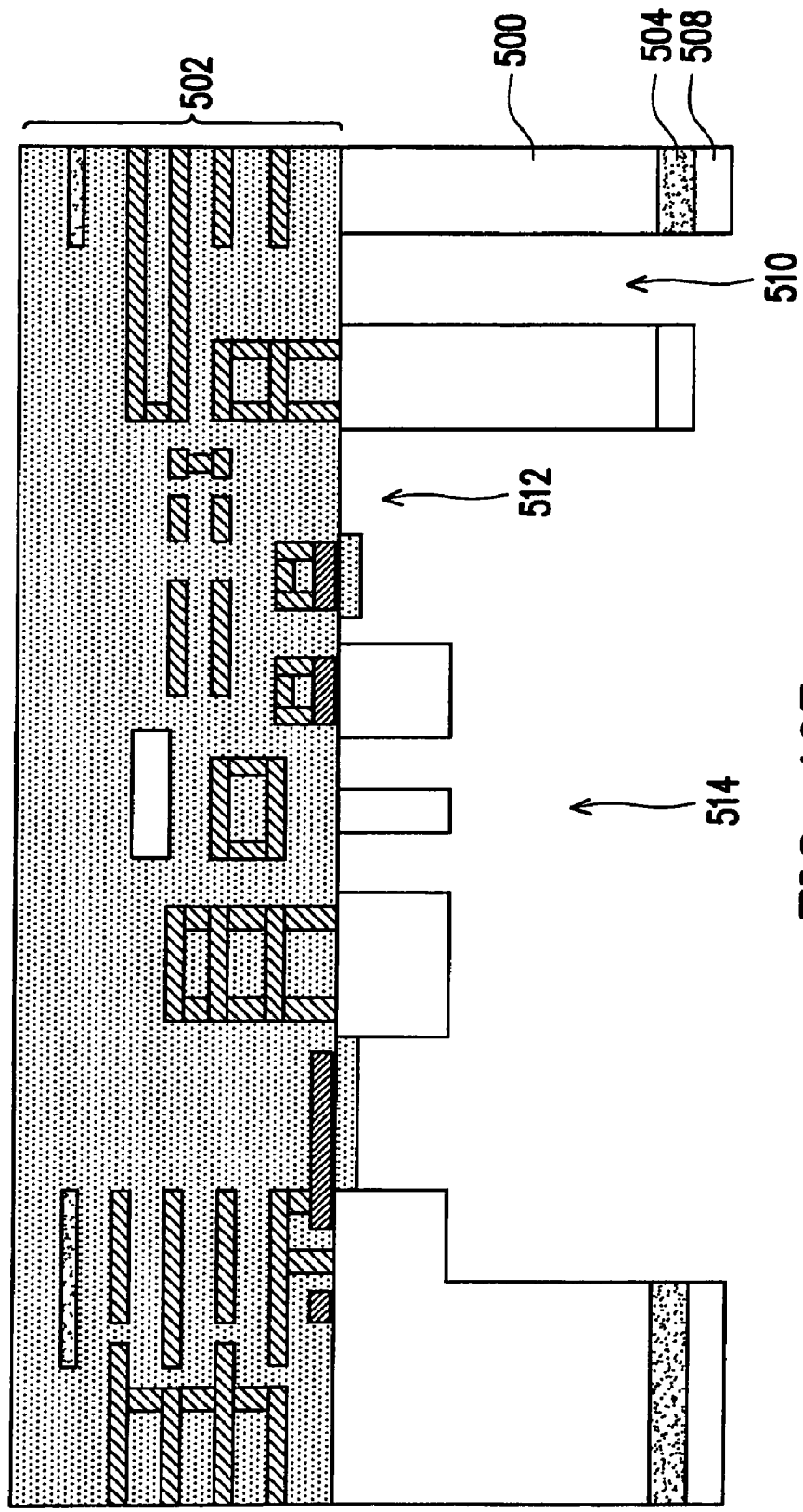
Figure 19F:
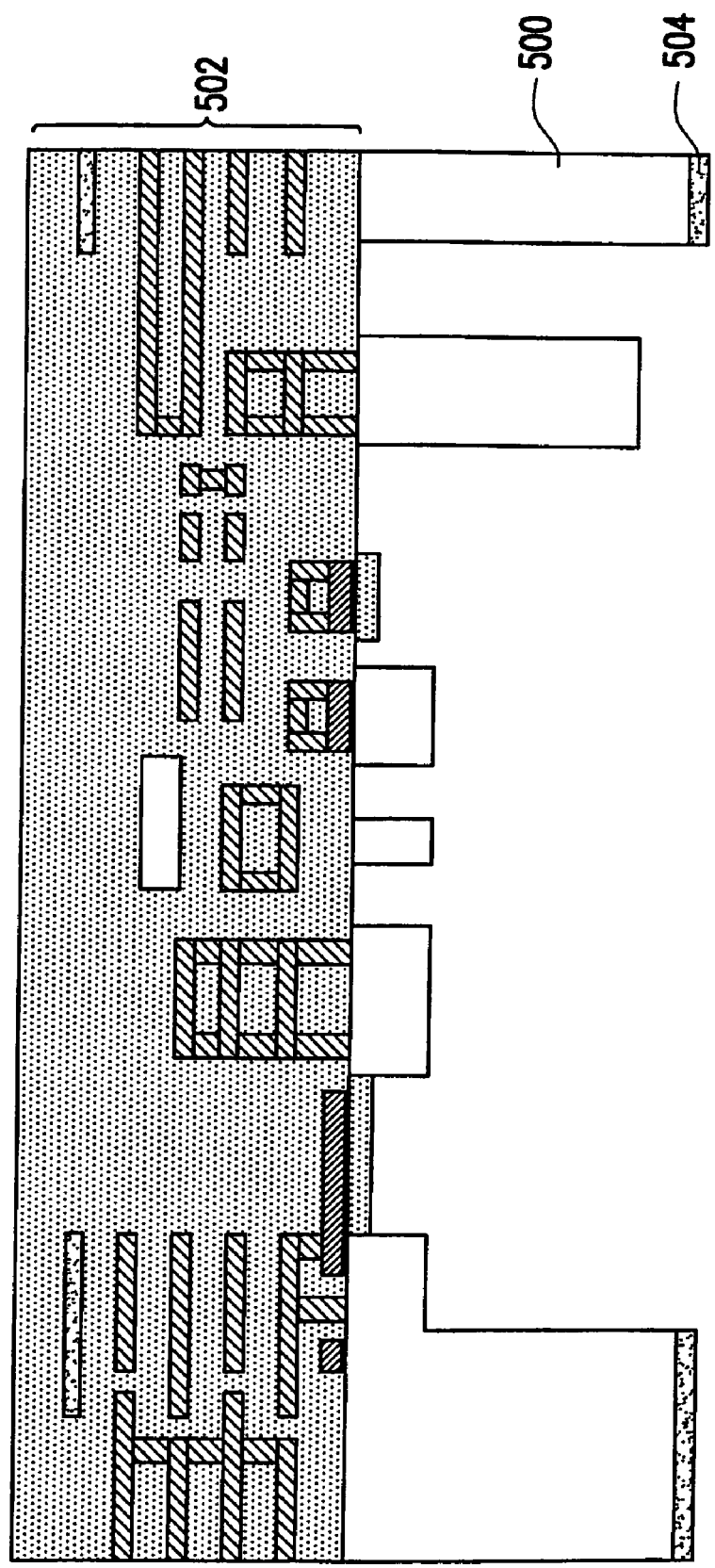
Figure 19G:
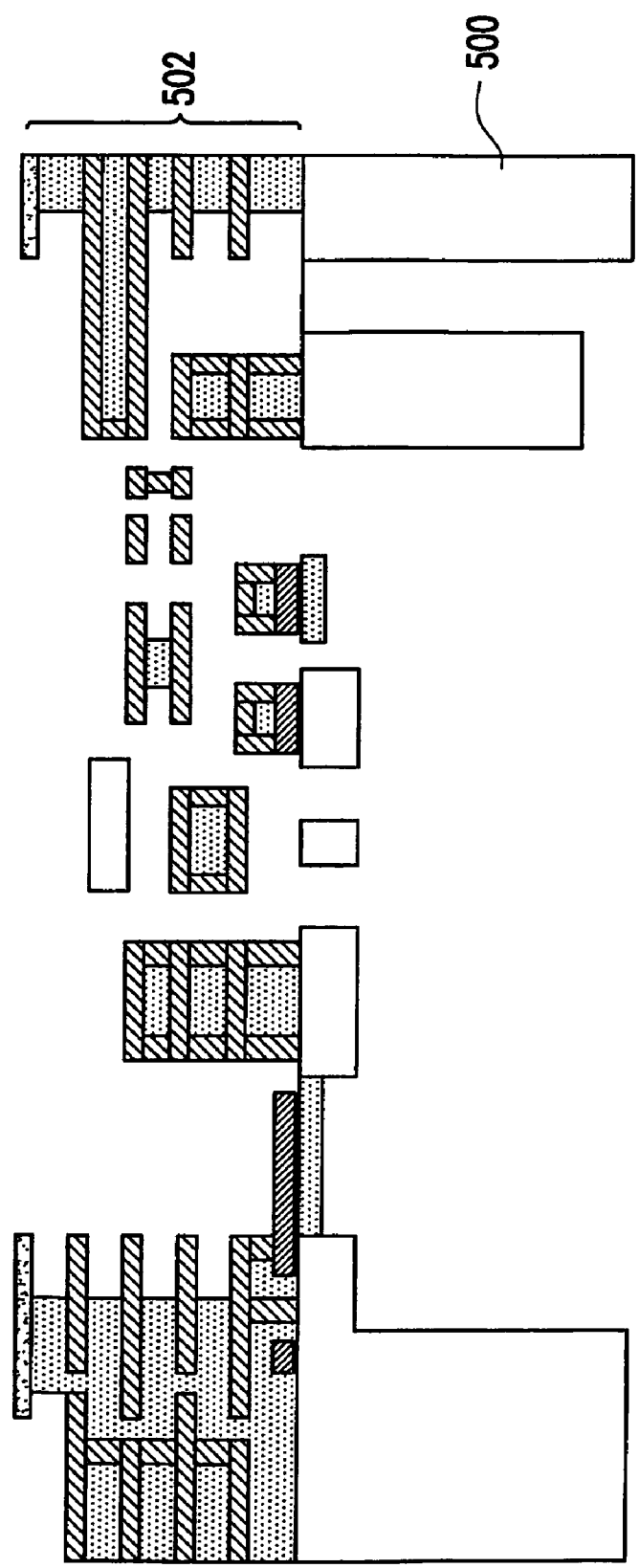

In FIG. 19E, after the hard mask layer 504 is patterned to further expose the substrate, another anisotropic etching process is performed to etch the substrate until the structural dielectric layer 502 is exposed at the region 510 and 512. In FIG. 19F, the photoresist layer 508 is removed to further expose the hard mask layer 504. Then, another anisotropic etching process is performed. Again, due to the masking effect of the hard mask layer 504, the exposed portion of the substrate 500 is etched by a further depth. In this embodiment, it can be seen that the portion of the substrate 500 still covered by the hard mask layer 504 remains at the original height. In FIG. 19G the hard mask layer 504 is removed. As a result, the substrate has more levels of height. The second highest protruding portion allows the vibration of diaphragm to be more efficiency, for example. However, the process allows to any intension when multiple height levels are needed. Then, the exposes dielectric of the structural dielectric layer 502 is removed by isotropic etching process.

It should be noted that all provided embodiments can also be combined to each other. Further, the present invention is not just limited to the embodiments.

The present invention provides the method to form the MEMS device by the processes compatible with the semiconductor fabrication process. The devise size can at least be effectively reduced. In addition, since the fabrication process is based on semiconductor fabrication process, the device can be relatively easily formed.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:
1. A method for fabricating micro-electro-mechanical system (MEMS) device, comprising:

providing a substrate as a single crystal substrate, having a first side and a second side, and having a MEMS region and an integrated-circuit (IC) region;

forming a structural dielectric layer over the first side of the substrate, wherein the IC region has a circuit structure with an interconnection structure formed in the structural dielectric layer;

performing a multi-stage patterning process on the substrate at the MEMS region from the second side to form a plurality of mass blocks of single crystal with different levels, wherein a portion of the structural dielectric layer is exposed; and performing an isotropic etching process at the MEMS region to etch the structural dielectric layer over the single crystal mass blocks, wherein the mass blocks are released to form a MEMS structure.

2. The method of claim 1, wherein the step of performing a multi-stage patterning process on the substrate comprises:

forming a mask layer on the substrate at the second side;

patterning the mask layer to expose the substrate at a first region and a second region; and patterning the substrate to expose the portion of the structural dielectric layer, wherein the substrate at the second side has multiple regions with different levels of height.

3. The method of claim 2, wherein the step of patterning the substrate comprises:

forming an etching mask pattern on the mask layer and on the substrate at the second region and a portion of the first region, wherein a portion of the substrate at the first region is exposed;

etching the exposed portion of the substrate with a depth;

removing the etching mask pattern wherein the etching mask pattern remains; and performing an anisotropic etching process with the etching mask pattern as a mask to expose the structural dielectric layer.

4. The method of claim 3, wherein the mask layer is a dielectric layer or a metal mask layer.

5. The method of claim 1, wherein the step of performing the multi-stage patterning process on the substrate comprises:

patterning the substrate at the second side to have a plurality indent regions with a depth;

forming an etching mask layer on the substrate other than the indent regions; and performing an anisotropic etching process with the etching mask layer to expose the portion of the structural dielectric layer.

6. The method of claim 1, wherein the step of performing the multi-stage patterning process on the substrate comprises:

forming a hard mask layer on the substrate at the second side with multiple levels of height;

patterning the hard mask layer to expose a portion of the substrate, wherein a remaining portion of the hard mask layer has multiple regions with different levels of height;

forming an etching mask pattern on the substrate;

etching the substrate at the second side to form a plurality of indent regions with a depth;

removing the etching mask pattern;

performing an anisotropic etching process on the substrate to expose the structural dielectric layer;

removing a portion of the hard mask layer in thickness for exposing the substrate underneath; and etching the substrate to produce additional level of height.

7. The method of claim 6, further removing a remaining portion of the hard mask layer.

8. The method of claim 6, wherein the step of forming the hard mask layer comprises:

forming a first hard mask layer on the substrate;

patterning the first hard mask layer to expose the substrate at an intended region;

forming a second hard mask layer over the substrate;

patterning the second hard mask layer, wherein the first hard mask layer remains under the second hard mask layer;

forming a photoresist pattern on the substrate and the second hard mask layer with an exposed portion of the substrate within the intended region of the substrate;

performing a first etching process on the exposed portion of the substrate with a depth;

removing the photoresist pattern;

performing a second etching process on the substrate with the first hard mask layer and the second hard mask layer as an etching mask, to expose the structural dielectric layer;

removing the second hard mask layer; and performing a third etching process on the substrate with the first mask layer as an etching mask.

9. The method of claim 1, wherein the step of performing the multi-stage patterning process on the substrate comprises:

forming a dielectric mask layer on the substrate at the second side;

patterning the dielectric mask layer to expose the substrate; and patterning the substrate to expose the portion of the structural dielectric layer, wherein the substrate at the second side has multiple regions with different levels of height.

10. The method of claim 9, wherein the step of patterning the substrate comprises:

forming an etching mask pattern on the dielectric mask layer, wherein a portion of the substrate and a portion of the dielectric mask pattern are exposed;

anisotropically etching the exposed portion of the substrate with a depth, not masked by the dielectric mask layer and the etching mask pattern;

etching the exposed dielectric mask layer with an etching mask pattern as a mask; and performing an anisotropic etching process with the etching mask pattern as a mask to expose the structural dielectric layer.

11. The method of claim 9, wherein the step of patterning the substrate comprises:

forming an etching mask pattern on the dielectric mask layer, wherein a portion of the substrate and a portion of the dielectric mask pattern are exposed;

anisotropically etching the exposed portion of the substrate with a depth, not masked by the dielectric mask layer and etching mask pattern, wherein the exposed portion of the dielectric mask layer is also etched completely; and performing an anisotropic etching process with the etching mask pattern as a mask to expose the structural dielectric layer.

12. The method of claim 9, wherein the step of patterning the substrate comprises:

forming an etching mask pattern on the dielectric mask layer and the substrate, wherein a portion of the substrate and a portion of the dielectric mask pattern are exposed;

etching the exposed portion of the substrate with a depth, not masked by the dielectric mask layer and the etching mask pattern;

etching the dielectric mask layer with the etching mask pattern as a mask to further expose a portion of the substrate;

performing an anisotropic etching process with the etching mask pattern as a mask to expose the structural dielectric layer;

removing the etching mask pattern; and performing another etching process on the substrate with the dielectric mask layer as an etching mask.

13. The method of claim 9, wherein the step of patterning the substrate comprises:

forming an etching mask pattern on the dielectric mask layer and the substrate, wherein a portion of the substrate and a portion of the dielectric mask pattern are exposed;

anisotropically etching the exposed portion of the substrate with a depth, not masked by the dielectric mask layer and the etching mask pattern, wherein the exposed portion of the dielectric mask layer is also etched completely;

performing an anisotropic etching process with the etching mask pattern as a mask to expose the structural dielectric layer;

removing the etching mask pattern; and performing another etching process on the substrate with the dielectric mask layer as an etching mask.

14. The method of claim 1, wherein the step of forming the structural dielectric layer over the substrate at the first side comprises:

forming a plurality of horizontal metal layers and a plurality vertical metal layers contacting on the mass blocks of single crystal at the MEMS region to serve as at least a part of the MEMS structure.

15. The method of claim 1, wherein the step of forming the structural dielectric layer over the substrate at the first side comprises:

forming a plurality of horizontal metal layers and a plurality vertical metal layers in a plurality of dielectric layers to serve as at least a part of CMOS circuitry.

16. The method of claim 1, wherein the step of forming the structural dielectric layer over the substrate at the first side comprises:

forming an etching stop layer with a pattern on the structural dielectric layer, covering the IC region;

forming a dielectric layer over the structural dielectric layer; and performing a planarization process on the dielectric layer; wherein the dielectric layer at top with the structural dielectric layer encloses the etching stop layer.

17. The method of claim 16, wherein the step of planarization process includes Chemical Mechanical Polishing (CMP).

18. The method of claim 16 wherein the etching stop layer is conductive layer, like AL, TiN, or polysilicon.

19. The method of claim 18; wherein the conductive etching stop layer is electrically connected to substrate.

20. The method of claim 16; wherein the etching stop layer is dielectric layer layer include SIN, or amorphous Si.

21. The method of claim 1, wherein the step of performing the isotropic etching includes using etchant of Vaper HF.

22. The method of claim 1, in the step of performing the multi-stage patterning process on the substrate, a portion of the mass blocks being isolated from the substrate.

23. The method of claim 1, in the step of performing the multi-stage patterning process on the substrate, a portion of the mass blocks being suspended with respect to the substrate to form a suspension beam structure in the mass blocks, wherein a portion of the mass blocks remains on the substrate.

* * * * *